United States Patent
Namiki et al.

(10) Patent No.: US 10,732,323 B2
(45) Date of Patent: *Aug. 4, 2020

(54) RETARDATION FILM, CIRCULARLY-POLARIZING PLATE, AND IMAGE-DISPLAYING DEVICE

(71) Applicants: NITTO DENKO CORPORATION, Ibaraki-shi (JP); Mitsubishi Chemical Corporation, Chiyoda-ku (JP)

(72) Inventors: Shingo Namiki, Fukuoka (JP); Yuuichi Hirami, Fukuoka (JP); Hisatoshi Uehara, Kanagawa (JP); Hiroyuki Hayashi, Kanagawa (JP); Takashi Shimizu, Osaka (JP); Hiroshi Sumimura, Osaka (JP); Nao Murakami, Osaka (JP)

(73) Assignees: NITTO DENKO CORPORATION, Ibaraki-shi (JP); Mitsubishi Chemical Corporation, Chiyoda-ku (JP)

( * ) Notice: Subject to any disclaimer, the term of this patent is extended or adjusted under 35 U.S.C. 154(b) by 133 days.

This patent is subject to a terminal disclaimer.

(21) Appl. No.: 15/294,040

(22) Filed: Oct. 14, 2016

(65) Prior Publication Data

US 2017/0031060 A1    Feb. 2, 2017

Related U.S. Application Data

(63) Continuation of application No. PCT/JP2015/061642, filed on Apr. 15, 2015.

(30) Foreign Application Priority Data

Apr. 16, 2014    (JP) .................................. 2014-084695

(51) Int. Cl.
*G02B 1/08*    (2006.01)
*G02B 5/30*    (2006.01)
(Continued)

(52) U.S. Cl.
CPC ............... *G02B 1/08* (2013.01); *C08G 63/64* (2013.01); *C08J 5/18* (2013.01); *G02B 5/3033* (2013.01);
(Continued)

(58) Field of Classification Search
CPC ...... G02B 1/08; G02B 5/3033; G02B 5/3083; G02B 5/305; C08G 63/64; H01L 51/5181;
(Continued)

(56) References Cited

U.S. PATENT DOCUMENTS 3,280,169 A    10/1966    Horn et al.
3,324,084 A    6/1967    Horn et al.
(Continued)

FOREIGN PATENT DOCUMENTS

CN    1818723 A    8/2006
CN    101322055 A    12/2008
(Continued)

OTHER PUBLICATIONS

International Search Report dated Jun. 30, 2015 in PCT/JP2015/061642, filed on Apr. 15, 2015 ( with English Translation).
(Continued)

*Primary Examiner* — Ruiyun Zhang
(74) *Attorney, Agent, or Firm* — Oblon, McClelland, Maier & Neustadt, L.L.P.

(57) ABSTRACT

The retardation film of the present invention contains a resin having positive refractive index anisotropy and containing at least one bonding group of a carbonate bond and an ester bond and one or more structural units selected from the group consisting of a structural unit represented by the general formula (1) and a structural unit represented by the general formula (2), in which the value of wavelength
(Continued)

dispersion (R450/R550) as a ratio of retardation R450 at a wavelength of 450 nm to retardation R550 at a wavelength of 550 nm is more than 0.5 and less than 1.0:

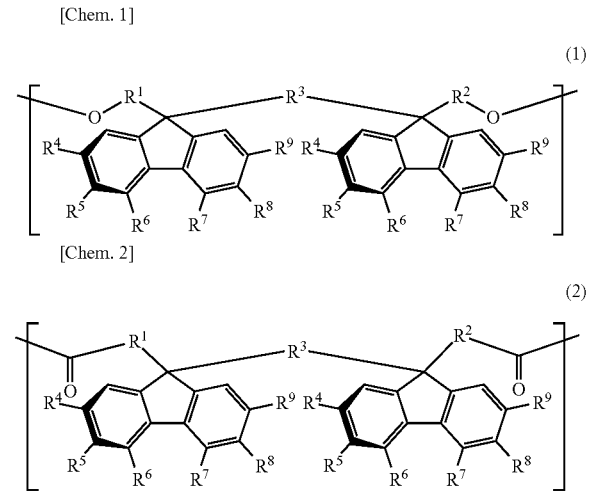

[Chem. 1] (1)

[Chem. 2] (2)

(in formula (1) and formula (2), definitions of $R^1$ to $R^9$ are the same as in the description).

13 Claims, 1 Drawing Sheet

(51) Int. Cl.
  *C08G 63/64* (2006.01)
  *C08J 5/18* (2006.01)
  *H01L 51/52* (2006.01)
(52) U.S. Cl.
  CPC ........ G02B 5/3083 (2013.01); H01L 51/5281 (2013.01); *C08J 2369/00* (2013.01); *Y10T 428/10* (2015.01); *Y10T 428/1036* (2015.01); *Y10T 428/1041* (2015.01)
(58) Field of Classification Search
  CPC ..... G02F 1/13363; G02F 2011/133637; G02F 2011/133638; Y10T 428/10; Y10T 428/1036; Y10T 428/105
  USPC ........ 428/1.1, 1.3, 1.33; 359/489.02, 489.01, 359/489.07; 349/117; 528/298; 562/466, 488; 568/808
  See application file for complete search history.

(56) References Cited

U.S. PATENT DOCUMENTS

| | | |
|---|---|---|
| 6,565,974 B1 | 5/2003 | Uchiyama et al. |
| RE39,753 E | 7/2007 | Uchiyama et al. |
| 7,781,540 B2 | 8/2010 | Yanagida et al. |
| 8,218,937 B2 | 7/2012 | Iida et al. |
| 8,323,527 B2 | 12/2012 | Adlem et al. |
| 8,778,486 B2 | 7/2014 | Tanaka et al. |
| 8,877,304 B2 | 11/2014 | Motoyoshi et al. |
| 2006/0177607 A1 | 8/2006 | Ohmori et al. |
| 2007/0134446 A1 | 6/2007 | Inagaki et al. |
| 2008/0085955 A1 | 4/2008 | Yanagida et al. |
| 2010/0003490 A1 | 1/2010 | Iida et al. |
| 2010/0104777 A1 | 4/2010 | Motoyoshi et al. |
| 2010/0301271 A1 | 12/2010 | Adlem et al. |
| 2012/0170118 A1 | 7/2012 | Wang et al. |
| 2012/0308796 A1 | 12/2012 | Tanaka et al. |
| 2014/0268334 A1 | 9/2014 | Tanaka et al. |
| 2015/0247002 A1 | 9/2015 | Uehara et al. |

FOREIGN PATENT DOCUMENTS

| | | |
|---|---|---|
| CN | 104718237 A | 6/2015 |
| EP | 1 808 461 A1 | 7/2007 |
| JP | 5-27118 | 2/1993 |
| JP | 10-68816 | 3/1998 |
| JP | 2000-137116 | 5/2000 |
| JP | 3325560 | 9/2002 |
| JP | 2003-279730 | 10/2003 |
| JP | 2008-112124 | 5/2008 |
| JP | 2008-222965 | 9/2008 |
| JP | 2010-537955 A | 12/2010 |
| JP | 5119250 | 1/2013 |
| JP | 5204200 | 6/2013 |
| TW | 200922921 A | 6/2009 |
| WO | WO 2010/061896 A1 | 6/2010 |
| WO | WO 2014/061677 A1 | 4/2014 |

OTHER PUBLICATIONS

Written Opinion dated Jun. 30, 2015 in PCT/JP2015/061642, filed on Apr. 15, 2015.
Notifications of Reasons for Refusal dated May 16, 2017 in Japanese Patent Application No. 2015-083625 (with English translation).
Combined Chinese Office Action and Search Report dated Jul. 23, 2018 in Patent Application No. 201580019892.2 (with English language translation).
Extended European Search Report dated Oct. 16, 2017 in Patent Application No. 15779658.2.
Office Action dated Apr. 18, 2019 in Chinese Patent Application No. 201580019892.2, citing Reference AO (w/ English translation).

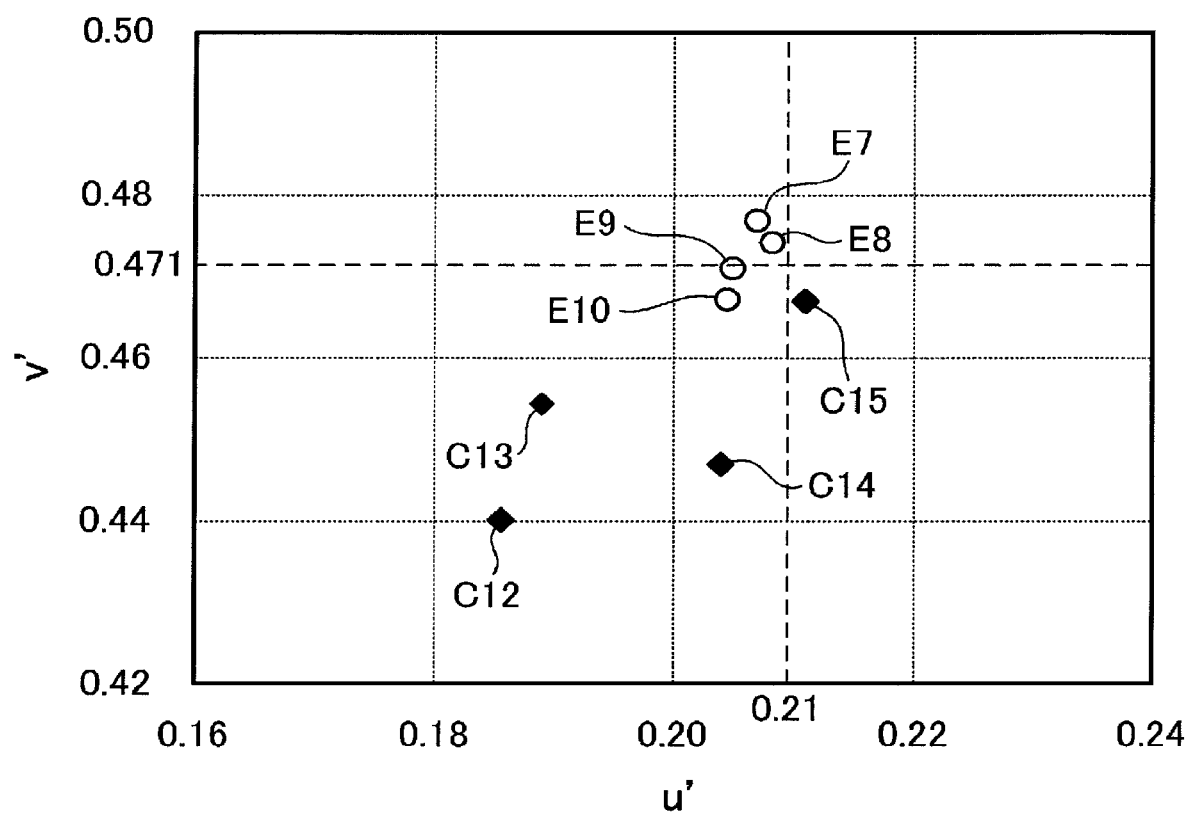

US 10,732,323 B2

RETARDATION FILM, CIRCULARLY-POLARIZING PLATE, AND IMAGE-DISPLAYING DEVICE

TECHNICAL FIELD

The present invention relates to a thin retardation film excellent in various properties such as optical properties, heat resistance, mechanical properties, and reliability, and to a circularly polarizing plate and an image display device each obtained by using the same.

BACKGROUND ART

In recent years, demands for an optical transparent resin used in an optical system such as optical lens, optical film and optical recording medium are increasing. Among others, in particular, the spread of a thin flat panel display (FPD) typified by a liquid crystal display or an organic EL (Electro Luminescence) display is notable, and various optical films have been developed and are utilized for the purpose of improving the contrast or tinting or enhancing the display quality such as enlargement of viewing angle and prevention of external light reflection.

In an organic EL display, a ¼ wavelength plate for preventing external light reflection is used. In order to suppress tinting and enable clear black display, the retardation film used for the ¼ wavelength plate is required to have a broadband wavelength dispersion property making it possible to obtain ideal retardation properties at each wavelength in the visible region.

In this connection, it is disclosed that a broadband retardation film is obtained, for example, by laminating two kinds of retardation films differing in the wavelength dispersion of birefringence while arranging respective slow axes to run at right angles to one another (Patent Document 1). It is also disclosed a method of obtaining by laminating a ½ wavelength plate and a ¼ wavelength plate while arranging respective slow axes in a specific configuration (Patent Document 2). Furthermore, a broadband retardation film composed of a cellulose acetate having a specific acetylation degree (Patent Document 3), and a retardation film which is composed of a polycarbonate copolymer containing a bisphenol structure having a fluorene ring in the side chain thereof and exhibits reverse wavelength dispersion property of decreasing in the retardation as the wavelength becomes shorter (Patent Document 4), are disclosed.

In recent years, a large number of the resins having a fluorene ring in the side chain as described above have been reported and proposed as a material useful for optical use by utilizing the characteristics derived from the fluorene ring, such as optical properties and heat resistance. In these resins, 9,9-bis[4-(2-hydroxyethoxy)phenyl]fluorene or 9,9-bis(4-hydroxy-3-methylphenyl)fluorene, each of which is a relatively easily available monomer, is often used (e.g., Patent Documents 5 and 6).

A resin having a new structure has also been developed. In Patent Document 7, a diamine compound having a fluorene ring in the side chain is disclosed, and a stretched film of a polyimide resin using the compound is described. In Patent Document 8, a polycarbonate resin using a fluorene compound containing no aromatic ring on the main chain is disclosed. In Patent Document 9, a dihydroxy compound or a diester compound, each having two fluorene rings in a single molecule, are disclosed, and a stretched film of a polyester resin using such a compound is described.

PRIOR ART DOCUMENT

Patent Document

Patent Document 1: JP-A-H05-27118
Patent Document 2: JP-A-H10-68816
Patent Document 3: JP-A-2000-137116
Patent Document 4: Japanese Patent No. 3,325,560
Patent Document 5: Japanese Patent No. 5,119,250
Patent Document 6: Japanese Patent No. 5,204,200
Patent Document 7: JP-A-2008-112124
Patent Document 8: JP-A-2008-222965
Patent Document 9: US-A-2012/0170118

SUMMARY OF THE INVENTION

Problems that the Invention is to Solve

Development in the FPD field is remarkable, and the retardation film is required to be more enhanced in terms of optical properties, quality, reliability, and the like and be reduced in the film thickness. It is also demanded to reduce the material cost and to enhance the productivity in each step such as film production, stretching and lamination. In turn, combination of various properties is being required of the retardation film. For example, a material having the required wavelength dispersion property, having various properties such as low photoelastic coefficient, high heat resistance, melt processability and mechanical strength, and ensuring that the intrinsic birefringence is large, the flexibility and stretchability are excellent, and a high degree of molecular orientation is obtained by stretching, is desired as the material used for the retardation film.

The method of laminating retardation films as in Patent Documents 1 and 2 is, however, disadvantageous in that the polarizing plate becomes thick and since respective retardation films must be laminated to arrange their slow axes in a specific configuration, the productivity or yield of the polarizing plate is reduced. The retardation film of Patent Document 3 or 4 has reverse wavelength dispersion property, and broadband retardation properties are obtained by one sheet of the film alone, but cellulose acetate of Patent Document 3 has a problem that the heat resistance is insufficient and an image spot is generated due to dimensional deformation resulting from moisture absorption.

The retardation film composed of a polycarbonate resin having a fluorene ring, described in Patent Documents 4 to 6, is known to be useful as a retardation film exhibiting reverse wavelength dispersion property or as a circularly polarizing plate for preventing external light reflection of the image display device. However, it has been found from studies by the present inventors that: in the case of a resin using 9,9-bis(4-hydroxy-3-methylphenyl)fluorene, the film is brittle and can be hardly stretched to such an extent as obtaining a high orientation degree; and in the case of a resin using 9,9-bis[4-(2-hydroxyethoxy)phenyl]fluorene, the photoelastic coefficient is slightly high and the reliability under high temperature is poor, though the stretchability is relatively excellent.

As means for improving various properties, it may be considered to change the copolymerization components, to adjust the ratio or the like. However, 9,9-bis(4-hydroxy-3-methylphenyl)fluorene is characterized in that the heat resistance is very high but the resin becomes brittle, and it has been difficult to improve the flexibility of the resin while maintaining appropriate heat resistance. In the case of 9,9-bis[4-(2-hydroxyethoxy)phenyl]fluorene, since this monomer component must be incorporated in an amount of approximately from 50 to 70% by mass so as to develop the desired reverse wavelength dispersion property, the freedom degree of molecular design for copolymerization is low, and it has been difficult to satisfy both the properties such as heat resistance and mechanical strength and the optical properties.

In the polycarbonate resin using a diol having a fluorene ring as described in Patent Document 8, the properties such as reverse wavelength dispersion property, photoelastic coefficient and heat resistance are insufficient. In Patent Document 9, it is stated that the polyester described therein has negative refractive index anisotropy, that is, the refractive index in the stretching direction is smaller than the refractive index in a direction orthogonal to stretching. However, the retardation film must have positive refractive index anisotropy, and the above-described polyester stretched film does not satisfy this requirement. In addition, Patent Document 9 is silent on the wavelength dependency of retardation.

As described above, it is difficult for conventional retardation films to achieve various properties such as reverse wavelength dispersion property, optical properties, heat resistance and mechanical strength in a balanced manner. In order to drastically improve the properties of a retardation film, a new compound excellent in the balance of various properties must be used for the raw material.

An object of the present invention is to solve those problems and provide a thin retardation film excellent in various properties, such as optical properties, heat resistance, mechanical properties and reliability, and to a circularly polarizing plate and an image display device each obtained by using the same.

Means for Solving the Problems

The present inventors have made intensive studies to attain the object above, as a result, they found that a retardation film formed form a resin having, as a repeating unit, a structural unit derived from a specific divalent oligofluorene exhibits excellent optical properties and mechanical properties, and accomplished the present invention. Specifically, the gist of the present invention resides in the followings.

[1] A retardation film containing a resin having positive refractive index anisotropy and containing at least one bonding group of a carbonate bond and an ester bond and one or more structural units selected from the group consisting of a structural unit represented by the following general formula (1) and a structural unit represented by the following general formula (2), in which:

the value of wavelength dispersion (R450/R550) as a ratio of retardation R450 at a wavelength of 450 nm to retardation R550 at a wavelength of 550 nm is more than 0.5 and less than 1.0:

[Chem. 1]

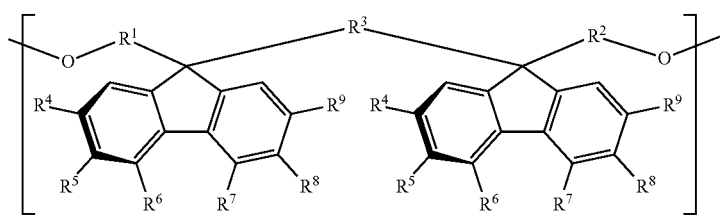

(1)

[Chem. 2]

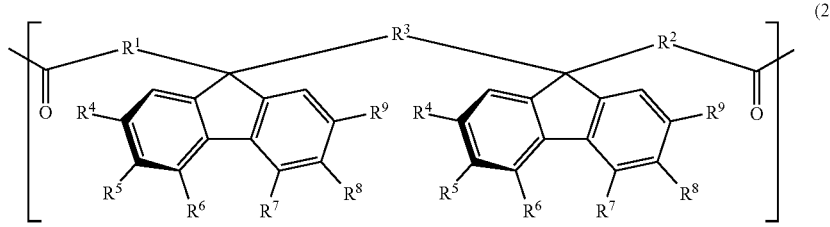

(2)

In the formulae (1) and (2), each of $R^1$ to $R^3$ is independently a direct bond or an alkylene group having a carbon number of from 1 to 4, which may have a substituent, and each of $R^4$ to $R^9$ is independently hydrogen atom, an alkyl group having a carbon number of from 1 to 10, which may have a substituent, an aryl group having a carbon number of from 4 to 10, which may have a substituent, an acyl group having a carbon number of from 1 to 10, which may have a substituent, an alkoxy group having a carbon number of from 1 to 10, which may have a substituent, an aryloxy group having a carbon number of from 1 to 10, which may have a substituent, an acyloxy group having a carbon number of from 1 to 10, which may have a substituent, an amino group which may have a substituent, a vinyl group having a carbon number of from 1 to 10, which may have a substituent, an ethynyl group having a carbon number of from 1 to 10, which may have a substituent, a sulfur atom having a substituent, a silicon atom having a substituent, a halogen atom, a nitro group, or a cyano group, provided that at least two adjacent groups out of $R^4$ to $R^9$ may be linked to each other to form a ring and two substituents $R^4$'s, $R^5$'s, $R^6$'s, $R^7$'s, $R^8$'s, and $R^9$'s may be the same with or different from each other.

[2] The retardation film according to the above-mentioned [1], which has a film thickness of 10 μm or more and 60 μm or less and a thickness accuracy of within ±5% and is composed of a single layer.

[3] The retardation film according to the above-mentioned [1] or [2], in which the resin has a refractive index at a sodium d line (wavelength: 589 nm) of from 1.49 to 1.56.

[4] The retardation film according to any one of the above-mentioned [1] to [3], in which the resin contains 1% by mass or more and 40% by mass or less of one or more structural units selected from the group consisting of the structural unit represented by the general formula (1) and the structural unit represented by the general formula (2).

[5] The retardation film according to any one of the above-mentioned [1] to [4], in which the resin has a glass transition temperature of 110° C. or higher and 160° C. or lower.

[6] The retardation film according to any one of the above-mentioned [1] to [5], in which the resin further contains a structural unit represented by the following general formula (3):

[Chem. 3]

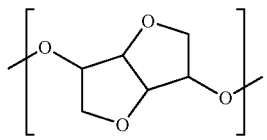

(3)

[7] The retardation film according to any one of the above-mentioned [1] to [6], in which the resin further contains one or more structural units selected from the group consisting of structural units represented by the following general formulae (4) to (8):

[Chem. 4]

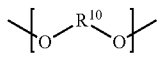

(4)

In the general formula (4), $R^{10}$ represents an alkylene group having a carbon number of from 2 to 20, which may be substituted.

[Chem. 5]

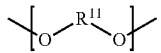

(5)

In the general formula (5), $R^{11}$ represents a cycloalkylene group having a carbon number of from 4 to 20, which may be substituted.

[Chem. 6]

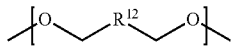

(6)

In the general formula (6), $R^{12}$ represents a cycloalkylene group having a carbon number of from 4 to 20, which may be substituted.

[Chem. 7]

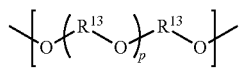

(7)

In the general formula (7), $R^{13}$ represents an alkylene group having a carbon number of from 2 to 10, which may be substituted, p is an integer of from 1 to 40, and two or more substituents $R^{13}$'s may be the same with or different from each other.

[Chem. 8]

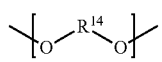

(8)

In the general formula (8), $R^{14}$ represents an acetal ring-containing group having a carbon number of from 2 to 20, which may be substituted.

[8] The retardation film according to any one of the above-mentioned [1] to [7], in which in the resin, the content of an aromatic group-containing structural unit (other than the structural unit represented by the general formula (1) and the structural unit represented by the general formula (2)) is 5% by mass or less.

[9] An unstretched film, which is a long film and becomes the retardation film described in any one of the above-mentioned [1] to [8] by a stretching treatment.

[10] A long retardation film obtained by stretching the unstretched film described in the above-mentioned [9] at least in one direction.

[11] A circularly polarizing plate comprising the retardation film described in any one of the above-mentioned [1] to [8] and [10] and a polarizer stacked on the retardation film.

[12] An image display device comprising the circularly polarizing plate described in the above-mentioned [11].

[13] An organic EL panel comprising the circularly polarizing plate described in the above-mentioned [11].

Advantage of the Invention

The retardation film of the present invention contains the above-described specific structural unit and therefore, is excellent in the balance of various properties such as optical properties, heat resistance, mechanical properties, and reliability. Consequently, the retardation film of the present invention can be suitably used in an image display device or the like.

BRIEF DESCRIPTION OF THE DRAWINGS

FIG. 1 is a u'-v' chromaticity diagram in which reflected hues of the organic EL panels obtained in Examples and Comparative Examples are plotted.

MODE FOR CARRYING OUT THE INVENTION

Embodiments of the present invention are described in detail below, but the description of constitutional requirements disclosed below is one example (representative example) of the embodiment of the present invention, and the present invention is not limited to the following contents as long as it does not go beyond the gist thereof.

In the present invention, the "structural unit" indicates a partial structure sandwiched between adjacent linking groups in a polymer, as well as a partial structure sandwiched between a polymerization reactive group present in the terminal portion of a polymer and a linking group adjacent to the polymerizable reaction group.

In this description, the percentage or parts expressed on "mass" basis has the same meaning as the percentage or parts expressed on "weight" basis.

The retardation film of the present invention contains at least one bonding group of a carbonate bond and an ester bond and a specific structural unit derived from divalent oligofluorene. More specifically, the resin above is a polycarbonate, a polyester or a polyester carbonate, each containing the above-described specific structural unit. As described later, the retardation film of the present invention may contain, in addition to the resin above, another synthetic resin, an additive, or the like, if desired.

<Oligofluorene Structural Unit>

The resin used for the retardation film of the present invention has one or more structural units selected from the group consisting of a structural unit represented by the following general formula (1) and a structural unit represented by the following general formula (2). In the following, these structural units are sometimes referred to as an oligofluorene structural unit.

have a substituent, a sulfur atom having a substituent, a silicon atom having a substituent, a halogen atom, a nitro group, or a cyano group, provided that at least two adjacent groups out of $R^4$ to $R^9$ may be linked to each other to form a ring and two substituents $R^4$'s, $R^5$'s, $R^6$'s, $R^7$'s, $R^8$'s, and $R^9$'s may be the same with or different from each other.

In $R^1$ and $R^2$, as the "alkylene group having a carbon number of from 1 to 4, which may have a substituent", for example, the following alkylene group may be employed: a linear alkylene group such as methylene group, ethylene group, n-propylene group, and n-butylene group; and an alkylene group having a branched chain, such as methylmethylene group, dimethylmethylene group, ethylmethylene group, propylmethylene group, (1-methylethyl)methylene group, 1-methylethylene group, 2-methylethylene group, 1-ethylethylene group, 2-ethylethylene group, 1-methylpropylene group, 2-methylpropylene group, 1,1-dimethylethylene group, 2,2-dimethylpropylene group, and 3-methylpropylene group. In $R^1$ and $R^2$, the position of a branched chain is indicated by a number assigned such that the carbon on the fluorene ring side becomes the $1^{st}$-position.

Selection of $R^1$ and $R^2$ has an important effect particularly on the development of reverse wavelength dispersion property. The resin above exhibits strongest reverse wavelength dispersion property in the state of fluorene rings being oriented perpendicularly to the main chain direction (stretch-

[Chem. 9]

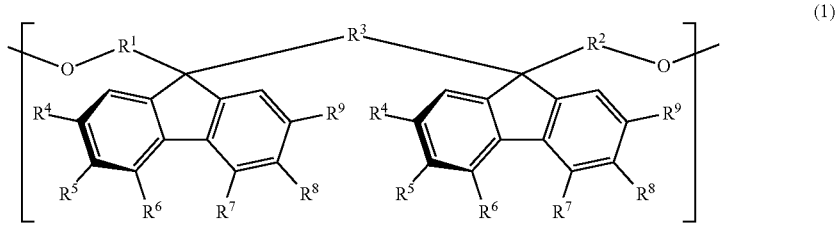

(1)

[Chem. 10]

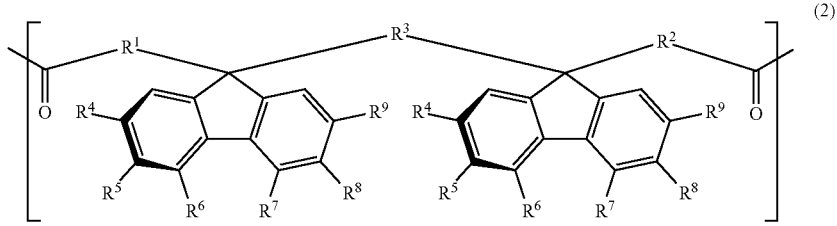

(2)

In the general formula (1) and the general formula (2), each of $R^1$ to $R^3$ is independently a direct bond or an alkylene group having a carbon number of from 1 to 4, which may have a substituent, and each of $R^4$ to $R^9$ is independently hydrogen atom, an alkyl group having a carbon number of from 1 to 10, which may have a substituent, an aryl group having a carbon number of from 4 to 10, which may have a substituent, an acyl group having a carbon number of from 1 to 10, which may have a substituent, an alkoxy group having a carbon number of from 1 to 10, which may have a substituent, an aryloxy group having a carbon number of from 1 to 10, which may have a substituent, an acyloxy group having a carbon number of from 1 to 10, which may have a substituent, an amino group which may have a substituent, a vinyl group having a carbon number of from 1 to 10, which may have a substituent, an ethynyl group having a carbon number of from 1 to 10, which may ing direction). In order to develop strong reverse wavelength dispersion property by approximation of the orientation state of fluorene rings to the state above, $R^1$ and $R^2$ in which the carbon number on the main chain of an alkylene group is from 2 to 3 are preferably employed. In the case where the carbon number is 1, unexpectedly, reverse wavelength dispersion property is not exhibited in some cases. The cause thereof is considered to be, for example, that orientation of fluorene rings is fixed in a direction not perpendicular to the main chain direction due to a steric hindrance of a carbonate group or an ester group, each of which is a linking group of the oligofluorene structural unit. On the other hand, in the case where the carbon number is too large, orientation of fluorene rings is weakly fixed and in turn, the reverse wavelength dispersion property may be weakened. Heat resistance of the resin is also reduced.

As shown in the general formula (1) and the general formula (2), one end of an alkylene group of $R^1$ and $R^2$ is bonded to a fluorene ring and the other end is bonded to either oxygen atom or carbonyl carbon contained in a linking group. In view of thermal stability, heat resistance and reverse wavelength dispersion property, the other end of the alkylene group is preferably bonded to carbonyl carbon. As described later, as a monomer having an oligofluorene structure, specifically, a diol or diester (hereinafter, the diester encompasses dicarboxylic acid) structure may be considered, but it is preferable to perform polymerization by using a diester as the raw material.

From the standpoint of facilitating the production, the same alkylene group is preferably employed for $R^1$ and $R^2$.

In $R^3$, as the "alkylene group having a carbon number of from 1 to 4, which may have a substituent", for example, the following alkylene group may be employed: a linear alkylene group such as methylene group, ethylene group, n-propylene group, and n-butylene group; and an alkylene group having a branched chain, such as methylmethylene group, dimethylmethylene group, ethylmethylene group, propylmethylene group, (1-methylethyl)methylene group, 1-methylethylene group, 2-methylethylene group, 1-ethylethylene group, 2-ethylethylene group, 1-methylpropylene group, 2-methylpropylene group, 1,1-dimethylethylene group, 2,2-dimethylpropylene group, and 3-methylpropylene group.

In $R^3$, the carbon number on the main chain of an alkylene group is preferably from 1 to 2, and the carbon number is more preferably 1. In the case of employing $R^3$ where the carbon number on the main chain is too large, similarly to $R^1$ and $R^2$, the fluorene ring may be weakly fixed to cause deterioration of the reverse wavelength dispersion property, increase in the photoelastic coefficient, reduction in the heat resistance, or the like. On the other hand, in the case where the carbon number on the main chain is small, the optical properties or heat resistance may be good, but in the case where the $9^{th}$-positions of two fluorene rings are connected by a direct bond, the thermal stability deteriorates.

In $R^1$ to $R^3$, as the substituent which the alkylene group may have, substituents exemplified below may be employed, but a substituent other than these may also be employed: a halogen atom selected from fluorine atom, chlorine atom, bromine atom, and iodine atom; an alkoxy group having a carbon number of from 1 to 10, such as methoxy group and ethoxy group; an acyl group having a carbon number of from 1 to 10, such as acetyl group and benzoyl group; an acylamino group having a carbon number of from 1 to 10, such as acetamide group and benzoylamide group; a nitro group; a cyano group; and an aryl group having a carbon number of from 6 to 10, such as phenyl group and naphthyl group, in which from 1 to 3 hydrogen atoms may be substituted by the above-described halogen atom, the above-described alkoxy group, the above-described acyl group, the above-described acylamino group, the above-described nitro group, the above-described cyano group, or the like.

The number of substituents above is not particularly limited but is preferably from 1 to 3. In the case where two or more substituents are present, the kind of these substituents may be the same with or different from each other. In the case where the number of substituents is too large, it may inhibit the reaction during polymerization or may cause thermal decomposition. From the standpoint of enabling industrial production at low cost, $R^1$ and $R^3$ are preferably unsubstituted.

In $R^4$ to $R^9$, as the "alkyl group having a carbon number of from 1 to 10, which may have a substituent", for example, the following alkyl group may be employed: a linear alkyl group such as methyl group, ethyl group, n-propyl group, n-butyl group, n-pentyl group, n-hexyl group, and n-decyl group; an alkyl group having a branched chain, such as isopropyl group, 2-methylpropyl group, 2,2-dimethylpropyl group, and 2-ethylhexyl group; and a cyclic alkyl group such as cyclopropyl group, cyclopentyl group, cyclohexyl group, and cyclooctyl group.

The carbon number of the alkyl group is preferably 4 or less, and more preferably 2 or less. In the case where the carbon number of the alkyl group is in this range, steric hindrance between fluorene rings hardly occurs, and desired optical properties derived from the fluorene ring tend to be obtained.

As the substituent which the alkyl group may have, substituents exemplified below may be employed, but a substituent other than these may also be employed: a halogen atom selected from fluorine atom, chlorine atom, bromine atom, and iodine atom; an alkoxy group having a carbon number of from 1 to 10, such as methoxy group and ethoxy group; an acyl group having a carbon number of from 1 to 10, such as acetyl group and benzoyl group; an acylamino group having a carbon number of from 1 to 10, such as acetamide group and benzoylamide group; a nitro group; a cyano group; and an aryl group having a carbon number of from 6 to 10, such as phenyl group and naphthyl group, in which from 1 to 3 hydrogen atoms may be substituted by the above-described halogen atom, the above-described alkoxy group, the above-described acyl group, the above-described acylamino group, the above-described nitro group, the above-described cyano group, or the like.

The number of substituents above is not particularly limited but is preferably from 1 to 3. In the case where two or more substituents are present, the kind of these substituents may be the same with or different from each other. In the case where the number of substituents is too large, it may inhibit the reaction during polymerization or may cause thermal decomposition. From the standpoint of enabling industrial production at low cost, $R^4$ to $R^9$ are preferably unsubstituted.

Specific examples of the alkyl group include a trifluoromethyl group, a benzyl group, a 4-methoxybenzyl group, and a methoxymethyl group.

In $R^4$ to $R^9$, as the "aryl group having a carbon number of from 4 to 10, which may have a substituent", for example, the following aryl group may be employed: an aryl group such as phenyl group, 1-naphthyl group and 2-naphthyl group; and a heteroaryl group such as 2-pyridyl group, 2-thienyl group and 2-furyl group.

The carbon number of the aryl group is preferably 8 or less, and more preferably 7 or less. Within this range, steric hindrance between fluorene rings hardly occurs, and desired optical properties derived from the fluorene ring tend to be obtained.

In $R^4$ to $R^9$, as the substituent which the aryl group may have, substituents exemplified below may be employed, but a substituent other than these may also be employed: a halogen atom selected from fluorine atom, chlorine atom, bromine atom, and iodine atom; an alkyl group having a carbon number of from 1 to 10, such as methyl group, ethyl group and isopropyl group; an alkoxy group having a carbon number of from 1 to 10, such as methoxy group and ethoxy group; an acyl group having a carbon number of from 1 to 10, such as acetyl group and benzoyl group; an acylamino group having a carbon number of from 1 to 10, such as acetamide group and benzoylamide group; a nitro group; and a cyano group. The number of substituents above is not particularly limited but is preferably from 1 to 3. In the case where two or more substituents are present, the kind of the substituents may be the same with or different from each other. From the standpoint of enabling industrial production at low cost, $R^4$ to $R^9$ are preferably unsubstituted.

Specific examples of the aryl group include a 2-methylphenyl group, a 4-methylphenyl group, a 3,5-dimethylphenyl group, a 4-benzoylphenyl group, a 4-methoxyphenyl group, a 4-nitrophenyl group, a 4-cyanophenyl group, a 3-trifluoromethylphenyl group, a 3,4-dimethoxyphenyl group, a 3,4-methylenedioxyphenyl group, a 2,3,4,5,6-pentafluorophenyl group, and a 4-methylfuryl group.

In $R^4$ to $R^9$, as the "acyl group having a carbon number of from 1 to 10, which may have a substituent", for example, the following acyl group may be employed: an aliphatic acyl group such as formyl group, acetyl group, propionyl group, 2-methylpropionyl group, 2,2-dimethylpropionyl group, and 2-ethylhexanoyl group; and an aromatic acyl group such as benzoyl group, 1-naphthylcarbonyl group, 2-naphthylcarbonyl group, and 2-furylcarbonyl group.

The carbon number of the acyl group is preferably 4 or less, and more preferably 2 or less. Within this range, steric hindrance between fluorene rings hardly occurs, and desired optical properties derived from the fluorene ring tend to be obtained.

As the substituent which the acyl group may have, substituents exemplified below may be employed, but a substituent other than these may also be employed: a halogen atom selected from fluorine atom, chlorine atom, bromine atom, and iodine atom; an alkyl group having a carbon number of from 1 to 10, such as methyl group, ethyl group and isopropyl group; an alkoxy group having a carbon number of from 1 to 10, such as methoxy group and ethoxy group; an acylamino group having a carbon number of from 1 to 10, such as acetamide group and benzoylamide group; a nitro group; a cyano group; and an aryl group having a carbon number of from 6 to 10, such as phenyl group and naphthyl group, in which from 1 to 3 hydrogen atoms may be substituted by the above-described halogen atom, the above-described alkoxy group, an acyl group having a carbon number of from 1 to 10, such as acetyl group or benzoyl group, the above-described acylamino group, the above-described nitro group, the above-described cyano group, or the like.

The number of substituents above is not particularly limited but is preferably from 1 to 3. In the case where two or more substituents are present, the kind of these substituents may be the same with or different from each other. From the standpoint of enabling industrial production at low cost, $R^4$ to $R^9$ are preferably unsubstituted.

Specific examples of the acyl group include a chloroacetyl group, a trifluoroacetyl group, a methoxyacetyl group, a phenoxyacetyl group, a 4-methoxybenzoyl group, a 4-nitrobenzoyl group, a 4-cyanobenzoyl group, and a 4-trifluoromethylbenzoyl group.

In $R^4$ to $R^9$, as the "alkoxy or aryloxy group, each of which has a carbon number of from 1 to 10 and may have a substituent", for example, the following alkoxy group and aryloxy group may be employed: an alkoxy group such as methoxy group, ethoxy group, isopropoxy group, tert-butoxy group, trifluoromethoxy group, and phenoxy group.

The carbon number of the alkoxy group and aryloxy group is preferably 4 or less, and more preferably 2 or less. Within this range, steric hindrance between fluorene rings hardly occurs, and desired optical properties derived from the fluorene ring tend to be obtained.

As the substituent which the alkoxy group and aryloxy group may have, substituents exemplified below may be employed, but a substituent other than these may also be employed: a halogen atom selected from fluorine atom, chlorine atom, bromine atom, and iodine atom; an alkyl group having a carbon number of from 1 to 10, such as methyl group, ethyl group and isopropyl group; an alkoxy group having a carbon number of from 1 to 10, such as methoxy group and ethoxy group; an acylamino group having a carbon number of from 1 to 10, such as acetamide group and benzoylamide group; a nitro group; a cyano group; and an aryl group having a carbon number of from 6 to 10, such as phenyl group and naphthyl group, in which from 1 to 3 hydrogen atoms may be substituted by the above-described halogen atom, the above-described alkoxy group, an acyl group having a carbon number of from 1 to 10, such as acetyl group or benzoyl group, the above-described acylamino group, the above-described nitro group, the above-described cyano group, or the like.

The number of substituents above is not particularly limited but is preferably from 1 to 3. In the case where two or more substituents are present, the kind of these substituents may be the same with or different from each other. From the standpoint of enabling industrial production at low cost, $R^4$ to $R^9$ are preferably unsubstituted.

Specific examples of the alkoxy group and aryloxy group include a chloromethyl group, a bromomethyl group, a 2-bromoethyl group, a trifluoromethyl group, a methoxymethyl group, a methoxyethoxymethyl group, a 3-chlorophenoxy group, a 3-bromophenoxy group, a 4-chlorophenoxy group, a 3-chlorophenoxy group, a 4-chlorophenoxy group, a 3-bromophenoxy group, a 4-bromophenoxy group, and a 4-methoxyphenoxy group.

In $R^4$ to $R^9$, as the "acyloxy group having a carbon number of from 1 to 10, which may have a substituent", for example, the following acyloxy group may be employed: an aliphatic acyloxy group such as formyloxy group, acetyloxy group, propanoyloxy group, butanoyloxy group, acrylyloxy group, and methacrylyloxy group; and an aromatic acyloxy group such as benzoyloxy group.

The carbon number of the acyloxy group is preferably 4 or less, and more preferably 2 or less. Within this range, steric hindrance between fluorene rings hardly occurs, and desired optical properties derived from the fluorene ring tend to be obtained.

As the substituent which the acyloxy group may have, substituents exemplified below may be employed, but a substituent other than these may also be employed: a halogen atom selected from fluorine atom, chlorine atom, bromine atom, and iodine atom; an alkyl group having a carbon number of from 1 to 10, such as methyl group, ethyl group and isopropyl group; an alkoxy group having a carbon number of from 1 to 10, such as methoxy group and ethoxy group; an acylamino group having a carbon number of from 1 to 10, such as acetamide group and benzoylamide group; a nitro group; a cyano group; and an aryl group having a carbon number of from 6 to 10, such as phenyl group and naphthyl group, in which from 1 to 3 hydrogen atoms may be substituted by the above-described halogen atom, the above-described alkoxy group, an acyl group having a carbon number of from 1 to 10, such as acetyl group and benzoyl group, the above-described acylamino group, the above-described nitro group, the above-described cyano group, or the like.

The number of substituents above is not particularly limited but is preferably from 1 to 3. In the case where two or more substituents are present, the kind of these substituents may be the same with or different from each other. From the standpoint of enabling industrial production at low cost, $R^4$ to $R^9$ are preferably unsubstituted.

Specific examples of the acyloxy group include a chloroacetyloxy group, a trifluoroacetyloxy group, a methoxyacetyloxy group, a phenoxyacetyloxy group, a 4-methoxybenzoyloxy group, a 4-nitrobenzoyloxy group, a 4-cyanobenzoyloxy group, and 4-trifluoromethylbenzoyloxy group.

In $R^4$ to $R^9$, as the specific structure of the "amino group which may have a substituent", for example, the following amino group may be employed, but an amino group other than these may also be employed: an amino group; an aliphatic amino group such as N-methylamino group, N,N-dimethylamino group, N-ethylamino group, N,N-diethylamino group, N,N-methylethylamino group, N-propylamino group, N,N-dipropylamino group, N-isopropylamino group, and N,N-diisopropylamino group; an aromatic amino group such as N-phenylamino group and N,N-diphenylamino group; an acylamino group such as formamide group, acetamide group, decanoylamide group, benzoylamide group, and chloroacetamide group; and an alkoxycarbonylamino group such as benzyloxycarbonylamino group and tert-butyloxycarbonylamino group.

As the amino group, it is preferable to employ an N,N-dimethylamino group, an N-ethylamino group or an N,N-diethylamino group, each of which is free of a proton of high acidity, has a small molecular weight and tends to enable an increase in the fluorene ratio, and an N,N-dimethylamino group is more preferably employed.

In $R^4$ to $R^9$, as the "vinyl or ethynyl group, each of which has a carbon number of from 1 to 10 and may have a substituent", for example, the following vinyl and ethynyl groups may be employed, but a vinyl group or the like other than these may also be employed: a vinyl group, a 2-methylvinyl group, a 2,2-dimethylvinyl group, a 2-phenylvinyl group, a 2-acetylvinyl group, a ethynyl group, a methylethynyl group, a tert-butylethynyl group, a phenylethynyl group, an acetylethynyl group, and a trimethylsilylethynyl group.

The carbon number of the vinyl group and the ethynyl group is preferably 4 or less. Within this range, steric hindrance between fluorene rings hardly occurs, and desired optical properties derived from the fluorene ring tend to be obtained. In addition, the fluorene ring conjugation length increases, and a stronger reverse wavelength dispersion property is thereby readily obtained.

In $R^4$ to $R^9$, as the "sulfur atom having a substituent", for example, the following sulfur-containing group may be employed, but a sulfur-containing group other than these may also be employed: a sulfo group; an alkylsulfonyl group such as methylsulfonyl group, ethylsulfonyl group, propylsulfonyl group, and isopropylsulfonyl group; an arylsulfonyl group such as phenylsulfonyl group and p-tolylsulfonyl group; an alkylsulfinyl group such as methylsulfinyl group, ethylsulfinyl group, propylsulfinyl group, and isopropylsulfinyl group; an arylsulfinyl group such as phenylsulfinyl group and p-tolylsulfonyl group; an alkylthio group such as methylthio group and ethylthio group; an arylthio group such as phenylthio group and p-tolylthio group; an alkoxysulfonyl group such as methoxysulfonyl group and ethoxysulfonyl group; an aryloxysulfonyl group such as phenoxysulfonyl group; an aminosulfonyl group; an alkylsulfonyl group such as N-methylaminosulfonyl group, N-ethylaminosulfonyl group, N-tert-butylaminosulfonyl group, N,N-dimethylaminosulfonyl group, and N,N-diethylaminosulfonyl group; and an arylaminosulfonyl group such as N-phenylaminosulfonyl group and N,N-diphenylaminosulfonyl group. The sulfo group may form a salt with lithium, sodium, potassium, magnesium, ammonium, or the like.

Among these sulfur-containing groups, it is preferable to employ a methylsulfinyl group, an ethylsulfinyl group or a phenylsulfinyl group, each of which is free of a proton of high acidity, has a small molecular weight and can increase the fluorene ratio, and a methylsulfinyl group is more preferably employed.

In $R^4$ to $R^9$, as the "silicon atom having a substituent", for example, the following silyl group may be employed: a trialkylsilyl group such as trimethylsilyl group and triethylsilyl group; and a trialkoxysilyl group such as trimethoxysilyl group and triethoxysilyl group. Among these, a trialkylsilyl group that can be stably treated is preferred.

In $R^4$ to $R^9$, as the "halogen atom", fluorine atom, chlorine atom, bromine atom, and iodine atom may be employed. Among these, it is preferable to employ fluorine atom, chlorine atom or bromine atom, each of which is relatively easily introduced and by virtue of the electron-withdrawing nature, tends to increase the reactivity of the $9^{th}$-position of fluorene, and chlorine atom and bromine atom are more preferably employed.

Adjacent two groups out of $R^4$ to $R^9$ may be linked to each other to form a ring. Specific examples thereof include a substituted fluorene structure having a skeleton exemplified in the following group [A].

Group [A]:

[Chem. 11]

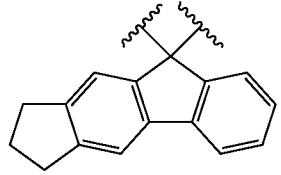

(A1)

[Chem. 12]

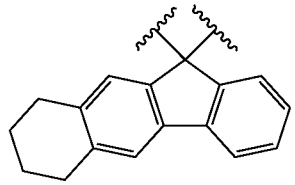

(A2)

[Chem. 13]

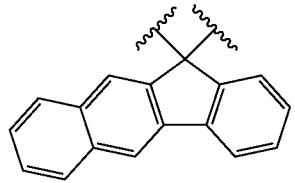

(A3)

[Chem. 14]

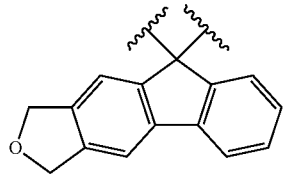

(A4)

-continued (A5)
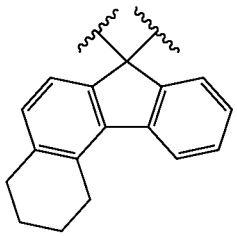

(A6)
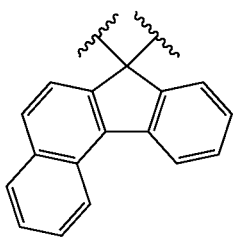

(A7)
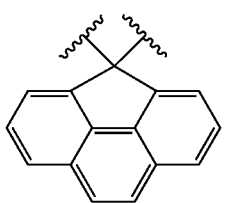

As described above, in the case where $R^4$ to $R^9$ are a specific atom or substituent as described above, this leads to a tendency that steric hindrance between the main chain and a fluorene ring or between fluorene rings is less likely to occur and desired optical properties derived from the fluorene ring can be obtained.

The fluorene ring contained in the oligofluorene structural unit preferably has either a configuration where all of $R^4$ to $R^9$ are hydrogen atom, or a configuration where $R^4$ and/or $R^9$ are any member selected from the group consisting of a halogen atom, an acyl group, a nitro group, a cyano group, and a sulfo group and $R^5$ to $R^8$ are hydrogen atom. In the case of having the former configuration, a compound containing the oligofluorene structural unit can be derived from industrially inexpensive fluorene. In the case of having the latter configuration, the reactivity at the $9^{th}$-position of fluorene increases and therefore, various induced reactions tend to be applicable in the course of synthesizing a compound containing the oligofluorene structural unit. The fluorene ring more preferably has either a configuration where all of $R^4$ to $R^9$ are hydrogen atom, or a configuration where $R^4$ and/or $R^9$ are any member selected from the group consisting of fluorine atom, chlorine atom, bromine atom, and a nitro group and $R^5$ to $R^8$ are hydrogen atom, and still more preferably a configuration where all of $R^4$ to $R^9$ are hydrogen atom. By employing this configuration, the fluorene ratio can be increased, steric hindrance between fluorene rings hardly occurs, and desired optical properties derived from the fluorene ring tend to be obtained.

Of divalent oligofluorene structural units represented by the general formula (1) and the general formula (2), preferable structures specifically include a structure having a skeleton exemplified in the following group [B].

Group [B]:

(B1)
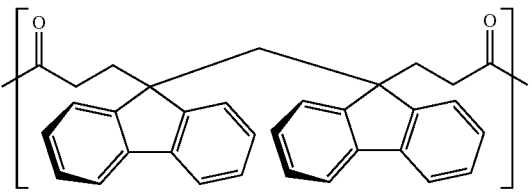

(B2)
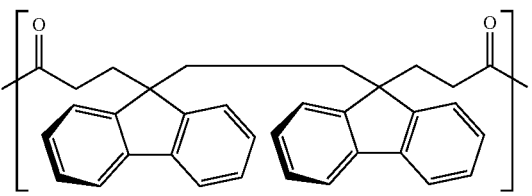

(B3)
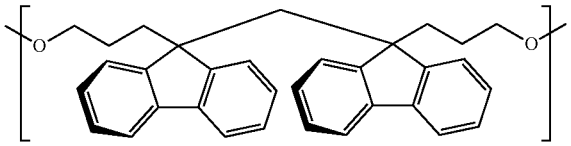

(B4)
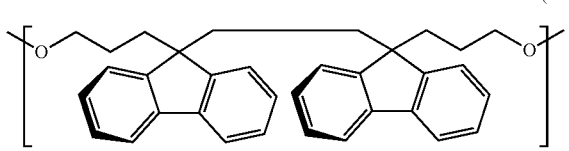

(B5)
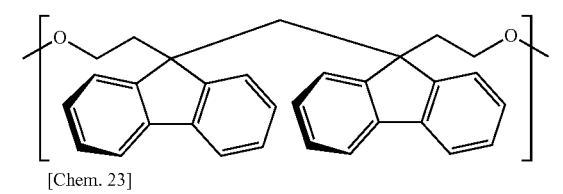

(B6)
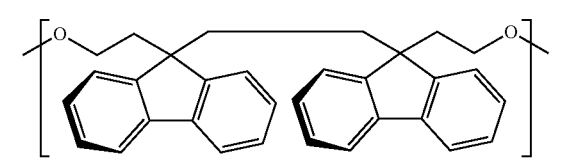

Compared with a structural unit (the following structural formula (9)) derived from 9,9-bis[4-(2-hydroxyethoxy)phenyl]fluorene or a structural unit (the following structural formula (10)) derived from 9,9-bis(4-hydroxy-3-methylphenyl)fluorene, which have been conventionally often used, the oligofluorene structural unit of the present invention has the following characteristics.

An aromatic component such as phenyl ring that has been conventionally incorporated into the main chain of a polymer is not incorporated into the main chain of a polymer, so that the photoelastic coefficient can be decreased.

Since the aromatic component above incorporated into the main chain exhibits a positive wavelength dispersion property of increasing in the birefringence as the wavelength is shorter, the reverse wavelength dispersion property derived from a fluorene ring in the side chain has been conventionally canceled to decrease the reverse wavelength dispersion property of the resin as a whole. In contrast, no aromatic component is incorporated into the main chain, whereby the reverse wavelength dispersion property can be more strongly developed.

Two fluorene rings are introduced per one molecule, whereby high heat resistance can be imparted.

The main chain is composed of a flexible alkylene chin, so that flexibility and melt processability can be imparted to the resin.

[Chem. 24]

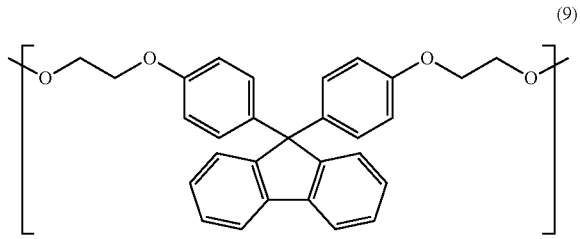

(9)

[Chem. 25]

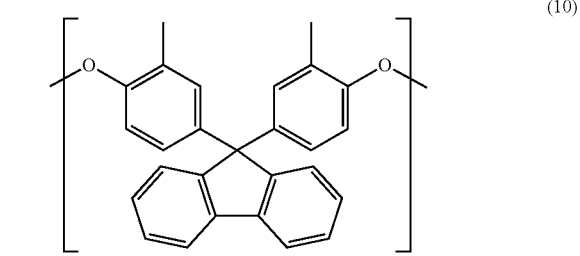

(10)

<Resin According to the Present Invention>

The retardation film of the present invention contains a resin containing the above-described oligofluorene structural unit and at least one bonding group of a carbonate bond and an ester bond. A polycarbonate, a polyester and a polyester carbonate, each of which is a resin having the bonding group above, are excellent in the heat resistance, mechanical properties and melt processability. In addition, there is an advantage that the oligofluorene structural unit can be relatively easily introduced into the resin by the copolymerization with other monomers and the ratio of the oligofluorene structural unit in the resin can be readily controlled to the desired range.

The method for introducing the oligofluorene structural unit into the resin includes, for example, a method of copolymerizing a diol or diester having the oligofluorene structural unit with another diol or diester. Specifically, a polycarbonate can be obtained by performing polymerization by using a combination of a diol and a carbonic acid diester represented by the following formula general (11). A polyester can be obtained by performing polymerization by using a combination of a diol and a diester. A polyester carbonate can be obtained by performing polymerization by using a combination of a diol, a diester, and a carbonic acid diester.

[Chem. 26]

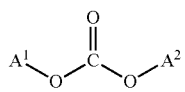

(11)

In the general formula (11), each of $A^1$ and $A^2$ is an aliphatic hydrocarbon group having a carbon number of from 1 to 18, which may have a substituent, or an aromatic hydrocarbon group which may have a substituent, and $A^1$ and $A^2$ may be the same with or different from each other.

The monomer having the oligofluorene structural unit includes, for example, a specific diol represented by the following general formula (12) and a specific diester represented by the following general formula (13):

[Chem. 27]

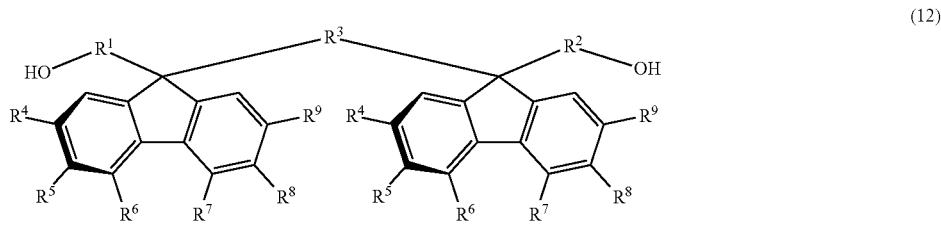

(12)

[Chem. 28]

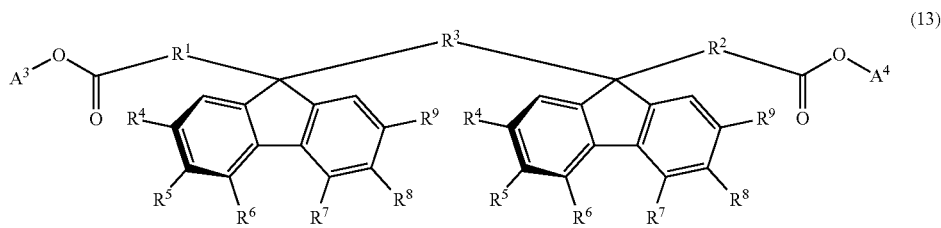

(13)

In the general formula (12) and the general formula (13), each of $R^1$ to $R^3$ is independently a direct bond or an alkylene group having a carbon number of from 1 to 4, which may have a substituent; each of $R^4$ to $R^9$ is independently hydrogen atom, an alkyl group having a carbon number of from 1 to 10, which may have a substituent, an aryl group having a carbon number of from 4 to 10, which may have a substituent, an acyl group having a carbon number of from 1 to 10, which may have a substituent, an alkoxy group having a carbon number of from 1 to 10, which may have a substituent, an aryloxy group having a carbon number of from 1 to 10, which may have a substituent, an acyloxy group having a carbon number of from 1 to 10, which may have a substituent, an amino group which may have a substituent, a vinyl group having a carbon number of from 1 to 10, which may have a substituent, an ethynyl group having a carbon number of from 1 to 10, which may have a substituent, a sulfur atom having a substituent, a silicon atom having a substituent, a halogen atom, a nitro group, or a cyano group, provided that at least two adjacent groups out of $R^4$ to $R^9$ may be linked to each other to form a ring; and each of $A^3$ and $A^4$ is hydrogen atom, an aliphatic hydrocarbon group having a carbon number of from 1 to 18, which may have a substituent, or an aromatic hydrocarbon group which may have a substituent, and $A^3$ and $A^4$ may be the same with or different from each other.

As the monomer having the divalent oligofluorene structural unit, the specific diester represented by the general formula (13) is preferably used. The specific diester has relatively good thermal stability as compared with the specific diol represented by the general formula (12), and fluorene rings in the polymer tend to be oriented in a preferable direction to exhibit a stronger reverse wavelength dispersion property.

On the other hand, when a polycarbonate and a polyester are compared, a polycarbonate obtained by the polymerization of a diol and a carbonic acid diester tends to be more well-balanced between heat resistance and mechanical properties. Accordingly, the resin used for the retardation film of the present invention is, among others, particularly preferably a polyester carbonate in which the above-described specific diester having an oligofluorene structural unit is incorporated into the structure of a polycarbonate.

In the case where $A^3$ and $A^4$ of the general formula (13) is hydrogen atom or an aliphatic hydrocarbon group such as methyl group or ethyl group, it is sometimes difficult to cause a polymerization reaction under usually-employed polymerization conditions of a polycarbonate. For this reason, $A^3$ and $A^4$ of the general formula (13) are preferably an aromatic hydrocarbon group.

In the case of performing a polymerization reaction by using the carbonic acid diester represented by the general formula (11), if all of $A^1$ and $A^2$ of the general formula (11) and $A^3$ and $A^4$ of the general formula (13) have the same structure, the components desorbing during the polymerization reaction are identical and are therefore easily recovered and recycled. Above all, in view of polymerization reactivity and usefulness in recycling, $A^1$ to $A^4$ are particularly preferably a phenyl group. In the case where $A^1$ to $A^4$ are a phenyl group, the component desorbing during the polymerization reaction is phenol.

In order to obtain the later-described positive refractive index anisotropy and sufficient reverse wavelength dispersion property in the retardation film of the present invention, the ratio of the oligofluorene structural unit in the resin must be adjusted to a specific range. The method for adjusting the ratio of the oligofluorene structural unit in the resin includes, for example, a method of copolymerizing a monomer having the oligofluorene structural unit with another monomer, and a method of blending the resin having the oligofluorene structural unit with another resin. A method of copolymerizing a monomer having the oligofluorene structural unit with another monomer is preferred, because the content of the oligofluorene structural unit can be precisely controlled, high transparency is imparted, and uniform properties are obtained on the entire surface of the film.

The content of the oligofluorene structural unit in the resin is, relative to the entire resin, preferably 1% by mass or more and 40% by mass or less, more preferably 10% by mass or more and 35% by mass or less, still more preferably 15% by mass or more and 30% by mass or less, and yet still more preferably 18% by mass or more and 25% by mass or less. In the case where the content of the oligofluorene structural unit is too large, the photoelastic coefficient or reliability may be deteriorated or a high refractive index may not be obtained by stretching. In addition, since the proportion of the oligofluorene structural unit occupying in the resin is increased and the width of molecular design latitude is narrow, it becomes difficult to make improvement when reforming of the resin is required. On the other hand, even if a desired reverse wavelength dispersion property is obtained with a very small amount of the oligofluorene structural unit, optical properties are here sensitively changed depending on a slight variation of the oligofluorene content and therefore, it is difficult to produce it such that various properties fall in given ranges.

The resin used for the retardation film of the present invention is preferably obtained by copolymerizing the above-described monomer having the oligofluorene structural unit with another monomer. Another monomer copolymerized includes, for example, a dihydroxy compound and a diester compound.

In the present invention, in view of optical properties, mechanical properties, heat resistance, or the like, the resin preferably contains, as a copolymerization component, a structural unit of the following general formula (3):

[Chem. 29]

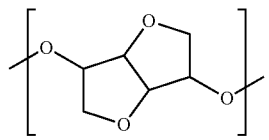

(3)

As the dihydroxy compound, into which the structural unit represented by the general formula (3) can be introduced, there may be mentioned isosorbide (ISB), isomannide and isoidide, which are in a stereoisomeric relationship. One of them may be used alone, or two or more thereof may be used in combination. Among these, use of ISB is most preferred in view of the availability and polymerization reactivity.

The structural unit represented by the general formula (3) is preferably contained, in the resin, in an amount of 5% by mass or more and 70% by mass or less, more preferably 10% by mass or more and 65% by mass or less, and still more preferably 20% by mass or more and 60% by mass or less. In the case where the content of the structural unit represented by the general formula (3) is too small, the heat resistance may be insufficient. On the other hand, in the case where the content of the structural unit represented by the general formula (3) is too large, the heat resistance may become excessively high to deteriorate the mechanical properties or melt processability. In addition, the structural unit represented by the general formula (3) is a highly hygroscopic structure and if the content thereof is excessively large, the water absorption percentage of the resin is increased, raising a fear that dimensional deformation occurs under a high-humidity environment.

In the present invention, the resin may further contain a different structural unit (hereinafter, such a structural unit is sometimes referred to as "other structural unit"), in combination with the structural unit of the general formula (3) or without using the structure of the general formula (3).

As the other structural unit, it is particularly preferable to have a structural unit represented by the following general formula (4) to (8) containing no aromatic component.

[Chem. 30]

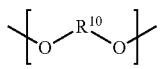

(4)

In the general formula (4), $R^{10}$ represents an alkylene group having a carbon number of from 2 to 20, which may have a substituent.

As the dihydroxy compound into which the structural unit of the general formula (4) can be introduced, for example, the following dihydroxy compound may be employed: a dihydroxy compound of a linear aliphatic hydrocarbon, such as ethylene glycol, 1,3-propanediol, 1,2-propanediol, 1,4-butanediol, 1,3-butanediol, 1,2-butanediol, 1,5-heptanediol, 1,6-hexanediol, 1,9-nonanediol, 1,10-decanediol, and 1,12-dodecanediol; and a dihydroxy compound of a branched aliphatic hydrocarbon, such as neopentyl glycol and hexylene glycol.

[Chem. 31]

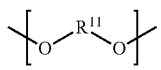

(5)

In the general formula (5), $R^{11}$ represents a cycloalkylene group having a carbon number of from 4 to 20, which may have a substituent.

As the dihydroxy compound into which the structural unit of the general formula (5) can be introduced, for example, the following dihydroxy compound may be employed: a dihydroxy compound as a secondary alcohol or tertiary alcohol of an alicyclic hydrocarbon, such as 1,2-cyclohexanediol, 1,4-cyclohexanediol, 1,3-adamantanediol, hydrogenated bisphenol A, and 2,2,4,4-tetramethyl-1,3-cyclobutanediol.

[Chem. 32]

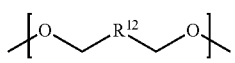

(6)

In the general formula (6), $R^{12}$ represents a cycloalkylene group having a carbon number of from 4 to 20, which may have a substituent.

As the dihydroxy compound into which the structural unit of the general formula (6) can be introduced, for example, the following dihydroxy compound may be employed: a dihydroxy compound as a primary alcohol of an alicyclic hydrocarbon, exemplified by a dihydroxy compound derived from a terpene compound, such as 1,2-cyclohexanedimethanol, 1,3-cyclohexanedimethanol, 1,4-cyclohexanedimethanol, tricyclodecanedimethanol, pentacyclopentadecanedimethanol, 2,6-decalindimethanol, 1,5-decalindimethanol, 2,3-decalindimethanol, 2,3-norbornanedimethanol, 2,5-norbornanedimethanol, 1,3-adamantanedimethanol, and limonene.

[Chem. 33]

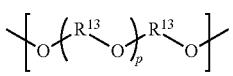

(7)

In the general formula (7), $R^{13}$ represents an alkylene group having a carbon number of from 2 to 10, which may have a substituent, p is an integer of from 1 to 40, and two or more substituents $R^{13}$'s may be the same with or different from each other.

As the dihydroxy compound into which the structural unit of the general formula (7) can be introduced, for example, the following dihydroxy compound may be employed: oxyalkylene glycols such as diethylene glycol, triethylene glycol, tetraethylene glycol, polyethylene glycol, and polypropylene glycol.

[Chem. 34]

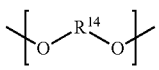

(8)

In the general formula (8), $R^{14}$ represents a group containing an acetal ring having a carbon number of from 2 to 20, which may have a substituent.

As the dihydroxy compound into which the structural unit of the general formula (8) can be introduced, for example, a spiroglycol represented by the following structural formula (14), a dioxane glycol represented by the following structural formula (15) or the like may be employed:

[Chem. 35]

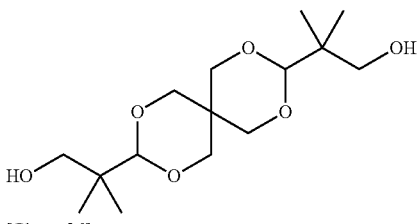

(14)

[Chem. 36]

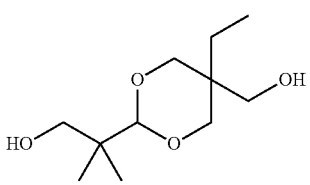

(15)

Other than the above-described dihydroxy compounds, a dihydroxy compound containing an aromatic component, exemplified below, may be used: an aromatic bisphenol compound such as 2,2-bis(4-hydroxyphenyl)propane, 2,2-bis(3-methyl-4-hydroxyphenyl)propane, 2,2-bis(4-hydroxy-3,5-dimethylphenyl)propane, 2,2-bis(4-hydroxy-3,5-diethylphenyl)propane, 2,2-bis(4-hydroxy-(3-phenyl)phenyl)propane, 2,2-bis(4-hydroxy-(3,5-diphenyl)phenyl)propane, 2,2-bis(4-hydroxy-3,5-dibromophenyl)propane, bis(4-hydroxyphenyl)methane, 1,1-bis(4-hydroxyphenyl)ethane, 2,2-bis(4-hydroxyphenyl)butane, 2,2-bis(4-hydroxyphenyl)pentane, 1,1-bis(4-hydroxyphenyl)-1-phenylethane, bis(4-hydroxyphenyl)diphenylmethane, 1,1-bis(4-hydroxyphenyl)-2-ethylhexane, 1,1-bis(4-hydroxyphenyl)decane, bis(4-hydroxy-3-nitrophenyl)methane, 3,3-bis(4-hydroxyphenyl)pentane, 1,3-bis(2-(4-hydroxyphenyl)-2-propyl)benzene, 1,3-bis(2-(4-hydroxyphenyl)-2-propyl)benzene, 2,2-bis(4-hydroxyphenyl)hexafluoropropane, 1,1-bis(4-hydroxyphenyl)cyclohexane, bis(4-hydroxyphenyl)sulfone, 2,4'-dihydroxydiphenylsulfone, bis(4-hydroxyphenyl)sulfide, bis(4-hydroxy-3-methylphenyl)sulfide, bis(4-hydroxyphenyl)disulfide, 4,4'-dihydroxydiphenyl ether, and 4,4'-dihydroxy-3,3'-dichlorodiphenyl ether; a dihydroxy compound having an ether group bonded to an aromatic group, such as 2,2-bis(4-(2-hydroxyethoxy)phenyl)propane, 2,2-bis(4-(2-hydroxypropoxy)phenyl)propane, 1,3-bis(2-hydroxyethoxy)benzene, 4,4'-bis(2-hydroxyethoxy)biphenyl, and bis(4-(2-hydroxyethoxy)phenyl)sulfone; and a dihydroxy compound having a fluorene ring, such as 9,9-bis(4-(2-hydroxyethoxy)phenyl)fluorene, 9,9-bis(4-hydroxyphenyl)fluorene, 9,9-bis(4-hydroxy-3-methylphenyl)fluorene, 9,9-bis(4-(2-hydroxypropoxy)phenyl)fluorene, 9,9-bis(4-(2-hydroxyethoxy)-3-methylphenyl)fluorene, 9,9-bis(4-(2-hydroxypropoxy)-3-methylphenyl)fluorene, 9,9-bis(4-(2-hydroxyethoxy)-3-isopropylphenyl)fluorene, 9,9-bis(4-(2-hydroxyethoxy)-3-isobutylphenyl)fluorene, 9,9-bis(4-(2-hydroxyethoxy)-3-tert-butylphenyl)fluorene, 9,9-bis(4-(2-hydroxyethoxy)-3-cyclohexylphenyl)fluorene, 9,9-bis(4-(2-hydroxyethoxy)-3-phenylphenyl)fluorene, 9,9-bis(4-(2-hydroxyethoxy)-3,5-dimethylphenyl)fluorene, 9,9-bis(4-(2-hydroxyethoxy)-3-tert-butyl-6-methylphenyl)fluorene, and 9,9-bis(4-(3-hydroxy-2,2-dimethylpropoxy)phenyl)fluorene.

As the diester compound which can be used for the copolymerization with the monomer having an oligofluorene structural unit, for example, the following dicarboxylic acid or the like may be employed: an aromatic dicarboxylic acid such as terephthalic acid, phthalic acid, isophthalic acid, 4,4'-diphenyldicarboxylic acid, 4,4'-diphenylether dicarboxylic acid, 4,4'-benzophenone dicarboxylic acid, 4,4'-diphenoxyethane dicarboxylic acid, 4,4'-diphenylsulfone dicarboxylic acid, and 2,6-naphthalenedicarboxylic acid; an alicyclic dicarboxylic acid such as 1,2-cyclohexanedicarboxylic acid, 1,3-cyclohexanedicarboxylic acid and 1,4-cyclohexanedicarboxylic acid; and an aliphatic dicarboxylic acid such as malonic acid, succinic acid, glutaric acid, adipic acid, pimelic acid, suberic acid, azelaic acid, and sebacic acid. These dicarboxylic acid components may be used as a dicarboxylic acid itself for the raw material of the polyester carbonate above, but according to the production method, a dicarboxylic acid ester such as methyl ester form and phenyl ester form or a dicarboxylic acid derivative such as dicarboxylic acid halide may also be used for the raw material.

In view of optical properties, among the other structural units recited above, those containing no aromatic component are preferably used. In the case where an aromatic component is contained in the main chain of the polymer, as described above, the reverse wavelength dispersion property of the fluorene ring is canceled, and the content of the oligofluorene structural unit must be increased, or the photoelastic coefficient may be deteriorated. By employing the other structural unit containing no aromatic component, an aromatic component can prevented from being incorporated into the main chain from the structural unit.

On the other hand, for providing a balance with heat resistance, mechanical properties or the like while ensuring optical properties, it is sometimes effective to incorporate an aromatic component into the main chain or side chain of the polymer. In this case, for example, the aromatic component can be introduced into the polymer by the above-described other structural unit containing an aromatic component.

In view of balance of various properties, the content of a structural unit containing an aromatic group (excluding a structural unit represented by the general formula (1) and a structural unit represented by the general formula (2)) in the resin is preferably 5% by mass or less, and more preferably 3% by mass or less.

As a monomer having the other structural unit above, it is particularly preferable to employ 1,4-cyclohexanedimethanol, tricyclodecanedimethanol, spiroglycol, or 1,4-cyclohexanedicarboxylic acid (or their derivatives). A resin containing a structural unit derived from such a monomer is excellent in the balance of optical properties, heat resistance, mechanical properties, and the like In the case where the resin is a polyester carbonate that is most preferred in the present invention, from the standpoint of increasing the reaction efficiency, it is preferable not to use a diester compound other than the diester compound having an oligofluorene structural unit, because the polymerization reactivity of a diester compound is relatively low.

As to the dihydroxy compound or diester compound for introducing the other structural unit, depending on the performance required of the resin obtained, it may be used alone, or two or more kinds thereof may be used in combination. The content of the other structural unit in the resin is preferably 1% by mass or more and 60% by mass or less, more preferably from 5% by mass or more and 55% by mass or less, and still more preferably from 10% by mass or more and 50% by mass or less. The other structural unit assumes a role of particularly adjusting the heat resistance of the resin or imparting flexibility or toughness, and therefore, if the content is too small, the mechanical properties or melt processability of the resin may be deteriorated, whereas if the content is too large, the heat resistance or optical properties may be deteriorated.

<Production Method of Resin Used in the Present Invention>

The polycarbonate, polyester and polyester carbonate that are used in the present invention can be produced by a polymerization method used in general. More specifically, the resin can be produced by a solution polymerization method or interfacial polymerization method using phosgene or a carboxylic acid halide, or a melt polymerization method of performing a reaction without using a solvent. Among these production methods, it is preferably produced by a melt polymerization method which does not use a solvent or a highly toxic compound and therefore, can reduce the environmental load and which is excellent in the productivity.

In the case of using a solvent for the polymerization, the glass transition temperature of the resin decreases due to a plasticizing effect of the solvent remaining in the resin, making it difficult to control the molecular orientation to a constant orientation in the later-described stretching step. In the case where a halogen-based organic solvent such as methylene chloride remains in the resin, when a formed product using this resin is incorporated into electronic equipment or the like, it may cause corrosion. A resin obtained by a melt polymerization method does not contain a solvent and is advantageous also for the processing step or the stabilization of product quality.

At the time of producing the resin by a melt polymerization method, a monomer having an oligofluorene structural unit, another copolymerization monomer of diol or diester and a polymerization catalyst are mixed and subjected to a transesterification reaction under melting, and the rate of reaction is increased by removing the desorbed components outside the system. In the latter stage of polymerization, the reaction is caused to proceed under high-temperature high-vacuum conditions until a target molecular weight is reached. When the reaction is completed, the resin in a molten state is withdrawn from the reactor to obtain a resin raw material for use in the retardation film.

In the present invention, a polycarbonate or a polyester carbonate can be obtained by using, as the raw material, at least a monomer containing an oligofluorene structural unit, one or more dihydroxy compounds and a carbonic acid diester, and performing polycondensation thereof.

The carbonic acid diester for use in the polycondensation reaction includes, usually, those represented by the above-mentioned general formula (11). One of these carbonic acid diesters may be used alone, or two or more thereof may be mixed and used.

[Chem. 37]

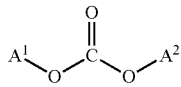

(11)

In the general formula (11), each of $A^1$ and $A^2$ is an aliphatic hydrocarbon group having a carbon number of from 1 to 18, which may have a substituent, or an aromatic hydrocarbon group which may have a substituent, and $A^1$ and $A^2$ may be the same with or different from each other.

Each of $A^1$ and $A^2$ is preferably a substituted or unsubstituted aromatic hydrocarbon group, and more preferably an unsubstituted aromatic hydrocarbon group. The substituent on the aliphatic hydrocarbon group includes an ester group, an ether group, a carboxylic acid, an amide group, and a halogen, and the substituent on the aromatic hydrocarbon group includes an alkyl group such as methyl group and ethyl group.

The carbonic acid diester represented by the general formula (11) includes, for example, diphenyl carbonate (DPC), a substituted diphenyl carbonate such as ditolyl carbonate, dimethyl carbonate, diethyl carbonate, and di-tert-butyl carbonate. Among these, diphenyl carbonate and a substituted diphenyl carbonate are preferred, and diphenyl carbonate is more preferred. The carbonic acid diester sometimes contains an impurity such as chloride ion, and it may inhibit the polymerization reaction or impair the hue of the obtained polycarbonate. Therefore, it is preferable to use one that has been purified by distillation or the like as needed.

In the polycondensation reaction, the molar proportion of all dihydroxy compounds and a diester compound used for the reaction is strictly adjusted, whereby the reaction rate or the molecular weight of the resin obtained can be controlled. In the case of a polycarbonate, the molar proportion of a carbonic acid diester relative to all dihydroxy compounds is preferably adjusted to be from 0.90 to 1.10, more preferably adjusted to be from 0.96 to 1.05, and still more preferably adjusted to be from 0.98 to 1.03. In the case of a polyester, the molar proportion of all diester compounds relative to all dihydroxy compounds is preferably adjusted to be from 0.70 to 1.10, more preferably adjusted to be from 0.80 to 1.05, and still more preferably adjusted to be from 0.85 to 1.00. In the case of a polyester carbonate, the molar proportion of the total amount of a carbonic acid diester and all diester compounds relative to all dihydroxy compounds is preferably adjusted to be from 0.90 to 1.10, more preferably adjusted to be from 0.96 to 1.05, and still more preferably adjusted to be from 0.98 to 1.03.

If the molar proportion greatly deviates from the range above, a resin having a desired molecular weight cannot be produced. Furthermore, in the case where the molar proportion is too small, the number of terminal hydroxy groups of the resin produced may be increased to deteriorate the thermal stability of the resin. In the case where the molar proportion is too large, the transesterification reaction rate may be reduced under the same conditions, or the amount of the remaining carbonic acid diester or diester compound in the produced resin may be increased, and the remaining low molecular compound may volatilize during film production or stretching to produce a film defect.

The melt polymerization method is usually carried out by a multistage process of two or more stages. The polycondensation reaction may be carried out by a process of two or more stages by using one polymerization reactor and sequentially changing the conditions, or may be carried out by a process of two or more stages by using two or more reactors and changing respective conditions, but in view of production efficiency, it is carried out by using two or more, preferably three or more reactors. The polycondensation reaction may be any of a batch reaction, a continuous reaction, and a combination of a batch reaction and a continuous reaction, but in view of production efficiency and quality stability, a continuous reaction is preferred.

In the polycondensation reaction, it is important to properly control the balance between temperature and pressure in the reaction system. If either one of the temperature and the pressure is changed too early, unreacted monomers is distilled out of the reaction system, as a result, the molar proportion of a dihydroxy compound and diester compound may be changed, failing in obtaining a resin having a desired molecular weight.

The polymerization rate of the polycondensation reaction is controlled by the balance between a terminal hydroxy group and a terminal ester group or a terminal carbonate group. Particularly, in the case of performing the polymerization by a continuous reaction, if the balance of terminal groups fluctuates due to distillation of unreacted monomers, the polymerization rate can be hardly controlled to a constant rate, and fluctuation in the molecular weight of the obtained resin may be increased. The molecular weight of the resin is correlated with the melt viscosity and therefore, the melt viscosity fluctuates at the time of melt film production of the obtained resin, as a result, the film can hardly keep the quality such as film thickness constant, which in turn causes reduction in the quality or productivity of the film.

Furthermore, in the case where unreacted monomers are distilled out, in addition to the balance of terminal groups, the copolymerization composition of the resin deviates from a desired composition, which may affect also the optical quality of the retardation film. In the retardation film of the present invention, the later-described wavelength dispersion property of retardation is controlled by the proportion of oligofluorene and copolymerization components in the resin and when the proportion is lost during polymerization, optical properties as designed may not be obtained or in the case of obtaining a long film, the optical properties may be changed depending on the position of the film, making it impossible to produce a polarizing plate having a constant quality.

Specifically, as the reaction conditions in the first-stage reaction, the following conditions may be employed. That is, the maximum inner temperature of the polymerization reactor is set in the range of usually 130° C. or more, preferably 150° C. or more and more preferably 170° C. or more, and usually 250° C. or less, preferably 240° C. or less and more preferably 230° C. or less. The pressure of the polymerization reactor is set in the range of usually 70 kPa or less (hereinafter, the pressure indicates an absolute pressure), preferably 50 kPa or less and more preferably 30 kPa or less, and usually 1 kPa or more, preferably 3 kPa or more and more preferably 5 kPa or more. The reaction time is set in the range of usually 0.1 hours or more and preferably 0.5 hours or more, and usually 10 hours or less, preferably 5 hours or less and more preferably 3 hours or less. The first-stage reaction is carried out while distilling a occurring monohydroxy compound derived from diester compound outside the reaction system. For example, in the case of using diphenyl carbonate as the carbonic acid diester, the monohydroxy compound distilled outside the reaction system in the first-stage reaction is phenol.

In the first-stage reaction, as the reaction pressure is lower, the polymerization reaction can be accelerated but, on the other hand, a distillation loss of unreacted monomers increases. In order to achieve both suppressing the distillation of unreacted monomers and accelerating the reaction by pressure reduction, it is effective to use a reactor equipped with a reflux condenser. In particular, the reflux condenser is preferably used in the initial stage of reaction, where the amount of unreacted monomers is large.

In and after the second stage, the pressure in the reaction system is gradually reduced from the pressure in the first stage and while removing the continuously occurring monohydroxy compound outside the reaction system, the pressure of the reaction system is finally reduced to 5 kPa or less, preferably 3 kPa or less, and more preferably 1 kPa or less. The maximum inner temperature is set in the range of usually 210° C. or more and preferably 220° C. or more, and usually 270° C. or less and preferably 260° C. or less. The reaction time is set in the range of usually 0.1 hours or more, preferably 0.5 hours or more and more preferably 1 hour or more, and usually 10 hours or less, preferably 5 hours or less and more preferably 3 hours or less. In order to suppress coloring or thermal deterioration and to obtain a resin with good hue or thermal stability, it is good to set the maximum inner temperature in all reaction stages being 270° C. or less, preferably 260° C. or less and more preferably 250° C. or less.

The transesterification reaction catalyst (hereinafter, sometimes simply referred to as a catalyst or a polymerization catalyst) which may be used at the polymerization may have a very large effect on the reaction rate or the color tone or thermal stability of a resin obtained by polycondensation. The catalyst used is not particularly limited as long as the produced resin can be satisfied with transparency, hue, heat resistance, thermal stability, and mechanical strength. Examples thereof include a compound of a metal belonging to Group 1 or Group 2 of the long-form periodic table (hereinafter, simply referred to as "Group 1" or "Group 2"), and a basic compound such as basic boron compound, basic phosphorus compound, basic ammonium compound, and amine-based compound. A compound of at least one metal selected from the group consisting of metals belonging to Group 2 of the long-form periodic table and lithium is preferably used.

As the Group 1 metal compound, for example, the following compounds may be employed, but a Group 1 metal compound other than these may also be employed: sodium hydroxide, potassium hydroxide, lithium hydroxide, cesium hydroxide, sodium hydrogencarbonate, potassium hydrogencarbonate, lithium hydrogencarbonate, cesium hydrogencarbonate, sodium carbonate, potassium carbonate, lithium carbonate, cesium carbonate, sodium acetate, potassium acetate, lithium acetate, cesium acetate, sodium stearate, potassium stearate, lithium stearate, cesium stearate, sodium borohydride, potassium borohydride, lithium borohydride, cesium borohydride, sodium tetraphenylborate, potassium tetraphenylborate, lithium tetraphenylborate, cesium tetraphenylborate, sodium benzoate, potassium benzoate, lithium benzoate, cesium benzoate, disodium hydrogenphosphate, dipotassium hydrogenphosphate, dilithium hydrogenphosphate, dicesium hydrogenphosphate, disodium phenylphosphate, dipotassium phenylphosphate, dilithium phenylphosphate, dicesium phenylphosphate, alcoholates and phenolates of sodium, potassium, lithium, and cesium, and disodium salt, dipotassium salt, dilithium salt, and dicesium salt of bisphenol A. Among these, in view of polymerization activity and hue of the obtained polycarbonate, use of a lithium compound is preferred.

As the Group 2 metal compound, for example, the following compounds may be employed, but a Group 2 metal compound other than these may also be employed: calcium hydroxide, barium hydroxide, magnesium hydroxide, strontium hydroxide, calcium hydrogencarbonate, barium hydrogencarbonate, magnesium hydrogencarbonate, strontium hydrogencarbonate, calcium carbonate, barium carbonate, magnesium carbonate, strontium carbonate, calcium acetate, barium acetate, magnesium acetate, strontium acetate, calcium stearate, barium stearate, magnesium stearate, and strontium stearate. Among these, a magnesium compound, a calcium compound and a barium compound are preferably used. In view of polymerization activity and hue of the obtained polycarbonate, use of a magnesium compound and/or a calcium compound is more preferred, and use of a calcium compound is most preferred.

Together with the Group 1 metal compound and/or the Group 2 metal compound, a basic compound such as basic boron compound, basic phosphorus compound, basic ammonium compound, and amine-based compound, may be secondarily used in combination, but it is particularly preferable to use a compound of at least one metal selected from the group consisting of metals belonging to Group 2 of the long-form periodic table and lithium.

As the basic phosphorus compound, for example, the following compounds may be employed, but a basic phosphorus compound other than these may also be employed: triethylphosphine, tri-n-propylphosphine, triisopropylphosphine, tri-n-butylphosphine, triphenylphosphine, tributylphosphine, and a quaternary phosphonium salt.

As the basic ammonium compound, for example, the following compounds may be employed, but a basic ammonium compound other than these may also be employed: tetramethylammonium hydroxide, tetraethylammonium hydroxide, tetrapropylammonium hydroxide, tetrabutylammonium hydroxide, N,N,N-trimethylethanolamine (choline), trimethylethylammonium hydroxide, trimethylbenzylammonium hydroxide, trimethylphenylammonium hydroxide, triethylmethylammonium hydroxide, triethylbenzylammonium hydroxide, triethylphenylammonium hydroxide, tributylbenzylammonium hydroxide, tributylphenylammonium hydroxide, tetraphenylammonium hydroxide, benzyltriphenylammonium hydroxide, methyltriphenylammonium hydroxide, and butyltriphenylammonium hydroxide.

As the amine-based compound, for example, the following compounds may be employed, but an amine-based compound other than these may also be employed: 4-aminopyridine, 2-aminopyridine, N,N-dimethyl-4-aminopyridine, 4-diethylaminopyridine, 2-hydroxypyridine, 2-methoxypyridine, 4-methoxypyridine, 2-dimethylaminoimidazole, 2-methoxyimidazole, imidazole, 2-mercaptoimidazole, 2-methylimidazole, aminoquinoline, and guanidine.

The amount of the polymerization catalyst used is usually from 0.1 µmol to 300 µmol and preferably from 0.5 µmol to 100 µmol, per 1 mol of all dihydroxy compounds used for the polymerization. As the polymerization catalyst, in the case of using a compound of at least one metal selected from the group consisting of metals belonging to Group 2 of the long-form periodic table and lithium, particularly, in the case of using a magnesium compound and/or a calcium compound, the polymerization catalyst is usually used in an amount of, in terms of the metal amount, 0.1 µmol or more, preferably 0.3 µmol or more and more preferably 0.5 µmol or more, per 1 mol of all dihydroxy compounds above. The amount of the polymerization catalyst used is preferably 30 µmol or less, preferably 20 µmol or less and more preferably 10 µmol or less.

In the case of producing a polyester or a polyester carbonate by using a diester compound as the monomer, a transesterification catalyst such as titanium compound, tin compound, germanium compound, antimony compound, zirconium compound, lead compound, osmium compound, zinc compound, and manganese compound, can also be used, in combination with or not in combination with the above-described basic compound. The transesterification catalyst is usually used in an amount of, in terms of the metal amount, from 1 µmol to 1 mmol, preferably from 5 µmol to 800 µmol, and more preferably from 10 µmol to 500 µmol, per 1 mol of all dihydroxy compounds used for the reaction.

If the amount of the catalyst is too small, the polymerization rate is slowed down and for obtaining a resin having a desired molecular weight, the polymerization temperature must be raised to make up for it. Consequently, the hue of the obtained resin is highly likely to deteriorate, or it is likely that an unreacted raw material volatilizes halfway through the polymerization to change the molar proportion of a dihydroxy compound and a diester compound and a desired molecular weight is not reached. On the other hand, if the amount of the polymerization catalyst used is too large, an undesirable side reaction may occur in combination to deteriorate the hue of the obtained resin or cause coloring of the resin at the time of formation processing.

Of Group 1 metals, sodium, potassium and cesium may adversely affect the hue in the case where they are contained in a large amount in the resin. Such a metal may migrate not only from the catalyst used but also from the raw material or the reaction apparatus. Irrespective of the source, the total amount of compounds of these metals in the resin may be, in terms of the metal amount, 2 µmol or less, preferably 1 µmol or less and more preferably 0.5 µmol or less, per 1 mol of all dihydroxy compounds above.

In the case of producing a polyester carbonate by using the diester compound represented by the general formula (13) as the monomer having an oligofluorene structural unit, the diester compound where $A^3$ and $A^4$ are an aromatic hydrocarbon group is preferably used, and it is more preferable to use the diester compound where $A^3$ and $A^4$ are a phenyl group. Using such a diester compound makes it possible to provide good polymerization reactivity, reduce the amount of the catalyst used, enhance the color tone or thermal stability of the obtained resin, and decrease the extraneous matter in the resin.

The resin for use in the present invention can be, after being polymerized as above, usually cooled/solidified and pelletized by a rotary cutter or the like. The method for pelletization is not particularly limited but includes, for example, a method where the resin is withdrawn in the molten state from the polymerization reactor in the final stage, cooled/solidified in the form of a strand and pelletized; a method where the resin is fed in the molten state to a single-screw or twin-screw extruder from the polymerization reactor in the final stage, melt-extruded, then cooled/solidified, and pelletized; and a method where the resin is withdrawn in the molten state from the polymerization reactor in the final stage, cooled/solidified in the form of a strand and once pelletized and thereafter, the resin is again fed to a single-screw or twin-screw extrude, melt-extruded, then cooled/solidified, and pelletized.

The molecular weight of the thus-obtained resin can be expressed by reduced viscosity. If the reduced viscosity of the resin is too low, the mechanical strength of the formed article may be reduced. The reduced viscosity is usually 0.20 dL/g or more and preferably 0.30 dL/g or more. On the other hand, if the reduced viscosity of the resin is too high, flowability at the time of forming tends to be reduced, deteriorating the productivity or formability. For this reason, the reduced viscosity is usually 1.20 dL/g or less, preferably 1.00 dL/g or less and more preferably 0.80 dL/g or less. As for the reduced viscosity, a solution having a polycarbonate concentration precisely adjusted to 0.6 g/dL is prepared by using methylene chloride as a solvent and measured by means of an Ubbelohde viscometer at a temperature of 20.0° C.±0.1° C.

The reduced viscosity is correlated to the melt viscosity of the resin and therefore, usually, a stirring power of a polymerization reactor, a discharge pressure of a gear pump for transferring the molten resin or the like can be used as an indicator for the operation control. More specifically, at the time when the indicated value of equipment for the operation above reaches a target value, the polymerization reaction is stopped by returning the pressure of the reactor to ordinary pressure or withdrawing the resin from the reactor.

The melt viscosity of the resin is, under the measurement conditions of a temperature of 240° C. and a shear rate of 91.2 sec$^{-1}$, preferably 700 Pa·s or more and 5,000 Pa·s or less, more preferably 800 Pa·s or more and 4,000 Pa·s or less, and still more preferably 900 Pa·s or more and 3,500 Pa·s or less. The melt viscosity is measured by using a capillary rheometer (manufactured by Toyo Seiki Seisakusho, Ltd.).

The glass transition temperature of the resin is preferably 110° C. or higher and 160° C. or lower, more preferably 120° C. or higher and 155° C. or lower, and still more preferably 130° C. or higher and 150° C. or lower. If the glass transition temperature is excessively low, the heat resistance tends to be deteriorated, leaving the possibility of causing a dimensional change after film forming or degrading the reliability of quality under the use condition of the retardation film. On the other hand if the glass transition temperature is excessively high, an unevenness may be produced in the film thickness at the time of film forming, the film may become brittle to deteriorate the stretchability, or the transparency of the film may be impaired.

In the case of using a diester compound for the polycondensation reaction, a byproduct monohydroxy compound may remain in the resin and volatilize at the time of film production or stretching to cause an odor, deteriorating the working environment or contaminating a transporting roll or the like to impair the appearance of the film. In the case of using diphenyl carbonate (DPC) that is a particularly useful carbonic acid diester, the byproduct phenol has a relatively high boiling point and is likely to remain in the resin without being sufficiently removed even by a reaction under reduced pressure.

Accordingly, the content of a carbonic acid diester-derived monohydroxy compound contained in the resin is preferably 1,500 ppm by mass or less, more preferably 1,000 ppm by mass or less and still more preferably 700 ppm by mass or less. In order to solve the above-described problem, the content of a monohydroxy compound is preferably smaller, but it is difficult in a melt polymerization method to reduce the content of a monohydroxy compound remaining in a polymer to zero, and an enormous effort is required for its removal. Usually, the above-described problem can be sufficiently suppressed by reducing the monohydroxy compound content up to 1 ppm by mass.

In order to reduce the content of low molecular components remaining in the resin, including the carbonic acid diester-derived monohydroxy compound, it is effective to perform degassing of the resin in an extruder as described above or adjust the pressure in the latter stage of polymerization to 3 kPa or less, preferably 2 kPa or less and more preferably 1 kPa or less.

In the case of reducing the pressure in the latter stage of polymerization, if the reaction pressure is excessively reduced, the molecular weight may be rapidly increased, making it difficult to control the reaction. The resin is therefore preferably produced by controlling the terminal group concentration thereof to be terminal hydroxy group-rich or terminal ester group-rich and bias the terminal group balance. Above all, in view of thermal stability, the amount of the terminal hydroxyl group is preferably 50 mol/ton or less and particularly 40 mol/ton or less. The amount of the terminal hydroxyl group can be quantitatively determined by $^1$H-NMR or the like. The amount of the terminal hydroxyl group can be adjusted by the charged molar ratio of all dihydroxy compounds and all diester compounds.

In the resin above, a heat stabilizer may be blended, if desired, so as to prevent reduction in the molecular weight during forming or the like or deterioration of the hue. The heat stabilizer includes a hindered phenol-based heat stabilizer and/or a phosphorus-based heat stabilizer, which are generally known.

As the hindered phenol-based compound, for example, the following compounds may be employed: 2,6-di-tert-butylphenol, 2,4-di-tert-butylphenol, 2-tert-butyl-4-methoxyphenol, 2-tert-butyl-4,6-dimethylphenol, 2,6-di-tert-butyl-4-methylphenol, 2,6-di-tert-butyl-4-ethylphenol, 2,5-di-tert-butylhydroquinone, n-octadecyl-3-(3',5'-di-tert-butyl-4'-hydroxyphenyl)propionate, 2-tert-butyl-6-(3'-tert-butyl-5'-methyl-2'-hydroxybenzyl)-4-methylphenyl acrylate, 2,2'-methylene-bis(4-methyl-6-tert-butylphenol), 2,2'-methylene-bis(6-cyclohexyl-4-methylphenol), 2,2'-ethylidene-bis(2,4-di-tert-butylphenol), tetrakis-[methylene-3-(3',5'-di-tert-butyl-4'-hydroxyphenyl) propionate]-methane, and 1,3,5-trimethyl-2,4,6-tris-(3,5-di-tert-butyl-4-hydroxybenzyl)benzene. Among these, tetrakis-[methylene-3-(3',5'-di-tert-butyl-4'-hydroxyphenyl) propionate]-methane, n-octadecyl-3-(3',5'-di-tert-butyl-4'-hydroxyphenyl)propionate, 1,3,5-trimethyl-2,4,6-tris-(3,5-di-tert-butyl-4-hydroxybenzyl)benzene are preferably used.

As the phosphorus-based compound, for example, the following phosphorous acid, phosphoric acid, phosphonous acid, phosphonic acid, and an ester or the like thereof may be employed, but a phosphorus-based compound other than these compounds may also be employed: triphenyl phosphite, tris(nonylphenyl)phosphite, tris(2,4-di-tert-butylphenyl)phosphite, tridecyl phosphite, trioctyl phosphite, trioctadecyl phosphite, didecylmonophenyl phosphite, dioctylmonophenyl phosphite, diisopropylmonophenyl phosphite, monobutyldiphenyl phosphite, monodecyldiphenyl phosphite, monooctyldiphenyl phosphite, bis(2,6-di-tert-butyl-4-methylphenyl)pentaerythritol diphosphite, 2,2-methylenebis(4,6-di-tert-butylphenyl)octyl phosphite, bis(nonylphenyl)pentaerythritol diphosphite, bis(2,4-di-tert-butylphenyl)pentaerythritol diphosphite, distearylpentaerythritol diphosphite, tributyl phosphate, triethyl phosphate, trimethyl phosphate, triphenyl phosphate, diphenyl-monoorthoxenyl phosphate, dibutyl phosphate, dioctyl phosphate, diisopropyl phosphate, tetrakis(2,4-di-tert-butylphenyl) 4,4'-biphenylenediphosphinate, dimethyl benzenephosphonate, diethyl benzenephosphonate, and dipropyl benzenephosphonate.

One of these heat stabilizers may be used alone, or two or more thereof may be used in combination.

The heat stabilizer may be added to the reaction solution at the time of melt polymerization or may be added to the resin by using the extruder and kneaded. In the case of producing a film by a melt extrusion method, it may be produced by adding the heat stabilizer or the like to the extruder, or the heat stabilizer or the like may be previously added to the resin and shaped into pellet or the like by means of an extruder before use.

The amount of the heat stabilizer blended is preferably 0.0001 parts by mass or more, more preferably 0.0005 parts by mass or more and still more preferably 0.001 parts by mass or more, and preferably 1 part by mass or less, more preferably 0.5 parts by mass or less and still more preferably 0.2 parts by mass or less, relative to 100 parts by mass of the resin used in the present invention.

In the resin above, an antioxidant generally known to prevent oxidation may be blended, if desired. As the antioxidant, for example, the following compounds may be employed, but a compound other than these may also be employed: pentaerythritol tetrakis(3-mercaptopropionate), pentaerythritol tetrakis(3-laurylthiopropionate), glycerol-3-stearylthiopropionate, triethylene glycol-bis[3-(3-tert-butyl-5-methyl-4-hydroxyphenyl)propionate], 1,6-hexanediol-bis [3-(3,5-di-tert-butyl-4-hydroxyphenyl)propionate], pentaerythritol tetrakis[3-(3,5-di-tert-butyl-4-hydroxyphenyl)propionate], octadecyl-3-(3,5-di-tert-butyl-4-hydroxyphenyl)propionate, 1,3,5-trimethyl-2,4,6-tris(3,5-di-tert-butyl-4-hydroxybenzyl)benzene, N,N-hexamethylenebis(3,5-di-tert-butyl-4-hydroxy-hydrocinnamide), diethyl 3,5-di-tert-butyl-4-hydroxy-benzylphosphonate, tris(3,5-di-tert-butyl-4-hydroxybenzyl) isocyanurate, tetrakis(2,4-di-tert-butylphenyl) 4,4'-biphenylene-diphosphonate, and 3,9-bis{1,1-dimethyl-2-[β-(3-tert-butyl-4-hydroxy-5-methylphenyl)propionyloxy]ethyl}-2,4,8,10-tetraoxaspiro(5,5)undecane.

One of these antioxidants may be used alone, or two or more thereof may be used in combination. The amount of the antioxidant blended is preferably 0.0001 parts by mass or more and preferably 0.5 parts by mass or less, relative to 100 parts by mass of the resin of the present invention.

Furthermore, in the resin above, an ultraviolet absorber, a release agent, an antistatic agent, a slip agent, a lubricant, a plasticizer, a compatibilizer, a nucleating agent, a flame retardant, an inorganic filler, an impact improver, a foaming agent, a dye/pigment, or the like, which are usually employed, may be contained, as long as the object of the present invention is not deteriorated.

For the purpose of modifying the properties of the resin, such as mechanical properties and solvent resistance, the resin may be kneaded to provide a polymer alloy with one or two or more members of a synthetic resin such as aromatic polycarbonate, aromatic polyester, aliphatic polyester, polyamide, polystyrene, polyolefin, acryl, amorphous polyolefin, ABS, AS, polylactic acid, and polybutylene succinate, rubber or the like.

The resin for use in the present invention can be produced by mixing the above-described additive and modifier with the components above all at a time or in any desired order by means of a mixing machine such as tumbler, V-shaped blender, Nauter mixer, Banbury mixer, kneading roll, and extruder. Among these, from the standpoint of improving dispersibility, kneading by an extruder, particularly, a twin-screw extruder, is preferred.

The resin obtained as above has a low birefringence, is excellent in the heat resistance and formability, and also has high transparency with little coloring and therefore, can be used for an optical film, an optical disc, an optical prism, a pickup lens, or the like, but, among others, is suitably used as a retardation film.

<Production Method of Unstretched Film>

As the method for producing an unstretched film by using the resin above, a casting method of dissolving the resin in a solvent, casting the solution and removing the solvent, or a melt film production method of melting the resin without use of a solvent and producing a film, may be employed. The melt film production method specifically includes a melt extrusion method using a T-die, a calender forming method, a hot pressing method, a co-extrusion method, a co-melting method, a multilayer extrusion method, an inflation forming method, and the like. The method for producing an unstretched film is not particularly limited, but since a casting method may cause a problem due to remaining solvent, a melt film production method is preferred, and in view of ease of the later-described stretching, a melt extrusion method using a T-die is more preferred.

In the case of forming an unstretched film by the melt film production method, the forming temperature is preferably 270° C. or lower, more preferably 265° C. or lower and still more preferably 260° C. or lower. If the forming temperature is too high, a defect due to an extraneous matter in the obtained film or generation of an air bubble may be increased, or the film may be colored. However, if the forming temperature is too low, the melt viscosity of the resin is excessively increased, making it difficult to shape a raw film, and it may be difficult to produce an unstretched film having a uniform thickness. For this reason, the lower limit of the forming temperature is usually 200° C. or higher, preferably 210° C. or higher and more preferably 220° C. or higher. The forming temperature of an unstretched film as used herein is a temperature at the time of forming in the melt film production method and usually indicates a value obtained by measuring the temperature at the die outlet from which the molten resin is extruded.

An extraneous matter, if present in the film, is recognized as a defect, such as light leakage, in the case where the film is used as a polarizing plate. In order to remove the extraneous material in the resin, preferred is a method of attaching a polymer filter after the extruder above, filtering the resin, and then extruding the resin from a die to form a film. At this time, the molten resin needs to be transferred by connecting an extrude, a polymer filter and a die by a pipe, and in order to suppress thermal deterioration in the pipe as much as possible, it is important to arrange respective facilities to provide a shortest residence time. In addition, it is required to perform the process of transportation or winding of the film after extrusion in a clean room and be careful as best as possible to prevent attachment of an extraneous matter to the film.

The thickness of the unstretched film is determined in accordance with the film thickness design of the retardation film after stretching or the stretching conditions such as stretch ratio, but if the thickness is too large, thickness unevenness is readily produced, whereas if the thickness is too small, breakage may be caused during stretching. For this reason, it is usually 30 μm or more, preferably 40 μm or more and more preferably 50 μm or more, and usually 200 μm or less, preferably 160 μm or less and more preferably 120 μm or less. In the case where the unstretched film has thickness unevenness, this causes retardation unevenness of a retardation film and therefore, the thickness of a portion used as a retardation film is preferably set thickness ±3 μm or less, more preferably set thickness ±2 μm or less and still more preferably set thickness ±1 μm or less.

The length in the longitudinal direction of the unstretched film is preferably 500 m or more, more preferably 1,000 m or more and still more preferably 1,500 m or more. In view of productivity or quality, at the time of production of the retardation film of the present invention, stretching is preferably performed continuously, but usually, the conditions need to be adjusted at the start of stretching so as to provide predetermined retardation. If the length of the film is too short, the amount of the product obtainable after the adjustment of conditions is decreased. In this description, the "long" means that the dimension in the longitudinal direction of the film is sufficiently larger than that in the width direction, and substantially indicates a length to an extent that the film can be wound in the longitudinal direction and formed into a coil. More specifically, this term means that the dimension in the longitudinal direction of the film is 10 times or more larger than the dimension in the width direction.

In the unstretched film obtained as above, the internal haze is preferably 3% or less, more preferably 2% or less and still more preferably 1% or less. If the internal haze of the unstretched film is larger than the upper limit above, light scattering may occur and, for example, when laminated with a polarizer, may cause depolarization. The lower limit of the internal haze is not particularly specified but is usually 0.1% or more. In the measurement of the internal haze, a sample after laminating an adhesive-applied transparent film, of which haze has been previously measured, to both surfaces of the unstretched film and thereby removing an influence of external haze, is used, and a value obtained by subtracting the haze of the adhesive-applied transparent film from the measured haze of the sample is defined as the internal haze.

The b* value of the unstretched film is preferably 3 or less. If the b* value of the film is too large, a problem such as coloring occurs. The b* value is more preferably 2 or less and still more preferably 1 or less. The b* value is measured by using a spectrocolorimeter, CM-2600d, manufactured by Konica Minolta, Inc.

In the unstretched film, irrespective of the thickness, the total light transmittance of the film itself is preferably 80% or more, more preferably 85% or more and still more preferably 90% or more. In the case where the light transmittance is not less than the lower limit above, a film with little coloring can be obtained, making it possible to provide a circularly polarizing plate with high polarization degree or transmittance when laminated with a polarizing plate and realize high display quality when used in an image display device. The upper limit of the total light transmittance of the film of the present invention is not particularly limited but is usually 99% or less.

In addition to reducing the haze or the b* value, by reducing the refractive index of the resin as well, the reflection on the surface of the film can be suppressed, and the total light transmittance can be enhanced. The refractive index at a sodium d line (wavelength: 589 nm) of the resin for use in the present invention is preferably from 1.49 to 1.56. The refractive index above is more preferably from 1.50 to 1.55, still more preferably from 1.51 to 1.54 and yet still more preferably from 1.51 to 1.53. The resin for use in the present invention contains an oligofluorene structural unit and therefore, the refractive index thereof becomes high as compared with a whole aromatic polymer, but since no aromatic compound is used for the copolymerization component, the refractive index can be kept in the range above.

In the retardation film of the present invention, the photoelastic coefficient is preferably $25\times10^{-12}\,Pa^{-1}$ or less, more preferably $20\times10^{-12}\,Pa^{-1}$ or less, still more preferably $15\times10^{-12}\,Pa^{-1}$ or less, and yet still more preferably $12\times10^{-12}\,Pa^{-1}$ or less. If the photoelastic coefficient is excessively large, when the retardation film is laminated together with a polarizing plate, reduction in the image quality, such as white blur around the image, may occur. In particular, when used for a large display device, this problem emerges significantly.

The unstretched film preferably undergoes no brittle fracture in the later-described bending test. In a film susceptible to brittle fracture, breakage of the film may readily occur at the time of film production or stretching, deteriorating the production yield. In order for the film not to undergo brittle fracture, it is important that the molecular weight, melt viscosity and glass transition temperature of the resin for use in the present invention are designed to fall in respective preferable ranges above. A method of adjusting the properties of the film by copolymerizing or blending a component capable of imparting flexibility is also effective.

In the film of the present invention, the saturated water absorption is preferably more than 1.0% by mass. In the case where the saturated water absorption is more than 1.0% by mass, adhesiveness tends to be easily ensured when laminating the film to another film or the like. For example, at the time of lamination to a polarizing plate, since the film is hydrophilic, the contact angle of water is low, and the adhesive is easily designed freely, so that high adhesion can be designed. If the saturated water absorption is 1.0% by mass or less, the film becomes hydrophobic, and the contact angle of water is high, making the design of adhesiveness difficult. In addition, the film tends to be readily charged, whereby it tends to cause a problem of increase in the appearance defect when incorporated into a circularly polarizing plate or an image display device, such as an entrainment of an extraneous matter or the like. On the other hand, if the saturated water absorption exceeds 3.0% by mass, the durability of optical properties under a humidity environment tends to be deteriorated, which is unpreferable. In the film of the present invention, the saturated water absorption is preferably more than 1.0% by mass and more preferably 1.1% by mass or more, and is preferably 3.0% by mass or less and more preferably 2.5% by mass or less. Depending on the use conditions of the film or an image display device using the same, the saturated water absorption may be set to 1.0% by mass or less.

<Production Method of Retardation Film>

The retardation film can be obtained by orienting the unstretched film above through stretching. As the stretching method, a known method such as longitudinal uniaxial stretching, transverse uniaxial stretching using a tenter or the like, and a combination thereof such as simultaneous biaxial stretching and successive biaxial stretching, may be used. The stretching may be performed by a batch system but in view of productivity, is preferably performed by a continuous system. Furthermore, compared with a batch system, a retardation film with little variation in the retardation in the film plane is obtained in a continuous system.

The stretching temperature is, relative to the glass transition temperature (Tg) of the resin used as the raw material, set to a range of from (Tg−20° C.) to (Tg+30° C.), preferably from (Tg−10° C.) to (Tg+20° C.) and more preferably from (Tg−5° C.) to (Tg+15° C.). The stretch ratio is determined according to the target retardation value but is, in each of longitudinal and transverse directions, preferably from 1.2 times to 4 times, more preferably from 1.5 times to 3.5 times and still more preferably from 2 times to 3 times. If the stretch ratio is too small, an effective range where desired orientation degree and orientation angle are obtained is narrow. On the other hand, if the stretch ratio is too large, the film may be broken during stretching or wrinkling may occur.

The stretching rate is also appropriately selected according to the purposed but may be selected to be, in terms of the strain rate represented by the following mathematical formula, usually from 50% to 2,000%, preferably from 100% to 1,500%, more preferably from 200% to 1,000%, and still more preferably from 250% to 500%. If the stretching rate is excessively large, breakage during stretching may be caused or fluctuation of optical properties due to long-term use under high temperature conditions may become large. If the stretching rate is excessively small, not only the productivity is reduced but also the stretch ratio must be sometimes excessively increased so as to obtain desired retardation.

Strain rate (%/min)={stretching rate (mm/min)/length of raw film (mm)}×100

The film after being stretched may be subjected to a heat setting treatment by a heating furnace, if desired, or may be subjected to a relaxation step of controlling the width of the tenter or adjusting the circumferential speed of the roll. The temperature of the heat setting treatment is, relative to the glass transition temperature (Tg) of the resin used for the unstretched film, from 60° C. to (Tg) and preferably from 70° C. to (Tg−5° C.). If the heat treatment temperature is too high, the molecular orientation obtained by stretching may be disrupted, leading to a significant drop from the desired retardation. In the case of providing a relaxation step, the stress produced in the stretched film can be removed by causing a shrinkage of 95% to 100% relative to the width of the film expanded by stretching. At this time, the treatment temperature applied to the film is the same as the temperature of heat setting treatment. By performing the above-described heat setting treatment or relaxation step, the fluctuation of optical properties due to a long-term use under high-temperature conditions can be suppressed.

The retardation film of the present invention can be manufactured by appropriately selecting and adjusting the treatment conditions in such a stretching step.

In the retardation film of the present invention, the in-plane birefringence (Δn) at a wavelength of 550 nm is preferably 0.002 or more, more preferably 0.0025 or more and still more preferably 0.003 or more. The retardation is proportional to the thickness (d) and the birefringence (Δn) of the film and therefore, by adjusting the birefringence to the above-described specific range, retardation as designed for a thin film can be developed, so that a film compatible with a thin device can be easily manufactured. In order to develop a high birefringence, the degree of orientation of polymer molecules must be increased, for example, by lowering the stretching temperature or increasing the stretch ratio, but under such stretching conditions, the film is likely to be broken and therefore, the case where the resin used has higher toughness is more advantageous.

In the retardation film of the present invention, the thickness is preferably 60 μm or less, though this may vary depending on the designed retardation value. The thickness of the retardation film is more preferably 50 μm or less, still more preferably 45 μm or less and yet still more preferably 40 μm or less. On the other hand, if the thickness is excessively small, the film is difficult to be handled and during the production, wrinkling may occur or breakage may be caused. For this reason, the lower limit of the thickness of the retardation film of the present invention is preferably 10 μm or more and more preferably 15 μm or more.

In the retardation film of the present invention, the value of wavelength dispersion (R450/R550) as a ratio of the retardation (R450) measured at a wavelength of 450 nm to the retardation (R550) measured at a wavelength of 550 nm is more than 0.5 and less than 1.0. The value of wavelength dispersion is more preferably 0.7 or more and 0.95 or less, still more preferably 0.75 or more and 0.92 or less and yet still more preferably 0.8 or more and 0.9 or less. In the case where the value of wavelength dispersion is within this range, ideal retardation properties can be obtained over a wide wavelength range in the visible region. For example, in the case where a retardation film having such wavelength dependency is manufactured as a ¼ wavelength plate and laminated to a polarizing plate, a circularly polarizing plate or the like can be manufactured, and a polarizing plate and a display device, where the hue is less wavelength-dependent, can be realized. On the other hand, if the ratio above is out of the range specified, the wavelength dependency of hue becomes large, and optical compensation is not achieved at all wavelengths in the visible region, causing a problem of coloring, reduction in contrast or the like due to passing of light through a polarizing plate or a display device.

In the retardation film of the present invention, the change rate of retardation in the later-described reliability evaluation is preferably 5% or less, more preferably 4% or less and still more preferably 3% or less. If the change rate exceeds the range above, for example, in the case of being used in a circularly polarizing plate for antireflection of an organic EL panel, the optical properties of the retardation film are changed under the use environment, thereby causing an increase in the reflectance or deterioration of the image quality such as color omission.

<Use of Retardation Film of the Present Invention>

The above-described retardation film is stacked on and laminated with a known polarizing film and cut into a desired dimension to provide a circularly polarizing plate. This circularly polarizing plate can be used, for example, for compensation of viewing angle, prevention of external light reflection, color compensation, conversion of linearly-polarized light to circularly-polarized light, or the like, in various displays (liquid crystal display device, organic EL display device, plasma display device, FED field emission display device, SED surface-conduction electron-emitter display device). In particular, when it is used in a circularly polarizing plate for prevention of external light reflection of an organic EL display, clear black display can be achieved, and the reliability of quality is also excellent. Furthermore, it has a performance capable of coping with thinning of a device in the future.

<Manufacture of Polarizing Plate>

As the polarizing film above, a polarizing film having an absorption axis in either the width direction or the longitudinal direction can be employed. Specifically, examples thereof include a film obtained by adsorbing a dichroic substance such as iodine or dichroic dye, to a hydrophilic polymer film such as polyvinyl alcohol-based film, partially-formalized polyvinyl alcohol-based film or partially-saponified ethylene/vinyl acetate copolymer film, and then uniaxially stretching the film; and a polyene-based oriented film such as dehydration product of polyvinyl alcohol or dehydrochlorination product of polyvinyl chloride. Among these, a long polarizing film obtained by adsorbing a dichroic substance such as iodine, to a polyvinyl alcohol-based film and uniaxially stretching the film is particularly preferred, because the polarization dichroic ratio is high. The thickness of this long polarizing film is not particularly limited but is generally on the order of from 1 to 80 μm.

The polarizing film obtained by adsorbing iodine to a polyvinyl alcohol-based film and uniaxially stretching the film can be manufactured, for example, by dipping polyvinyl alcohol in an aqueous solution of iodide to dye the film, and stretching it to from 3 to 7 times the original length. The aqueous solution may contain boric acid, zinc sulfate, zinc chloride or the like, if desired. In addition, polyvinyl alcohol may also be dipped in an aqueous solution of potassium iodide or the like.

If desired, the polyvinyl alcohol-based film before dyeing may be washed with water by dipping it in water. By washing the polyvinyl alcohol-based film with water, a contaminant and an anti-blocking agent on the surface of the polyvinyl alcohol-based film can be washed out. Furthermore, since the polyvinyl alcohol-based film swells, there is also an effect of preventing unevenness such as uneven dyeing. The film may be died with iodine and then stretched, may be stretched while dyeing the film, or may be stretched and then died with iodine. The stretching may also be performed in an aqueous solution of boric acid, potassium iodide or the like, or in a water bath.

In the circularly polarizing plate above, the angle between a slow axis of the retardation film and a width direction of the polarizing film is preferably 38° or larger and 52° or smaller, more preferably 40° or larger and 50° or smaller and still more preferably 42° or larger and 48° or smaller. If it is out of the range above, the later-described external light reflectance may be increased or the reflected light is tinted, leading to deterioration of the image display quality.

The retardation film and the polarizing film may be stacked via an adhesive. As the adhesive, a known adhesive can be used so long as it does not impair the optical properties of the lamination film.

The circularly polarizing plate has, as described above, sufficient optical characteristics and is configured to be suitably usable for a device requiring precision, thinness and homogeneousness. Consequently, the circularly polarizing plate can be suitably used, for example, in a liquid crystal panel used for a liquid-crystal display, and in an organic EL panel used for an organic EL display. In particular, an organic EL panel has a metal layer susceptible to reflection of external light and therefore, readily faces a problem of external light reflection and disturbing reflection of background scene. For preventing such external light reflection or the like, it is effective to provide the circularly polarizing plate on a light-emitting surface.

As the indicator for the properties of preventing external light reflection or the like in the organic EL panel, for example, a reflectance and a reflected hue may be employed. The reflectance affects the luminance of display color when displaying black color, that is, in the light-off state of an organic EL device, and as the reflectance is lower, sharper black color is obtained, improving the display visibility. If the reflectance is excessively high, despite an attempt to display black color, the luminance of display color may become large owing to external light reflection, resulting in a low bright room contrast and deteriorated visibility.

The reflected hue affects the color tone of display color at the time of displaying black color, and as the color tone is closer to an achromatic color, sharper black color is obtained. In case where the reflected color tone is tinged, it may be impossible to display black color. For the evaluation of reflected hue, for example, the color coordinate value in a u'-v' chromaticity diagram, an x-y chromaticity diagram or the like can be employed. In other words, the color coordinate of achromatic color in a u'-v' chromaticity diagram and an x-y chromaticity diagram is (u',v')=(0.210, 0.471) and (x,y)=(0.33, 0.33), respectively, and as the reflected hue is closer to the value above, sharper black color can be obtained.

EXAMPLES

The present invention is described in greater detail below by referring to Examples and Comparative Examples, but the present invention is not limited to these Examples as long as it does not go beyond the gist thereof. The quality evaluations of the oligofluorene monomer of the present invention, and the characteristic evaluations of the resin and transparent film were performed by the following methods. The method for characteristic evaluation is not limited to the following methods and can be appropriately selected by one skilled in the art.

<Evaluations of Monomer and Resin>

(1) Aluminum and Sodium Contents in Fluorene-Based Monomer

The aluminum and sodium contents in a monomer containing a fluorene ring (hereinafter, sometimes referred to as a fluorene-based monomer) were measured as follows. After wet decomposition of the analysis sample, the aluminum content and the sodium content were quantitatively determined by using ICP-AES (ULTIMA 2C, manufactured by HORIBA Jobin Yvon). With respect to the sodium content, depending on the analysis sample, analysis by an atomic absorption method (Spectr AA-220P, manufactured by VARIAN) was also used in combination.

(2) Chlorine Content in Fluorene-Based Monomer

The chlorine content in a fluorene-based monomer was measured as follows. The analysis sample was burned by using a combustion device, AQF-2100M, manufactured by Mitsubishi Chemical Corp., and the generated gas evolved was absorbed by pure water. Thereafter, the gas-absorbed pure water was introduced into an ion chromatograph, DX-500, manufactured by Nippon Dionex, and the chlorine content was quantitatively determined.

(3) Thermal Decomposition Temperature of Fluorene-Based Monomer

The glass transition temperature of the fluorene-based monomer was measured by using thermogravimetry-differential thermal analyzers, TG-DTA6300, manufactured by SII NanoTechnology, Inc. About 4 mg of the fluorene-based monomer was put in an aluminum pan manufactured by the same company and sealed up, and the temperature was raised from room temperature (from 20 to 30° C.) up to 600° C. at a temperature rise rate of 10° C./min in a nitrogen stream of 200 mL/min. From the obtained TG data (thermogravimetric data), the temperature at which the sample weight is decreased by 5 wt % was designated as a 5 wt % weight loss temperature. With respect to a solvent-containing monomer, the weight at the time where the solvent weight estimated from $^1$H-NMR is decreased from the weight at the start of measurement and the weight becomes not changed was designated as an initial weight, and the temperature at which the initial weight is decreased by 5 wt % was designated as the 5 wt % weight loss temperature. In addition, a peak top when from the obtained TG data (thermogravimetric data), no weight loss is recognized and a steep endothermic peak is observed was taken as the melting point of the sample.

(4) Absorption Maximum Wavelength in Ultraviolet-Visible Region (UV-Vis) of Fluorene-Based Monomer The absorption maximum wavelength in the ultraviolet-visible region (UV-Vis: from 280 to 800 nm) of the fluorene-based monomer was measured by using an ultraviolet-visible light absorption spectrophotometer, UV-1650PC, manufactured by Shimadzu Corporation. The measurement solution was accurately prepared by using tetrahydrofuran as a solvent so that the concentration as the fluorene ring could be 10 µM. By using a 1 cm-square quartz cell for the measurement cell, the measurement was performed in an environment at a temperature of 23±+5° C. The absorption spectrum of the measurement solution was measured in the range of from 280 to 800 nm, and the maximum value of absorption was taken as the absorption maximum wavelength ($\lambda_{max}$).

(5) Reduced Viscosity of Resin

A resin solution having a concentration of 0.6 g/dL was prepared by dissolving the resin in methylene chloride. By using an Ubbelohde-type viscosity tube manufactured by Moritomo Rika Kogyo, the measurement was performed at a temperature of 20.0° C.±0.1° C., and the solvent transit time $t_0$ and the solution transit time t were measured. A relative viscosity $\eta_{rel}$ was determined by using the obtained values of $t_0$ and t according to the following formula (i), and a specific viscosity $\eta_{sp}$ was determined by using the obtained relative viscosity $\eta_{rel}$ according to the following formula (ii).

$$\eta_{rel}=t/t_0 \quad \text{(i)}$$

$$\eta_{sp}(\eta-\eta_0)/\eta_0=\eta_{rel}-1 \quad \text{(ii)}$$

The obtained specific viscosity $\eta_{sp}$ was divided by the concentration c (g/dL) to determine the reduced viscosity $\eta_{sp}/c$. A higher value indicates a larger molecular weight.

(6) Melt Viscosity of Resin

A pellet-like resin was vacuum-dried at 90° C. for 5 hours or more. By using the dried pellet, the measurement was performed by a capillary rheometer manufactured by Toyo Seiki Seisaku-sho, Ltd. The measurement temperature was set to 240° C. and the melt viscosity was measured at a shear rate of from 9.12 to 1,824 sec$^{-1}$, and the value of melt viscosity at 91.2 sec$^{-1}$ was used. An orifice having a die diameter of 1 mmϕ and a die length of 10 mm was used.

(7) Glass Transition Temperature (Tg) of Resin

The glass transition temperature of the resin was measured by using a differential scanning calorimeter, DSC6220, manufactured by SII NanoTechnology Inc. About 10 mg of the resin was put in an aluminum pan manufactured by the same company and sealed up, and the temperature was raised from 30° C. up to 250° C. at a temperature rise rate of 20° C./min in a nitrogen stream of 50 mL/min. The temperature was kept for 3 minutes, then lowered to 30° C. at a rate of 20° C./min, kept at 30° C. for 3 minutes, and again raised to 200° C. at a rate of 20° C./min. From the DSC data obtained in the second temperature rise, an extrapolated glass transition starting temperature, which is a temperature at the intersection between a straight line created by extending the base line on the low temperature side to the high temperature side, and a tangent line drawn at a point where a curve gradient in a portion showing a stepwise change of glass transition becomes maximum, was determined and taken as the glass transition temperature.

<Evaluation of Unstretched Film>

(8) Formation of Film

The unstretched film was prepared by the following two methods.

In Examples 1 to 6 and Comparative Examples 1 to 11 described later, press forming was performed through the following procedure to manufacture an unstretched film. About 4 g of pellets of a resin that had been vacuum-dried at 90° C. for 5 hours or more were preheated for 3 minutes at a temperature of from 200 to 230° C. by spreading a polyimide film above and below the sample with use of a spacer of 14 cm in width, 14 cm in length and 0.1 mm in thickness, and after pressurization for 5 minutes under the condition of a pressure of 40 MPa, the sample with the spacer was taken out and cooled to manufacture a film. In this method, the film thickness accuracy could not be 5% or less. In the description of the present invention, the thickness accuracy was calculated according to the following formula. More specifically, the thickness in each position of the film is measured, and a ratio of the difference between the average value and the maximum value or minimum value in the fluctuation range, to the average value indicates the thickness accuracy.

Thickness accuracy [%]=|maximum or minimum value of thickness−average value|/average value×100

In Examples 7 to 10 and Comparative Examples 12 to 15 described later, a long unstretched film was manufactured by a melt extrusion method. The melt extrusion method was performed as follows. Pellets of a resin that had been vacuum-dried at 90° C. for 5 hours or more were extruded from a T-die (width 200 mm, preset temperature: from 200 to 240° C.) by using a single-screw extruder (screw diameter: 25 mm, cylinder preset temperature: from 220° C. to 240° C.) manufactured by Isuzu Machinery. The extruded film was formed into a roll by a winder while cooling it with a chill roll (preset temperature: from 120 to 150° C.) to manufacture a long unstretched film. In this method, a film thickness accuracy of 5% or less could be realized by adjusting the lip width of T-die, the temperature of chill roll, the distance between T-die and chill roll, or the like.

(9) Measurements of Refractive Index and Abbe Number

A rectangular specimen having a length of 40 mm and a width of 8 mm was cut out from the unstretched film manufactured above by a hot pressing method or a melt extrusion method and used as the measurement sample. By using an interference filter for wavelengths of 656 nm (C line), 589 nm (D line) and 486 nm (F line), the refractive indices $n_C$, $n_D$ and $n_F$ at each wavelength were measured by a multi-wavelength Abbe refractometer, DR-M4/1550, manufactured by ATAGO Co., Ltd. The measurement was performed at 20° C. by using monobromonaphthalene as an interfacial liquid. The Abbe number $v_d$ was calculated according to the following formula.

$$v_d=(1-n_D)/(n_C-n_F)$$

A larger Abbe number indicates smaller wavelength dependency of the refractive index.

(10) Measurement of Total Light Transmittance

An unstretched film having a thickness of about 100 μm was manufactured by the above-described melt extrusion method and measured for the total light transmittance by using a turbidimeter, COH400, manufactured by Nippon Denshoku Industries Co., Ltd.

(11) Photoelastic Coefficient

The unstretched film was cut into a rectangular shape having a width of 20 mm and a length of 100 mm to manufacture a sample. This sample was measured with light having a wavelength of 550 nm by an ellipsometer, M-150, manufactured by JASCO Corporation to obtain a photoelastic coefficient.

(12) Water Absorption Percentage

An unstretched film having a thickness of from 100 to 300 μm was manufactured by either one of the above-described methods and cut out into a square having a width of 100 mm and a length of 100 mm to manufacture a sample. By using this sample, the water absorption percentage was measured in conformity with "Test Methods for Water Absorption and Boiling Water Absorption of Plastics" described in JIS K 7209 (1984).

(13) Toughness of Film (Bending Test)

An unstretched film having a thickness of from 100 to 200 μm was manufactured by either one of the above-described methods, and a rectangular specimen having a length of 40 mm and a width of 10 mm was prepared from the film. Right and left joint surfaces of a vise were spaced apart by a distance of 40 mm, and both ends of the specimen were fixed in the joint surfaces. The distance between right and left joint surfaces was then narrowed at a rate of 2 mm/sec or lower, and while keeping the film not to protrude from the joint surface, the entire film bent substantially in a U shape was compressed within the joint surfaces. A specimen that is broken into two pieces (or three or more pieces) at the bent part before the joint surfaces were in close contact with each other was judged as "broken", and a specimen that can be bent without breaking even when the joint surfaces were completely close contact with each other was judged as "not broken". The test was repeated five times for the same kind of film, and the film was rated "C: The film undergoes brittle fracture" when judged as "broken" four or more times, and rated "A: The film does not undergo brittle facture" when judged as "broken" three or less times.

<Evaluation of Retardation Film>

(14) Stretching of Film

A retardation film was manufactured by the following two methods depending on the above-described manufacturing method of the unstretched film.

The unstretched film manufactured by a hot pressing method was stretched by the following method. A film piece having a width of 50 mm and a length of 125 mm was cut out from the unstretched film, and free-end uniaxial stretching of the film piece above was performed at a stretching temperature of glass transition temperature of resin+15° C., a stretching rate of 300%/min and a stretch ratio of 1.5 times by using a batch biaxial stretching apparatus (Biaxial Stretching System BIX-277-AL, manufactured by Island Kogyo Co., Ltd.) to obtain a retardation film.

The long unstretched film manufactured by a melt extrusion method was stretched by the following method. A rectangular film piece having a width of 120 mm and a length of 150 mm was cut out from the unstretched film, and uniaxial stretching of the film piece above was performed at a stretching rate of 300%/min by using a tenter stretching apparatus, KARO IV, manufactured by Bruckner without holding the film piece in a direction orthogonal to the stretching direction, to thereby obtain a retardation film. The conditions such as stretching temperature and ratio are described in each of Examples and Comparative Examples later.

(15) Retardation and Wavelength Dispersion of Retardation Film

A sample having a width of 4 cm and a length of 4 cm was cut out from the retardation film obtained by either one of the methods described above. The sample was measured for retardation R450 at a wavelength of 450 nm, retardation R550 at a wavelength of 550 nm, and retardation R650 at a wavelength of 650 m in a room at 23° C. by using AxoScan manufactured by Axometrics Inc. By using the obtained retardation values, the value of wavelength dispersion (R450/R550) as a ratio of retardation R450 to retardation R550 and the ratio (R650/R550) of retardation R650 and retardation R550 were calculated. The positive or negative of refractive index anisotropy can be decided from the relationship between the orientation angle (slow axis) and the stretching direction. In the measurement of retardation, in the case where the slow axis is coincident with the stretching direction, the refractive index anisotropy of this resin is positive.

(16) Thickness and Birefringence (Orientation Degree) of Retardation Film

The thickness of the retardation film was measured by using a contact-type thickness gauge, PEACOCK, manufactured by OZAKI MFG. Co., Ltd. By using retardation R550 at 550 nm obtained in the measurement of retardation above and the thickness of retardation film, the birefringence (Δn) was determined according to the following formula.

Birefringence=$R550$ [nm]/(film thickness [mm]×$10^6$)

A larger value of birefringence indicates a higher orientation degree of the polymer. In addition, as the value of birefringence is larger, the thickness of the film for obtaining a desired retardation value can be reduced.

(17) Change Rate of Retardation

A sample in which an adhesive-applied retardation film is laminated to glass was prepared and measured for the retardation by the same method as in the measurement of retardation above. The sample after measurement was charged into a heated oven at 85° C. for 180 hours. After that, the sample was taken out and again measured for the retardation to determine the change rate of R550.

<Characteristic Evaluation of Circularly Polarizing Plate Using Retardation Film>

(18) Manufacture of Circularly Polarizing Plate

The retardation film above was coated with an acrylic adhesive film to prepare an adhesive-applied retardation film. The adhesive applied retardation film was laminated together with an adhesive-applied polarizing plate, MCIG1481DUARC9, manufactured by Nitto Denko Corp., such that the absorption axis thereof makes an angle of 45° with the stretching axis of the retardation film, to thereby manufacture a circularly polarizing film.

(19) Manufacture of Organic EL Panel

The organic EL panel was removed from an organic EL display, 15EL9500, manufactured by LG. The polarizing plate laminated to the organic EL panel was peeled off, and the circularly polarizing plate above was instead laminated to manufacture an organic EL panel to be tested.

(20) Reflectance and Reflected Hue of Organic EL Panel

The organic EL panel manufactured above was used as the specimen and measured for the reflectance and reflected hue by using a spectrocolorimeter, CM-2600d, manufactured by Konica Minolta, Inc. The reflected hue was indicated by distance Δu'v' from achromatic color on a u'-v' chromaticity diagram, represented by the following formula. In the following formula, each of u' and v' is the value of the color coordinate on the u'-v' chromaticity diagram obtained by the measurement above.

$$\Delta u'v' = \sqrt{(u' \text{ of circularly polarizing plate} - 0.210)^2 + (v' \text{ of circularly polarizing plate} - 0.471)^2}$$ [Math. 1]

<Synthesis Examples of Monomers>

The synthesis method of monomers used for the production of a resin is described below.

Synthesis Example 1

Synthesis of bis(fluoren-9-yl)methane (Compound 1)

[Chem. 38]

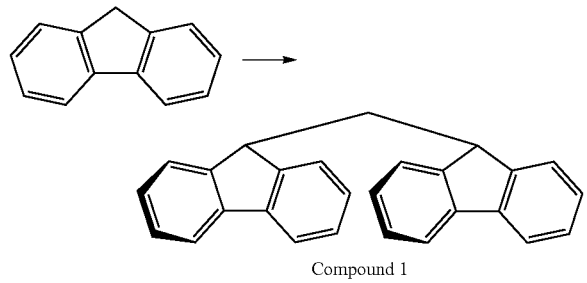

Compound 1

Fluorene (120 g, 722 mmol) and N,N-dimethylformamide (480 ml) were put into a 1 L four-neck flask and after nitrogen purging, cooled to 5° C. or lower. Sodium ethoxide (24.6 g, 361 mmol) was added thereto, and paraformaldehyde (8.7 g, 289 mmol) was added little by little so as not to exceed 10° C., followed by stirring. After 2 hours, 1 N hydrochloric acid (440 ml) was added dropwise to terminate the reaction. The resulting suspended solution was suction-filtered and spray-washed with desalted water (240 ml). Thereafter, the obtained crude product was dispersed in desalted water (240 ml), followed by stirring for one hour, and the resulting suspension was suction-filtered and spray-washed with desalted water (120 ml). The obtained crude product was dispersed in toluene (480 ml) and then dehydrated under heating and refluxing conditions by using a Dean-Stark apparatus. The resulting solution was returned to room temperature (20° C.), then suction-filtered and dried under reduced pressure until reaching constant weight at 80° C. to obtain 80.4 g (yield: 84.5%, HPLC purity: 94.0%) of bis(fluoren-9-yl)methane (Compound 1) as a white solid. The chemical shifts in the $^1$H-NMR spectrum of Compound 1 were as follows.

$^1$H-NMR (400 MHz, CDCl$_3$) δ 7.83 (d, J=7.6 Hz, 4H), 7.56 (dd, J1=7.6 Hz, J2=0.8 Hz, 4H), 7.41 (t, J=7.3 Hz, 4H), 7.29 (dt, J1=7.3 Hz, J2=1.3 Hz, 4H), 4.42 (t, J=7.6 Hz, 2H), 2.24 (d, J=7.6 Hz, 2H).

Synthesis Example 2

Synthesis of bis[9-(2-ethoxycarbonylethyl)fluoren-9-yl]methane (Compound 2)

[Chem. 39]

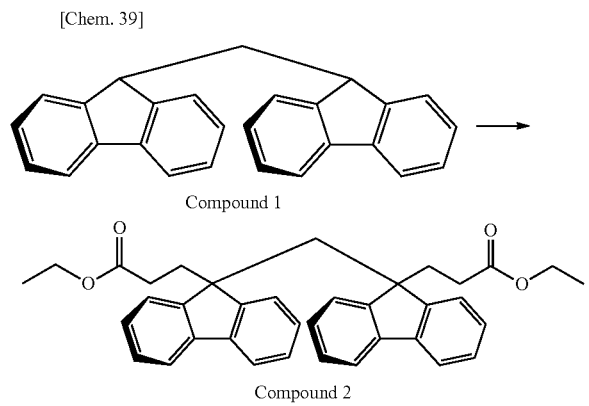

Compound 1

Compound 2

Bis(fluoren-9-yl)methane (Compound 1, 80 g, 232.3 mmol) obtained in Synthesis Example 1, N-benzyl-N,N,N-triethylammonium chloride (10.6 g, 46.5 mmol), and methylene chloride (400 ml) were put in a 1 L three-neck flask and after nitrogen purging, an aqueous 50% sodium hydroxide solution (64 ml) was added while controlling the temperature to from 15° C. to 20° C. on a water bath, as a result, the color of the solution was changed to pale red. Thereafter, ethyl acrylate (50.5 ml, 465 mmol) was added dropwise thereto over 5 minutes. After one hour, ethyl acrylate (25.3 ml, 232 mmol) was further added thereto and while tracking the progress of reaction by HPLC, the solution was stirred for 9 hours. After confirming by HPLC that the proportion of mono-adduct was reduced to 5% or less, the resulting solution was cooled on an ice bath and quenched by adding dropwise 3 N hydrochloric acid (293 ml) correspondingly to the temperature. The organic layer was washed with water until the liquid became neutral, then dried over anhydrous magnesium sulfate and filtered, and the solvent was removed by distillation under reduced pressure. The obtained crude product was dispersed in methanol (400 ml), and the dispersion was heated under reflux for 30 minutes thereby being washed in thermal suspension. Subsequently, the solution was returned to room temperature (20° C.), suction-filtered and dried under reduced pressure until reaching constant weight at 80° C., to thereby obtain 96.1 g (yield: 75.9%, HPLC purity: 96.0%) of bis[9-(2-ethoxycarbonylethyl)fluoren-9-yl]methane (Compound 2) as a white solid. The chemical shifts in the $^1$H-NMR spectrum of Compound 2 were as follows.

$^1$H-NMR (400 MHz, CDCl$_3$) δ 7.03 (d, J=7.6 Hz, 4H), 6.97 (dt, J1=7.6 Hz, J2=1.5 Hz, 4H), 6.82 (dt, J1=7.6 Hz, J2=1.3 Hz, 4H), 6.77 (d, J=7.6 Hz, 4H), 3.88 (q, J=7.1 Hz, 4H), 3.12 (s, 2H), 2.23 (m, 4H), 1.13 (m, 4H), 1.02 (t, J=7.1 Hz, 6H).

The 5 wt % weight loss temperature (in a nitrogen atmosphere) of Compound 2 was 295° C., and the melting point was 141° C.

Synthesis Example 3

Synthesis of bis[9-(2-phenoxycarbonylethyl)fluoren-9-yl]methane (Compound 3)

[Chem. 40]

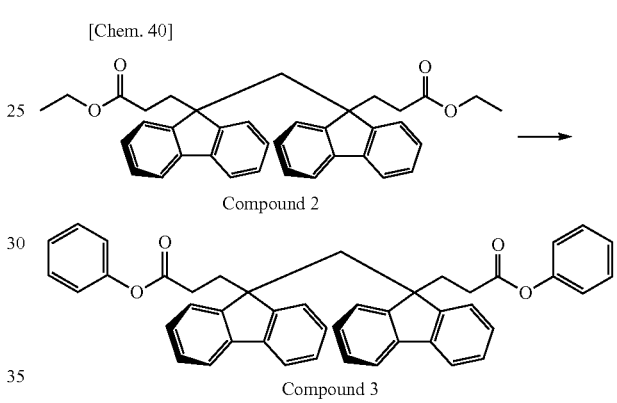

Compound 2

Compound 3

Bis[9-(2-ethoxycarbonylethyl)fluoren-9-yl]methane (Compound 2, 50.0 g, 91.80 mmol) obtained in Synthesis Example 2, diphenyl carbonate (98.3 g, 459 mmol), and tetraisopropyl orthotitanate (1.3 mL, 4.59 mmol) were put in a 1 L four-neck flask, and the degree of reduced pressure was adjusted to 3 kPa, followed by stirring for 6 hours while removing byproducts by distillation at a temperature of from 145° C. to 150° C., and then, cooled to 90° C. After confirming the completion of reaction by HPLC, toluene (100 ml) was added thereto. The resulting solution was cooled to 50° C., and methanol (250 ml) was added thereto. After cooling to 5° C., the solution was suction-filtered. The obtained white solid was dispersed in toluene (100 ml), and the dispersion was heated under reflux for 30 minutes. After cooling to 50° C., methanol (200 ml) was added thereto. The resulting solution was cooled to room temperature (20° C.), suction-filtered and dried under reduced pressure until reaching constant weight at 100° C., to thereby obtain 50 g (yield: 85%, HPLC purity: 98.1%) of bis[9-(2-phenoxycarbonylethyl)fluoren-9-yl]methane (Compound 3) as a white solid. The chemical shifts in the $^1$H-NMR spectrum of Compound 3 were as follows.

$^1$H-NMR (400 MHz, CDCl$_3$) δ 7.23-7.28 (m, 4H), 7.07-7.16 (m, 6H), 7.03 (dt, J1=6.9 Hz, J2=2.0, 4H), 6.78-6.90 (m, 12H), 3.20 (s, 2H), 2.37 (t, J=8.3 Hz, 4H), 1.40 (t, J=8.3 Hz, 4H).

The 5 wt % weight loss temperature (in a nitrogen atmosphere) of Compound 3 was 336° C., and the melting point was 176° C.

Synthesis Example 4

Synthesis of 1,2-bis(fluoren-9-yl)ethane (Compound 4)

[Chem. 41]

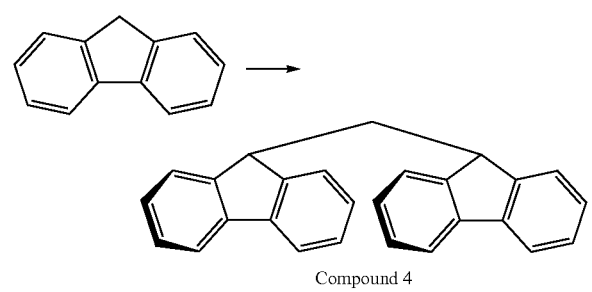

Compound 4

Fluorene (2.0 g, 12 mmol) and tetrahydrofuran (35 ml) were put in a 100 ml four-neck flask and after nitrogen purging, cooled to −50° C. or lower on an ethanol-dry ice bath. Thereto was added 1.6 mol/L of n-butyllithium (7.8 ml, 12.5 mmol) little by little so as not to exceed −40° C., followed by stirring. The temperature was thereafter raised to 10° C., and the solution was stirred for one hour. Thereafter, 1,2-dibromoethane (0.55 ml, 6.4 ml) was added thereto, and the mixture was further stirred for 2 hours. Subsequently, 1 N hydrochloric acid (0.5 ml) was added dropwise, and the resulting suspended solution was suction-filtered, washed with water and dried under reduced pressure until reaching constant weight at 80° C., to thereby obtain 0.63 g (yield: 29.2%, HPLC purity: 98.0%) of 1,2-bis(fluoren-9-yl)ethane (Compound 4) as a white solid. The solvent of the filtrate was removed by distillation under reduced pressure, and ethanol (25 ml) was added thereto, followed by stirring for 30 minutes. The suspension was suction-filtered and dried under reduced pressure until reaching constant weight at 80° C., to thereby obtain 0.44 g (yield: 20.5%, HPLC purity: 84.0%) of 1,2-bis(fluoren-9-yl)ethane (Compound 4) as a white solid. The obtained white solids were combined to amount 1.07 g (yield: 49.7%). The chemical shifts in the $^1$H-NMR spectrum of Compound 4 were as follows.

$^1$H-NMR (400 MHz, CDCl$_3$) δ 7.75 (d, J=7.6 Hz, 4H), 7.37 (dt, J1=7.6 Hz, J2=0.5 Hz, 4H), 7.27-7.34 (m, 8H), 3.85 (s, 2H), 1.74 (t, J=2.3 Hz, 4H).

Synthesis Example 5

Synthesis of 1,2-bis[9-(2-ethoxycarbonylethyl)fluoren-9-yl]ethane (Compound 5)

[Chem. 42]

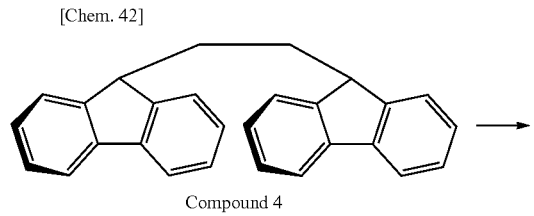

Compound 4

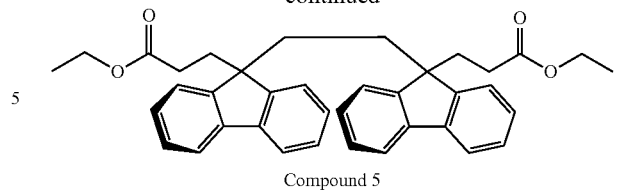

Compound 5

In a 1 L four-neck flask were put 1,2-bis(fluoren-9-yl)ethane (Compound 4, 85 g, 237 mmol) obtained in Synthesis Example 4, tetrahydrofuran (725 ml) and N,N-dimethylformamide (85 ml) and after nitrogen purging, sodium ethoxide (3.23 g, 47.5 mmol) was added thereto. The temperature was raised to room temperature (20° C.), and the mixture was stirred for 30 minutes. Ethyl acrylate (59.3 ml, 545 mmol) was added dropwise over 2.5 hours and after confirming disappearance of raw materials by HPLC, 0.1 N hydrochloric acid (55 ml) was added dropwise to the reaction solution to terminate the reaction. Tetrahydrofuran was removed by distillation under reduced pressure, and toluene (425 ml) was added thereto. The organic layer was washed with purified water until the liquid became neutral, then dried over anhydrous magnesium sulfate and filtered, and the solvent was removed by distillation under reduced pressure. The obtained crude product was dispersed in methanol (400 ml), and the dispersion was heated under reflux for one hour thereby being washed in thermal suspension. Subsequently, the solution was restored to room temperature (20° C.), suction-filtered and dried under reduced pressure until reaching constant weight at 80° C., to thereby obtain 101 g (yield: 76.1%, HPLC purity: 98.6%) of 1,2-bis[9-(2-ethoxycarbonylethyl)fluoren-9-yl]ethane (Compound 5) as a white solid. The chemical shifts in the $^1$H-NMR spectrum of Compound 5 were as follows.

$^1$H-NMR (400 MHz, CDCl$_3$) δ 7.72 (d, J=7.6 Hz, 4H), 7.36 (t, J=7.6 Hz, 4H), 7.27 (t, J=7.3 Hz, 4H), 6.97 (d, J=7.3 Hz, 4H), 3.80 (q, J=7.1 Hz, 4H), 1.93 (t, J=8.6 Hz, 4H), 1.33 (t, J=8.6 Hz, 4H), 1.23 (s, 4H), 1.01 (t, J=7.1 Hz, 6H).

The 5 wt % weight loss temperature (in a nitrogen atmosphere) of Compound 5 was 306° C., and the melting point was 150° C.

Synthesis Example 6

Synthesis of 1,2-bis[9-(2-phenoxycarbonylethyl)fluoren-9-yl]ethane (Compound 6)

[Chem. 43]

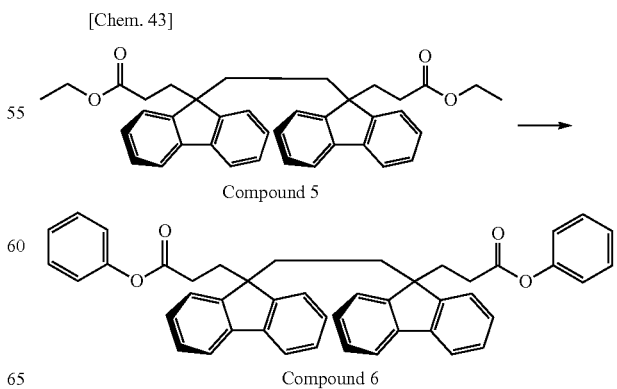

Compound 5

Compound 6

In a 1 L four-neck flask were put 1,2-bis[9-(2-ethoxycarbonylethyl)fluoren-9-yl]ethane (Compound 5, 100.0 g, 179 mmol) obtained in Synthesis Example 5, diphenyl carbonate (115 g, 537 mmol) and tetraisopropyl orthotitanate (2.62 ml, 8.95 mmol) and after nitrogen purging, the temperature was raised to 135° C., followed by stirring for 24 hours. In the middle of the process, diphenyl carbonate (38.3 g, 179 mmol) was additionally added at the time of passing of 12 hours and at the time of passing of 20 hours. After confirming the completion of reaction by HPLC, toluene (400 ml) was added thereto. The resulting solution was heated under reflux for one hour, cooled to room temperature (20° C.) and suction-filtered. The obtained white solid was dispersed in toluene (300 ml), and the dispersion was heated under reflux for one hour. The resulting solution was cooled to room temperature (20° C.), suction-filtered and dried under reduced pressure until reaching constant weight at 80° C., to thereby obtain 82 g (yield: 70.0%, HPLC purity: 98.0%) of 1,2-bis[9-(2-phenoxycarbonylethyl)fluoren-9-yl]ethane (Compound 6) as a white solid. The chemical shifts in the $^1$H-NMR spectrum of Compound 6 were as follows.

$^1$H-NMR (400 MHz, CDCl$_3$) δ 7.76 (d, J=7.6, 4H), 7.41 (dt, J1=7.3, J2=1.0, 4H), 7.32 (dt, J1=7.3, J2=1.0, 4H), 7.22 (t, J=8.3, 4H), 7.11 (t, J=7.6, 2H), 7.03 (d, J=7.6, 4H), 6.78 (d, J=8.6, 4H), 2.06 (t, J=8.1, 4H), 1.60 (t, J=8.1, 4H), 1.29 (s, 4H). The 5 wt % weight loss temperature (in a nitrogen atmosphere) of Compound 6 was 337° C., and the melting point was 232° C.

Synthesis Example 7

Synthesis of bis[9-(3-hydroxypropyl)fluoren-9-yl]methane (Compound 7)

[Chem. 44]

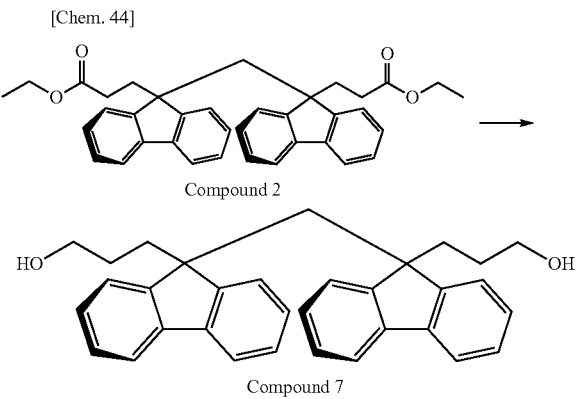

Bis[9-(2-ethoxycarbonylethyl)fluoren-9-yl]methane (Compound 2, 50 g, 91.8 mmol) obtained in Synthesis Example 2 and toluene (250 ml) were put in a 500 ml four-neck flask and after nitrogen purging, the mixture was cooled to 5° C. or lower on an ice bath. A 65 wt % toluene solution of bis(2-methoxyethoxy)aluminum sodium hydride (82.7 ml, 275 mmol) was added dropwise thereto while keeping the temperature at 10° C. or lower, and the resulting solution was stirred for one hour. After confirming disappearance of raw materials by HPLC, ethyl acetate (9.9 ml) was added thereto dropwise, followed by stirring for 30 minutes, and an aqueous 3.1 N sodium hydroxide solution was further added thereto dropwise, followed by stirring for 2 hours. The resulting suspended solution was suction-filtered and spray-washed with desalted water (100 ml). Thereafter, the obtained crude product was dispersed in desalted water (150 ml), followed by stirring for 30 minutes, and the resulting solution was suction-filtered, spray-washed until the liquid became neutral, and further spray-washed with toluene (50 ml). The obtained crude product was dispersed in tetrahydrofuran (150 ml) and dissolved by heating. The tetrahydrofuran solution was returned to room temperature (20° C.), passed through a silica gel short path (50 g) and washed with tetrahydrofuran (350 ml), and the solvent was removed from the resulting solution by distillation under reduced pressure in an evaporator. The obtained crude product was dispersed in toluene (250 ml), and the dispersion was heated under reflux for 30 minutes, thereby being washed in thermal suspension. Subsequently, the solution was returned to room temperature (20° C.), suction-filtered and dried under reduced pressure until reaching constant weight at 80° C., to thereby obtain 35.5 g (yield: 83.9%, HPLC purity: 99.8%) of bis[9-(3-hydroxypropyl)fluoren-9-yl]methane (Compound 7) as a white solid. Both the sodium content and the aluminum content in the solid were less than 1 ppm. The chemical shifts in the $^1$H-NMR spectrum of Compound 7 were as follows.

$^1$H-NMR (400 MHz, CDCl$_3$) δ 7.05 (d, J=7.6 Hz, 4H), 6.97 (dt, J1=7.6 Hz, J2=1.5 Hz, 4H), 6.81 (dt, J1=7.6 Hz, J2=1.3 Hz, 4H), 6.77 (d, J=7.6 Hz, 4H), 3.19 (q, J=6.3 Hz, 4H), 3.08 (s, 2H), 1.94 (m, 4H), 0.77 (t, J=5.8 Hz, 2H), 0.47 (m, 4H).

The 5 wt % weight loss temperature (in a nitrogen atmosphere) of Compound 7 was 301° C., and the melting point was 214° C.

Synthesis Example 8

Synthesis of 1,2-bis[9-(3-hydroxypropyl)fluoren-9-yl]ethane (Compound 8)

[Chem. 45]

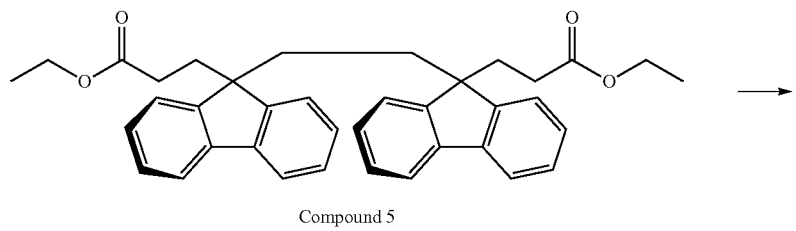

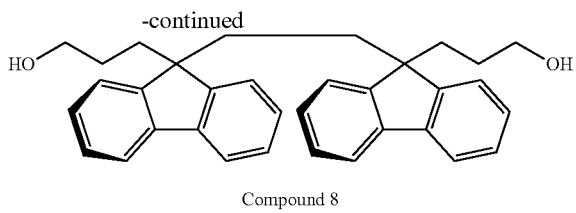

Compound 8

In a 1 L four-neck flask were put 1,2-bis[9-(2-ethoxycarbonylethyl)fluoren-9-yl]ethane (Compound 5, 100 g, 179 mmol) obtained in Synthesis Example 5 and tetrahydrofuran (500 ml) and after nitrogen purging, the mixture was cooled to 5° C. or lower on an ice bath. While keeping the temperature at 15° C. or lower, a 65 wt % toluene solution of bis(2-methoxyethoxy)aluminum sodium hydride (161 ml, 537 mmol) was added thereto dropwise, followed by stirring for one hour. After confirming disappearance of raw materials by HPLC, ethyl acetate (32 ml) was added thereto dropwise, followed by stirring for 45 minutes, and an aqueous 3.1 N sodium hydroxide solution (257 ml) was further added thereto dropwise, followed by stirring for one hour. After removing tetrahydrofuran by distillation under reduced pressure, the resulting suspended solution was suction-filtered and spray-washed with desalted water (100 ml). Subsequently, the obtained crude product was dissolved in ethyl acetate (700 ml) and washed three times with desalted water (100 ml). The organic layer was dried over magnesium sulfate, passed through a silica gel short path (50 g) and washed with tetrahydrofuran (800 ml), and the solvent was removed from the resulting solution by distillation under reduced pressure in an evaporator. The obtained crude product was dispersed in toluene (400 ml), and the dispersion was heated under reflux for 30 minutes, thereby being washed in thermal suspension. The solution was returned to room temperature (20° C.), then suction-filtered and dried under reduced pressure until reaching constant weight at 100° C., to thereby obtain 75.6 g (yield: 89.0%, HPLC purity: 98.7%) of 1,2-bis[9-(3-hydroxypropyl)fluoren-9-yl]ethane (Compound 8) as a white solid. The sodium content in the solid was 2 ppm, and the aluminum content was less than 2 ppm. The chemical shifts in the $^1$H-NMR spectrum of Compound 8 were as follows.

$^1$H-NMR (400 MHz, DMSO-$d_6$) δ 7.81 (d, J=7.3 Hz, 4H), 7.35 (t, J=7.3 Hz, 4H), 7.29 (t, J=7.3 Hz, 4H), 7.02 (d, J=7.3 Hz, 4H), 4.02 (t, J=5.0 Hz, 2H), 2.93 (m, 4H), 1.59 (m, 4H), 1.19 (s, 4H), 0.45 (m, 4H).

The 5 wt % weight loss temperature (in a nitrogen atmosphere) of Compound 8 was 312° C., and the melting point was 253° C.

Synthesis Example 9

Synthesis of bis(9-hydroxymethylfluoren-9-yl)methane (Compound 9)

[Chem. 46]

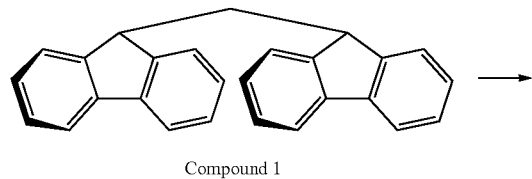

Compound 1

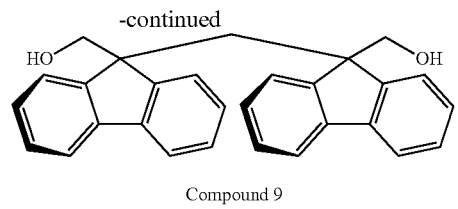

Compound 9

Bis(fluoren-9-yl)methane (Compound 1, 100 g, 290 mmol) obtained in Synthesis Example 1 and N,N-dimethylformamide (400 ml) were put in a 500 mL four-neck flask and after nitrogen purging, paraformaldehyde (18.3 g, 610 mmol) was added thereto. After cooling to 5° C. or lower, sodium ethoxide (0.698 g, 13 mmol) was added thereto, and the mixture was stirred so as not to exceed 10° C. After an hour and a half, 1 N hydrochloric acid (32 ml) was added thereto so as not to exceed 25° C., thereby terminating the reaction. Furthermore, water (300 ml) was added thereto, followed by stirring, and the resulting suspended solution was suction-filtered and spray-washed with desalted water (100 ml). The obtained crude product was dispersed in tetrahydrofuran (400 ml), and the dispersion was heated under reflux for one hour, returned to room temperature (20° C.), suction-filtered, and dried under reduced pressure until reaching constant weight at 80° C., to thereby obtain 108 g (yield: 91%, HPLC purity: 99.1%) of a white solid. The sodium content in the obtained white solid was 620 ppm. Subsequently, the white solid was dispersed in a mixed solution of toluene (800 ml) and water (200 ml), and the dispersion was heated under reflux for one hour, filtered and dried, and the sodium content in the resultant solid was measured and found to be 390 ppm. Furthermore, the obtained white solid was dispersed in N,N-dimethylformamide (500 ml), and the dispersion was heated to make a uniform solution, then cooled to 40° C. or lower, and slowly added dropwise to 0.03 N hydrochloric acid (1,500 ml). The resulting suspended solution was suction-filtered and dispersed in desalted water (200 ml), followed by stirring for one hour. The resulting suspension was suction-filtered and spray-washed with desalted water (100 ml). The obtained product was dispersed in toluene (800 ml), and the dispersion was azeotropically dehydrated under heating and refluxing. The resulting solution was returned to room temperature (20° C.), suction-filtered and dried under reduced pressure until reaching constant weight at 100° C., to thereby obtain 104 g (yield: 87%, HPLC purity: 99.8%) of bis(9-hydroxymethylfluoren-9-yl)methane (Compound 9) as a white solid. The sodium and chlorine contents in the solid were each less than 10 ppm. The chemical shifts in the $^1$H-NMR spectrum of Compound 9 were as follows.

$^1$H-NMR (400 MHz, DMSO-$d_6$) δ 7.12 (d, J=7.3 Hz, 4H), 7.01-6.93 (m, 8H), 6.77 (dt, J1=7.3 Hz, J2=1.0 Hz, 4H), 4.97 (t, J=4.6 Hz, 2H), 3.31 (s, 2H), 3.23 (d, J=4.3 Hz, 4H).

The absorption maximum wavelength $λ_{max}$ in UV-Vis spectrum (solvent: THF) of Compound 9 was present at 263 nm, 292 nm and 304 nm. The 5 wt % weight loss temperature (in a nitrogen atmosphere) of Compound 9 was 289° C., and the melting point was 226° C.

Synthesis Example 10

Synthesis of 1,2-bis(9-hydroxymethylfluoren-9-yl)ethane (Compound 10)

[Chem. 47]

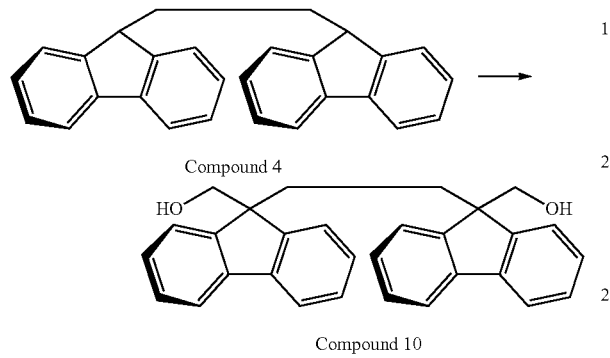

Compound 10

In a 1 L four-neck flask were put 1,2-Bis(fluoren-9-yl)ethane (Compound 4, 100 g, 278.9 mmol) obtained in Synthesis Example 4, paraformaldehyde (17.6 g, 585.8 mmol) and N,N-dimethylformamide (400 ml) and after nitrogen purging, and the mixture was cooled to 10° C. or lower. Sodium ethoxide (1.80 g 27.9 mmol) was added thereto, and the temperature was raised to room temperature (20° C.), followed by stirring for one hour. After confirming disappearance of raw materials by HPLC, the reaction solution was added dropwise to 0.1 N hydrochloric acid (440 ml) to terminate the reaction. The resulting suspended solution was suction-filtered and spray-washed with desalted water (100 ml). The obtained crude product was dispersed in N,N-dimethylformamide (300 ml), followed by stirring for one hour, and the resulting suspension was added dropwise to 0.005 N hydrochloric acid (1,000 ml), followed by stirring for 30 minutes. The resulting solution was suction-filtered, and the obtained crude product was dispersed in desalted water (500 ml), followed by stirring for one hour. The resulting suspension was suction-filtered and spray-washed with desalted water (200 ml). The obtained crude product was dispersed in toluene (500 ml), and the dispersion was dehydrated under heating and refluxing conditions by using a Dean-Stark apparatus. The resulting solution was returned to room temperature (20° C.), then suction-filtered and dried under reduced pressure until reaching constant weight at 100° C., to thereby obtain 112.4 g (yield: 96.3%, HPLC purity: 99.1%) of 1,2-bis(9-hydroxymethylfluoren-9-yl)ethane (Compound 10) as a white solid. The sodium content in the solid was less than 1 ppm. The chemical shifts in the $^1$H-NMR spectrum of Compound 10 were as follows.

$^1$H-NMR (400 MHz, DMSO-d$_6$) δ 7.91 (d, J=7.3 Hz, 4H), 7.44 (dt, J1=7.6 Hz, J2=1.0 Hz, 4H), 7.35 (dt, J1=7.6 Hz, J2=1.0 Hz, 4H), 7.18 (d, J=7.3 Hz, 4H), 4.79 (t, J=5.3 Hz, 2H), 3.18 (d, J=5.3 Hz, 2H), 1.40 (s, 4H).

The absorption maximum wavelength λ$_{max}$ in UV-Vis spectrum (solvent: THF) of Compound 10 was present at 264 nm, 291 nm and 302 nm. The 5 wt % weight loss temperature (in a nitrogen atmosphere) of Compound 10 was 301° C., and the melting point was 278° C.

Synthesis Example 11

Synthesis of 1,4-bis(fluoren-9-yl)butane (Compound 11)

[Chem. 48]

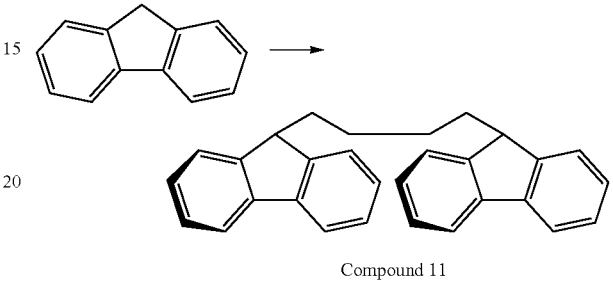

Compound 11

Fluorene (3.5 g, 21 mmol), 1,4-butanediol (4.9 g, 54 mmol), 85% KOH (1.52 g, 23 mmol), and tetraethylene glycol dimethyl ether (4.9 g) were put in a SUS316-made autoclave having a volume of 70 ml and reacted in a nitrogen atmosphere at 250° C. for 8 hours. After cooling, the content was dispersed in tetrahydrofuran and water and neutralized with diluted hydrochloric acid. A precipitated powder was collected by filtration from the resulting suspended solution and washed with water to obtain 1.7 g (yield: 41.9%, HPLC purity: 97.4%) of 1,4-bis(fluoren-9-yl)butane (Compound 11) as a white solid. The chemical shifts in the $^1$H-NMR spectrum of Compound 11 were as follows.

$^1$H-NMR (400 MHz, CDCl$_3$) δ 7.72 (d, J=7.6 Hz, 4H), 7.42 (m, 4H), 7.25-7.36 (m, 8H), 3.89 (t, J=5.8 Hz, 2H), 1.96-1.86 (m, 4H), 1.15-1.05 (m, 4H).

Synthesis Example 12

Synthesis of 1,4-bis(9-hydroxymethylfluoren-9-yl)butane (Compound 12)

[Chem. 49]

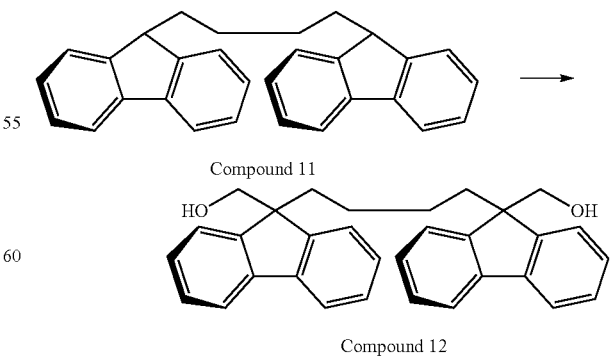

Compound 12

In a 500 mL four-neck flask were put 1,4-bis(fluoren-9-yl)butane (Compound 11, 37.0 g, 95.7 mmol) obtained in Synthesis Example 11, paraformaldehyde (6.03 g, 201 mmol) and N,N-dimethylformamide (148 ml), and after nitrogen purging, the mixture was cooled to 10° C. or lower. Sodium ethoxide (0.65 g, 9.6 mmol) was added thereto, and the temperature was raised to room temperature (20° C.), followed by stirring for one hour. After confirming disappearance of raw materials by HPLC, the reaction solution was added dropwise to 0.1 N hydrochloric acid (162 ml) to terminate the reaction. The resulting suspended solution was suction-filtered and spray-washed with desalted water (37 ml). The obtained crude product was dispersed in toluene (185 ml), and the dispersion was dehydrated under heating and refluxing conditions by using a Dean-Stark apparatus. The resulting solution was returned to room temperature (20° C.), then suction-filtered and dried under reduced pressure until reaching constant weight at 80° C., to thereby obtain 39.8 g (yield: 93.1%, HPLC purity: 99.1%) of 1,4-bis(9-hydroxymethylfluoren-9-yl)butane (Compound 12) as a white solid. The chemical shifts in the $^1$H-NMR spectrum of Compound 12 were as follows.

$^1$H-NMR (400 MHz, DMSO-d$_6$) δ 7.71-7.66 (m, 4H), 7.38-7.24 (m, 4H), 3.71 (d, J=6.3 Hz, 4H), 1.89-1.81 (m, 4H), 1.22 (t, J=6.3 Hz, 2H), 0.51-0.44 (m, 4H).

The absorption maximum wavelength $\lambda_{max}$ in UV-Vis spectrum (solvent: THF) of Compound 12 was present at 291 nm and 302 nm. The 5 wt % weight loss temperature (in a nitrogen atmosphere) of Compound 12 was 314° C., and the melting point was 212° C.

Synthesis Example 13

Synthesis of α,α'-bis-(9-hydroxymethylfluoren-9-yl)-1,4-xylene (Compound 13)

[Chem. 50]

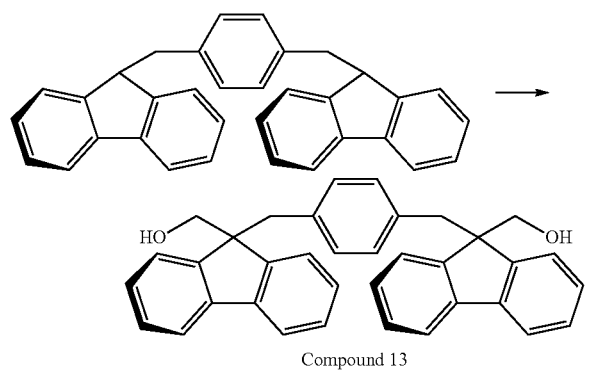

Compound 13

α,α'-Bis-(fluoren-9-yl)-1,4-xylene (130 g, 0.3 mol), paraformaldehyde (18.9 g, 0.63 mol) and N,N-dimethylformamide (520 ml) were put in a 1 L four-neck eggplant flask and after nitrogen purging, sodium ethoxide (2.04 g, 0.03 mol) was added thereto, followed by stirring at room temperature (20° C.) for one hour. To a 1 L beaker in which 520 ml of desalted water and 1 N hydrochloric acid (45 ml) were put and stirred, the reaction liquid was added to quench the reaction. The obtained crystal was suction-filtered and spray-washed with desalted water (100 ml). The obtained crude product was dispersed in desalted water (500 ml), and the dispersion was suction-filtered and spray-washed with desalted water (100 ml). The obtained crude product was dispersed in toluene (500 ml) and dehydrated under heating and refluxing conditions by using a Dean-Stark apparatus. The resulting solution was returned to room temperature (20° C.), suction-filtered and dried under reduced pressure until reaching constant weight at 70° C., to thereby obtain 130 g (yield: 87%, HPLC purity: 97.6%) of α,α'-bis-(9-hydroxymethylfluoren-9-yl)-1,4-xylene (Compound 13) as a white solid. The chemical shifts in the $^1$H-NMR spectrum of Compound 13 were as follows.

$^1$H-NMR (400 MHz, CDCl$_3$) δ 7.62 (d, J=7.6 Hz, 4H), 7.33 (t, J=8.0 Hz, 4H), 7.25 (t, J=6.0 Hz, 4H), 7.19 (br, 4H), 6.45 (s, 4H), 3.80 (d, J=6.4 Hz, 4H), 3.12 (s, 4H), 1.42 (t, J=6.4 Hz, 2H).

The 5 wt % weight loss temperature (in a nitrogen atmosphere) of Compound 13 was 327° C., and the melting point was 198° C.

Synthesis Example 14

Synthesis of 1,2-bis(9-hydroxyfluoren-9-yl)ethane (Compound 14)

[Chem. 51]

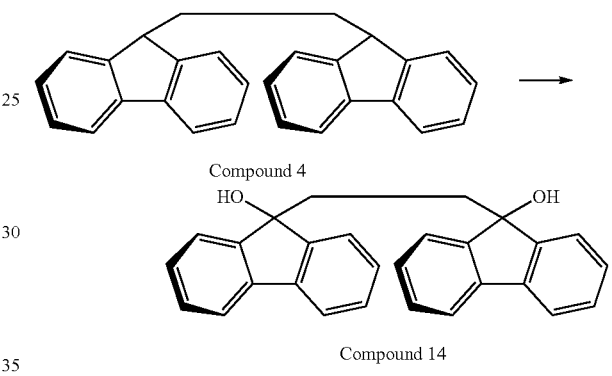

Compound 14

In a 1 L four-neck flask were put 1,2-bis(fluoren-9-yl)ethane (Compound 4, 20 g, 59 mmol) obtained by the method of Synthesis Example 4 and N,N-dimethylformamide (200 ml), and tributyl phosphite (37.9 ml, 140 mmol) was added thereto. After nitrogen purging, benzyltrimethylammonium hydroxide (a 40% methanol solution) (25 ml) was added thereto, and a mixed gas of air (100 ml/min) and nitrogen (300 ml/min) was flowed through the reaction system. After stirring for 3 hours, benzyltrimethylammonium hydroxide (a 40% methanol solution) (10 ml) was added thereto, followed by stirring for 5 hours, and benzyltrimethylammonium hydroxide (a 40% methanol solution) (10 ml) was further added, followed by stirring for another one hour. After adding 1 N hydrochloric acid (200 ml) to terminate the reaction, ethyl acetate (400 ml) was added thereto and a liquid separation operation was performed. The organic layer was washed three times with saturated saline (100 ml). The organic layer was dried over magnesium sulfate and then filtered, and the organic solvent was removed by distillation under reduced pressure. Toluene (100 ml) and hexane (200 ml) were added to the resulting suspended solution, followed by stirring for 30 minutes, and the resulting solution was suction-filtered and dried under reduced pressure until reaching constant weight at 80° C., to thereby obtain 13.9 g (yield: 63.8%, HPLC purity: 92.5%) of 1,2-bis(9-hydroxyfluoren-9-yl)ethane (Compound 14) as a white solid. The chemical shifts in the $^1$H-NMR spectrum of Compound 14 were as follows.

$^1$H-NMR (400 MHz, CDCl$_3$) δ 7.73 (d, J=7.3 Hz, 4H), 7.35 (dt, J1=7.6 Hz, J2=1.0, 6H), 7.26 (dt, J1=7.6 Hz, J2=1.0, 4H), 7.11 (d, J=7.3 Hz, 4H), 5.35 (s, 2H), 1.40 (s, 4H).

Synthesis Example 15

Synthesis of bis-{[4-(2-hydroxyethoxyl)phenyl]fluoren-9-yl}ethane (Compound 15)

[Chem. 52]

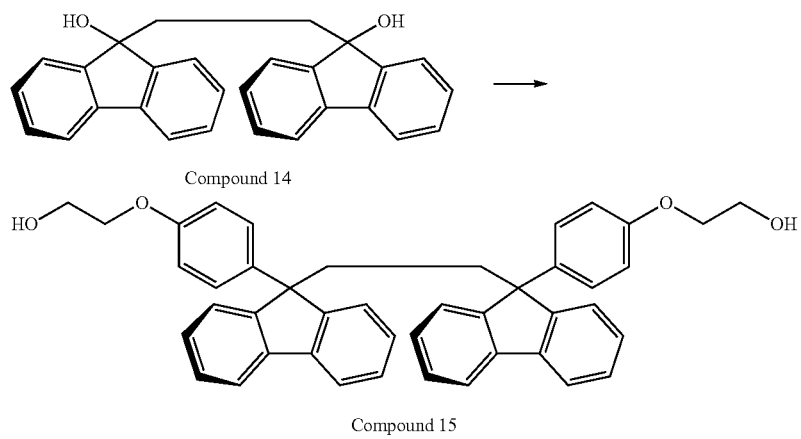

In a 300 ml four-neck flask were put 1,2-bis(9-hydroxyfluoren-9-yl)ethane (Compound 14, 17 g, 45 mmol) obtained in Synthesis Example 4 and phenoxyethanol (37 g, 267 mmol) and after nitrogen purging, the mixture was cooled to 10° C. or lower. Boron trifluoride-diethyl ether complex (5.6 ml, 45 mmol) was added thereto, followed by stirring at room temperature (20° C.) for 3 hours, and boron trifluoride-diethyl ether complex (5.6 ml, 45 mmol) and chloroform (35 ml) were further added thereto, followed by stirring at 40° C. for 4 hours and at 60° C. for 2 hours. Furthermore, boron trifluoride-diethyl ether complex (5.6 ml, 45 mmol) was added thereto, and the mixture was heated under reflux for 2 hours. After cooling to room temperature (20° C.), the resulting solution was neutralized with an aqueous saturated sodium hydrogencarbonate solution and then suction-filtered to remove insoluble matters. Ethyl acetate (120 ml) was added thereto and the organic layer was washed twice with saturated saline and once with desalted water, dried over magnesium sulfate and filtered, and the organic solvent was removed by distillation under reduced pressure. The residue was again dissolved in ethyl acetate (150 ml), and active carbon (SXPLUS of Norit Japan Co., Ltd., pH=7, 2.5 g) was added thereto, followed by stirring for one hour. The resulting solution was filtered through celite, and the organic solvent was removed by distillation under reduced pressure. Methanol (100 ml) was added thereto, followed by stirring for one hour, and the resulting solution was suction-filtered and dried under reduced pressure until reaching constant weight at 80° C., to thereby obtain 15.8 g (yield: 56.1%, HPLC purity: 86%) of bis-{[4-(2-hydroxyethoxyl)phenyl]fluoren-9-yl}ethane (Compound 15) as a white solid. The chemical shifts in the $^1$H-NMR spectrum of Compound 15 were as follows.

$^1$H-NMR (400 MHz, CDCl$_3$) δ 7.77 (d, J=7.3 Hz, 4H), 7.36 (dt, J1=7.6 Hz, J2=1.0, 4H), 7.22 (dt, J1=Hz, J2=1.0, 4H), 6.92 (d, J=7.6 Hz, 4H), 6.73 (d, J=9.1 Hz, 4H), 6.59 (d, J=9.1 Hz, 4H), 3.91-3.93 (m, 4H), 3.83-3.87 (m, 4H), 1.92 (t, J=6.3 Hz, 2H), 1.82 (s, 4H).

Synthesis Example 16

Synthesis of fluorene-9,9-diethanol (Compound 16)

[Chem. 53]

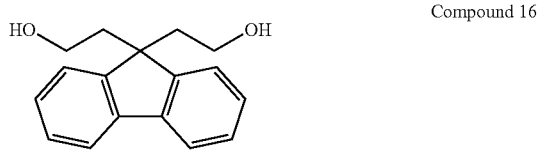

Compound 16

This compound was synthesized according to the method described in JP-A 2010-261008

<Synthesis Example and Characteristic Evaluation of Resin>

Abbreviations or the like of the compounds used in Examples and Comparative Examples below are as follows.

BHEPF: 9,9-bis[4-(2-hydroxyethoxyl)phenyl]-fluorene (produced by Osaka Gas Chemicals Co., Ltd.)

BCF: 9,9-bis[4-hydroxy-3-methylphenyl]-fluorene (produced by Osaka Gas Chemicals Co., Ltd.)

DPC: diphenyl carbonate (produced by Mitsubishi Chemical Corporation)

ISB: isosorbide (produced by Roquette Freres, trade name: POLYSORB)

CHDM: 1,4-cyclohexanedimethanol (a mixture of cis and trans, produced by SK Chemicals Ltd.)

TCDDM: tricyclodecanedimethanol (produced by Oxea)

SPG: spiroglycol (produced by Mitsubishi Gas Chemical Industries Ltd.)

BPA: 2,2-bis[4-hydroxyphenyl]propane (produced by Mitsubishi Chemical Corporation)

PEG: polyethylene glycol, number-average molecular weight: 1,000 (produced by Sanyo Chemical Industries, Ltd.)

CHDA: 1,4-cyclohexanedicarboxylic acid (a mixture of cis and trans, produced by Eastman Chemical)

Example 1

Into a reaction apparatus were charged 38.06 parts by mass (0.059 mol) of bis[9-(2-phenoxycarbonylethyl)fluoren-9-yl]methane (Compound 3), 53.73 parts by mass (0.368 mol) of ISB, 9.64 parts by mass (0.067 mol) of CHDM, 81.28 parts by mass (0.379 mol) of DPC, and as a catalyst, $3.83\times10^{-4}$ parts by mass ($2.17\times10^{-6}$ mol) of calcium acetate monohydrate, and the inside of the reaction apparatus was purged with nitrogen under reduced pressure. The raw materials were dissolved under stirring at 150° C. for about 10 minutes in a nitrogen atmosphere. As the process in the first stage of reaction, the temperature was raised to 220° C. over 30 minutes, and the reaction was allowed to proceed at ordinary pressure for 60 minutes. Next, the pressure was reduced to 13.3 kPa from ordinary pressure over 90 minutes and kept at 13.3 kPa for 30 minutes to withdraw the generated phenol to the outside of the reaction system. Subsequently, as the process in the second stage of reaction, while raising the heat medium temperature to 240° C. over 15 minutes, the pressure was reduced to 0.10 kPa or less over 15 minutes to withdraw the generated phenol to the outside of the reaction system. After reaching a predetermined stirring torque, the pressure was returned with nitrogen to ordinary pressure to terminate the reaction, and the produced polyester carbonate was extruded into water to form a strand and cut to obtain a pellet. By using the obtained polyester carbonate pellet, various evaluations described above were performed. The evaluation results are shown in Table 1.

In the polyester carbonate of Example 1, the content of an oligofluorene structural unit derived from Compound 3 was small as 27.0% by mass, but since the wavelength dispersion (R450/R550) of the retardation film was 0.83, it can be understood that this film has very strong reverse wavelength dispersion property. Furthermore, in the polyester carbonate of Example 1, the photoelastic coefficient was low, and the glass transition temperature was 143° C., demonstrating that the balance between melt processability and heat resistance is excellent.

Example 2

A pellet of polyester carbonate was obtained by performing the synthesis in the same manner as in Example 1 except that 45.69 parts by mass (0.070 mol) of 1,2-bis[9-(2-phenoxycarbonylethyl)fluoren-9-yl]ethane (Compound 6), 43.13 parts by mass (0.295 mol) of ISB, 15.64 parts by mass (0.108 mol) of CHDM, 72.36 parts by mass (0.338 mol) of DPC, and $3.55\times10^{-4}$ parts by mass ($2.02\times10^{-6}$ mol) of calcium acetate monohydrate were used. By using the obtained polyester carbonate pellet, various evaluations described above were performed. The evaluation results are shown in Table 1.

The polyester carbonate of Example 2 also has very strong reverse wavelength dispersion property and has a low photoelastic coefficient and excellent optical properties, but the performance is slightly inferior to that of Example 1.

Example 3

A pellet of polycarbonate was obtained by performing the synthesis in the same manner as in Example 1 except that 35.02 parts by mass (0.076 mol) of bis[9-(3-hydroxypropyl)fluoren-9-yl]methane (Compound 7), 40.75 parts by mass (0.279 mol) of ISB, 12.71 parts by mass (0.088 mol) of CHDM, 95.85 parts by mass (0.447 mol) of DPC, and $3.90\times10^{-4}$ parts by mass ($2.22\times10^{-6}$ mol) of calcium acetate monohydrate were used. By using the obtained polycarbonate pellet, various evaluations described above were performed. The evaluation results are shown in Table 1.

It can be understood that the polycarbonate of Example 3 has sufficiently high reverse wavelength dispersion property, though this is slightly weak as compared with Example 1 or Example 2.

Example 4

A pellet of polycarbonate was obtained by performing the synthesis in the same manner as in Example 1 except that 37.92 parts by mass (0.080 mol) of 1,2-bis[9-(3-hydroxypropyl)fluoren-9-yl]ethane (Compound 8), 42.45 parts by mass (0.290 mol) of ISB, 8.47 parts by mass (0.059 mol) of CHDM, 92.84 parts by mass (0.433 mol) of DPC, and $3.78\times10^{-4}$ parts by mass ($2.15\times10^{-6}$ mol) of calcium acetate monohydrate were used. By using the obtained polycarbonate pellet, various evaluations described above were performed. The evaluation results are shown in Table 1.

It can be understood that the polycarbonate of Example 4 has reverse wavelength dispersion property, though this is slightly weak as compared with Examples 1 to 3. In addition, in the polycarbonate of Example 4, the photoelastic coefficient was slightly high as compared with Examples 1 to 3.

Example 5

Polymerization was performed by charging all monomers and catalyst at a time in the same manner as in Example 1 by using bis[9-(2-ethoxycarbonylethyl)fluoren-9-yl]methane (Compound 2), ISB, CHDM, and DPC, but a polymer could not be obtained under the reaction conditions of Example 1 and therefore, the polymerization was performed by changing the reaction conditions as follows.

Into a reaction apparatus were charged 32.34 parts by mass (0.059 mol) of bis[9-(2-ethoxycarbonylethyl)fluoren-9-yl]methane (Compound 2), 15.41 parts by mass (0.107 mol) of CHDM, and as a catalyst, $1.48\times10^{-2}$ parts by mass ($4.35\times10^{-5}$ mol) of tetra-n-butyl titanate, and the inside of the reaction apparatus was purged with nitrogen under reduced pressure. The reaction was allowed to proceed at 220° C. for 120 minutes at ordinary pressure in a nitrogen atmosphere, and the pressure was then reduced to 13.3 kPa over 30 minutes and kept at 13.3 kPa for 30 minutes to withdraw the generated ethanol to the outside of the reaction system. Subsequently, the reaction solution was once cooled to room temperature (20° C.), and 47.95 parts by mass (0.328 mol) of ISB and 81.40 parts by mass (0.380 mol) of DPC were additionally charged. After the inside of the reaction apparatus was purged with nitrogen under reduced pressure, in the nitrogen atmosphere, the raw materials were dissolved at 150° C., under stirring as necessary (about 10 minutes). After the dissolution, as the process in the first stage of reaction, the temperature was raised to 220° C. over 30 minutes, and the reaction was allowed to proceed at ordinary pressure for 60 minutes. Next, the pressure was reduced to 13.3 kPa from ordinary pressure over 90 minutes and kept at 13.3 kPa for 30 minutes to withdraw the generated phenol to the outside of the reaction system. Subsequently, as the process in the second stage of reaction, while raising the heating bath temperature to 240° C. over 15 minutes, the pressure was reduced to 0.10 kPa or less over 15 minutes to withdraw the generated phenol to the outside of the reaction system. After reaching a predetermined stirring torque, the pressure was returned with nitrogen to ordinary pressure to terminate the reaction, and the produced polyester carbonate was extruded into water to obtain a pellet. By using the obtained polyester carbonate pellet, various evaluations described above were performed. The evaluation results are shown in Table 1.

The oligofluorene structural unit derived from Compound 2 contained in the resin of this Example is equivalent to the oligofluorene structural unit derived from Compound 3 in the resin of Example 1. Consequently, the optical performance of the obtained polyester carbonate was very excellent. However, as described above, the polymerization reaction needs to be performed separately in two stages, there is a drawback in the productivity in industrial production.

Example 6

Into a reaction apparatus were charged 48.74 parts by mass (0.089 mol) of bis[9-(2-ethoxycarbonylethyl)fluoren-9-yl]methane (Compound 2), 37.43 parts by mass (0.260 mol) of CHDM, 28.62 parts by mass (0.166 mol) of CHDA, and as a catalyst, $8.70 \times 10^{-3}$ parts by mass ($2.56 \times 10^{-5}$ mol) of tetra-n-butyl titanate, and the inside of the reaction apparatus was purged with nitrogen under reduced pressure. The raw materials were dissolved under stirring at 150° C. for about 10 minutes in a nitrogen atmosphere. As the process in the first stage of reaction, the temperature was raised to 220° C. over 30 minutes, and the reaction was allowed to proceed at ordinary pressure for 180 minutes. The generated water and ethanol were withdrawn to the outside of the reaction system. Subsequently, as the process in the second stage of reaction, while raising the heat medium temperature to 240° C. over 30 minutes, the pressure was reduced to 13.3 kPa or less over 30 minutes. Furthermore, the pressure was reduced to 0.10 kPa or less over 15 minutes to withdraw the generated water and ethanol to the outside of the reaction system. After reaching a predetermined stirring torque, the pressure was returned with nitrogen to ordinary pressure to terminate the reaction, and the produced polyester was extruded into water to form a strand and cut to obtain a pellet. By using the obtained polyester pellet, various evaluations described above were performed. The evaluation results are shown in Table 1.

The polyester using Compound 2 could be easily obtained under ordinary reaction conditions. The resin of this Example has very strong reverse wavelength dispersion property, but the glass transition temperature (Tg) is slightly low as compared with the resins of Examples 1 to 5, and the durability or reliability under use environment is concerned about.

Comparative Example 1

A pellet of polycarbonate was obtained by performing the synthesis in the same manner as in Example 1 except that 28.19 parts by mass (0.070 mol) of bis(9-hydroxymethyl-fluoren-9-yl)methane (Compound 9), 42.45 parts by mass (0.290 mol) of ISB, 16.95 parts by mass (0.118 mol) of CHDM, 103.35 parts by mass (0.482 mol) of DPC, and $1.68 \times 10^{-3}$ parts by mass ($9.55 \times 10^{-6}$ mol) of calcium acetate monohydrate were used. By using the obtained polycarbonate pellet, various evaluations described above were performed. The evaluation results are shown in Table 2.

Compound 9 is a compound into which the same oligofluorene structural unit as the fluorene-based monomer used in Examples 1 to 6 can be introduced, but the polycarbonate using Compound 9 unexpectedly did not exhibit reverse wavelength property. This is presumed to be caused because fluorene rings of Compound 9 are not oriented in a direction perpendicular to the stretching direction.

Comparative Example 2

A pellet of polycarbonate was obtained by performing the synthesis in the same manner as in Example 1 except that 47.08 parts by mass (0.112 mol) of 1,2-bis(9-hydroxymethylfluoren-9-yl)ethane (Compound 10), 29.71 parts by mass (0.203 mol) of ISB, 12.71 parts by mass (0.088 mol) of CHDM, 87.40 parts by mass (0.408 mol) of DPC, and $7.12 \times 10^{-4}$ parts by mass ($4.04 \times 10^{-6}$ mol) of calcium acetate monohydrate were used. By using the obtained polycarbonate pellet, various evaluations described above were performed. The evaluation results are shown in Table 2.

The resin of this Example did not exhibit reverse wavelength dispersion property, similarly to Comparative Example 1.

Comparative Example 3

A pellet of polycarbonate was obtained by performing the synthesis in the same manner as in Example 1 except that 32.13 parts by mass (0.072 mol) of 1,4-bis(9-hydroxymethylfluoren-9-yl)butane (Compound 12), 43.30 parts by mass (0.296 mol) of ISB, 12.71 parts by mass (0.088 mol) of CHDM, 98.74 parts by mass (0.461 mol) of DPC, and $8.04 \times 10^{-4}$ parts by mass ($4.56 \times 10^{-6}$ mol) of calcium acetate monohydrate were used. By using the obtained polycarbonate pellet, various evaluations described above were performed. The evaluation results are shown in Table 2.

The resin of this Example did not exhibit reverse wavelength dispersion property, similarly to Comparative Example 1.

Comparative Example 4

A pellet of polyester was obtained by performing the synthesis in the same manner as in Example 6 except that 33.85 parts by mass (0.084 mol) of bis(9-hydroxymethyl-fluoren-9-yl)methane (Compound 9), 28.97 parts by mass (0.201 mol) of CHDM, 48.03 parts by mass (0.279 mol) of CHDA, and as a catalyst $9.49 \times 10^{-3}$ parts by mass ($2.79 \times 10^{-5}$ mol) of tetra-n-butyl titanate were used. By using the obtained polyester pellet, various evaluations described above were performed. The evaluation results are shown in Table 2.

The resin of this Example could be easily synthesized under ordinary reaction conditions but did not exhibit reverse wavelength dispersion property.

Comparative Example 5

A pellet of polycarbonate was obtained by performing the synthesis in the same manner as in Example 1 except that 38.00 parts by mass (0.077 mol) of α,α'-bis-(9-hydroxymethylfluoren-9-yl)-1,4-xylene (Compound 13), 33.96 parts by mass (0.232 mol) of ISB, 16.95 parts by mass (0.118 mol) of CHDM, 92.32 parts by mass (0.431 mol) of DPC, and $7.52 \times 10^{-4}$ parts by mass ($4.27 \times 10^{-6}$ mol) of calcium acetate monohydrate were used. By using the obtained polycarbonate pellet, various evaluations described above were performed. The evaluation results are shown in Table 2.

The resin of this Example did not exhibit reverse wavelength dispersion property, similarly to Comparative Example 1.

From the results of Comparative Examples 1 to 5, the distance between a carbonyl group contained in a carbonate group or an ester group and a fluorene ring is considered to affect presence or absence of reverse wavelength dispersion property. It is presumed that in the case where the distance between a carbonyl group and a fluorene ring is too close, fluorene rings cannot be oriented in a preferable direction due to steric hindrance of the carbonyl group and the reverse wavelength dispersion property is not developed.

Comparative Example 6

A pellet of polycarbonate was obtained by performing the synthesis in the same manner as in Example 1 except that 37.46 parts by mass (0.059 mol) of bis-{[4-(2-hydroxyethoxyl)phenyl]fluoren-9-yl}ethane (Compound 15), 39.05 parts by mass (0.267 mol) of ISB, 12.71 parts by mass (0.088 mol) of CHDM, 89.73 parts by mass (0.419 mol) of DPC, and $7.31 \times 10^{-4}$ parts by mass ($4.15 \times 10^{-6}$ mol) of calcium acetate monohydrate were used. By using the obtained polycarbonate pellet, various evaluations described above were performed. The evaluation results are shown in Table 2.

The resin of this Example had a value of wavelength dispersion (R450/R550) close to 1, and had flat wavelength dispersion property. It is presumed that if the amount of a structural unit derived from Compound 15 in the resin of this Example is increased, reverse wavelength dispersion property is exhibited.

Comparative Example 7

A pellet of polycarbonate was obtained by performing the synthesis in the same manner as in Example 1 except that 32.66 parts by mass (0.128 mol) of fluorene-9,9-diethanol (Compound 16), 54.34 parts by mass (0.372 mol) of ISB, 109.30 parts by mass (0.510 mol) of DPC, and $1.32 \times 10^{-3}$ parts by mass ($7.50 \times 10^{-6}$ mol) of calcium acetate monohydrate were used. By using the obtained polycarbonate pellet, various evaluations described above were performed. The evaluation results are shown in Table 2.

The resin of this Example exhibited reverse wavelength dispersion property, but as compared with Examples 1, 2 or the like, the reverse wavelength dispersion property was slightly weak, and the photoelastic coefficient was also slightly high. In this Example, foaming of the resin during polymerization or melt film production was somewhat increased, and the thermal stability seemed poor.

Comparative Example 8

A pellet of polyester carbonate was obtained by performing the synthesis in the same manner as in Example 1 except that 70.48 parts by mass (0.110 mol) of bis[9-(2-phenoxycarbonylethyl)fluoren-9-yl]methane (Compound 3), 34.90 parts by mass (0.239 mol) of ISB, 10.14 parts by mass (0.070 mol) of CHDM, 43.33 parts by mass (0.202 mol) of DPC, and as a catalyst, $2.72 \times 10^{-4}$ parts by mass ($1.55 \times 10^{6}$ mol) of calcium acetate monohydrate were used. By using the obtained polyester carbonate pellet, various evaluations described above were performed. The evaluation results are shown in Table 2.

The retardation film composed of the resin of this Example exhibited negative refractive index anisotropy. In order to obtain a retardation film exhibiting positive refractive index anisotropy and also exhibiting reverse wavelength dispersion property, the content of an oligofluorene structural unit needs to be adjusted to an appropriate range.

Comparative Example 9

A pellet of polyester was obtained by performing the synthesis in the same manner as in Example 6 except that 59.91 parts by mass (0.110 mol) of bis[9-(2-ethoxycarbonylethyl)fluoren-9-yl]methane (Compound 2), 34.04 parts by mass (0.236 mol) of CHDM, 21.10 parts by mass (0.123 mol) of CHDA, and $7.91 \times 10^{3}$ parts by mass ($2.33 \times 10^{-5}$ mol) of tetra-n-butyl titanate were used. By using the obtained polyester pellet, various evaluations described above were performed. The evaluation results are shown in Table 2.

The retardation film composed of the resin of this Example exhibited negative refractive index anisotropy, similarly to Comparative Example 8.

Comparative Example 10

A pellet of polycarbonate was obtained by performing the synthesis in the same manner as in Example 1 except that 68.07 parts by mass (0.155 mol) of BHEPF, 22.84 parts by mass (0.156 mol) of ISB, 0.97 parts by mass ($9.75 \times 10^{-4}$ mol) of PEG, 67.60 parts by mass (0.316 mol) of DPC, and $5.36 \times 10^{-4}$ parts by mass ($2.50 \times 10^{-6}$ mol) of magnesium acetate tetrahydrate were used. By using the obtained polycarbonate pellet, various evaluations described above were performed. The evaluation results are shown in Table 2.

In the resin of this Example, as a very large amount of a BHEPF-derived structural unit as 67.8% by mass was required so as to achieve reverse wavelength dispersion property equal to that in Example 1 or the like. It is understood from this that the BHEPF-derived structural unit is less likely to develop reverse wavelength dispersion property as compared with the above-described oligofluorene structural unit. The value of photoelastic coefficient was also high.

Comparative Example 11

A pellet of polycarbonate was obtained by performing the synthesis in the same manner as in Example 1 except that 41.17 parts by mass (0.109 mol) of BCF, 51.59 parts by mass (0.170 mol) of SPG, 63.19 parts by mass (0.295 mol) of DPC, and $4.90 \times 10^{3}$ parts by mass ($2.78 \times 10^{-5}$ mol) of calcium acetate monohydrate were used and the final polymerization temperature was changed to 260° C. By using the obtained polycarbonate pellet, various evaluations described above were performed. The evaluation results are shown in Table 2.

The resin of this Example exhibited relatively excellent optical properties, but the obtained film was very brittle and readily broken.

TABLE 1

| | | | Example 1 | Example 2 | Example 3 | Example 4 | Example 5 | Example 6 |
|---|---|---|---|---|---|---|---|---|
| Resin | Fluorene-based monomer | — | Compound 3 | Compound 6 | Compound 7 | Compound 8 | Compound 2 | Compound 2 |
| | | % by mol | 6.8 | 8.6 | 8.6 | 9.3 | 6.8 | 17.5 |
| | DPC | % by mol | 43.2 | 41.4 | 50.0 | 50.0 | 43.2 | — |
| | CHDA | % by mol | — | — | — | — | — | 32.5 |
| | ISB | % by mol | 42.3 | 36.6 | 31.5 | 33.8 | 37.7 | — |
| | CHDM | % by mol | 7.7 | 13.4 | 9.9 | 6.8 | 12.3 | 50.0 |
| | PEG | % by mol | — | — | — | — | — | — |
| | SPG | % by mol | — | — | — | — | — | — |
| | Content of structural unit derived from fluorene-based monomer | % by mass | 27.0 | 32.7 | 34.9 | 37.8 | 27.0 | 40.7 |
| | Reduced viscosity | dL/g | 0.473 | 0.495 | 0.415 | 0.398 | 0.488 | 0.562 |
| | Melt viscosity | Pa·s | 2910 | 2700 | 2760 | 2650 | 3090 | 2010 |
| | Glass transition temperature (Tg) | °C. | 143 | 134 | 125 | 137 | 129 | 94 |
| Unstretched film | Refractive index at 656 nm ($n_C$) | — | 1.5394 | 1.5443 | 1.5499 | 1.5462 | 1.5392 | 1.5567 |
| | Refractive index at 589 nm ($n_D$) | — | 1.5439 | 1.5489 | 1.5545 | 1.5547 | 1.5434 | 1.5611 |
| | Refractive index at 486 nm ($n_F$) | — | 1.5523 | 1.5600 | 1.5659 | 1.5616 | 1.5534 | 1.5731 |
| | Abbe number ($\nu_D$) | — | 42 | 35 | 35 | 36 | 38 | 34 |
| | Photoelastic coefficient | $\times 10^{-12}$ $Pa^{-1}$ | 16 | 22 | 18 | 24 | 18 | 28 |
| | Water absorption percentage | % | 1.9 | 1.8 | 1.7 | 1.8 | 1.8 | 0.5 |
| | Bending test | — | A | A | A | A | A | A |
| Retardation film | Refractive index anisotropy | — | positive | positive | positive | positive | positive | positive |
| | Wavelength dispersion (R450/R550) | — | 0.83 | 0.83 | 0.92 | 0.97 | 0.89 | 0.36 |

TABLE 2

| | | | Comp. Ex. 1 | Comp. Ex. 2 | Comp. Ex. 3 | Comp. Ex. 4 | Comp. Ex. 5 | Comp. Ex. 6 |
|---|---|---|---|---|---|---|---|---|
| Resin | Fluorene-based monomer | — | Comp. 9 | Comp. 10 | Comp. 12 | Comp. 9 | Comp. 13 | Comp. 15 |
| | | % by mol | 7.3 | 13.9 | 7.9 | 15.0 | 9.0 | 7.2 |
| | DPC | % by mol | 50.0 | 50.0 | 50.0 | — | 50.0 | 50.0 |
| | CHDA | % by mol | — | — | — | 50.0 | — | — |
| | ISB | % by mol | 30.4 | 25.2 | 32.5 | — | 27.2 | 32.2 |
| | CHDM | % by mol | 12.3 | 10.9 | 9.7 | 35.0 | 13.8 | 10.6 |
| | PEG | % by mol | — | — | — | — | — | — |
| | SPG | % by mol | — | — | — | — | — | — |
| | Content of structural unit derived from fluorene-based monomer | % by mass | 28.0 | 46.8 | 32.0 | 33.7 | 37.8 | 37.8 |
| | Reduced viscosity | dL/g | 0.368 | 0.396 | 0.422 | 0.424 | 0.428 | 0.355 |
| | Melt viscosity | Pa·s | 2800 | 2630 | 2750 | 1540 | 2900 | 2240 |
| | Glass transition temperature (Tg) | °C. | 132 | 142 | 129 | 99 | 130 | 125 |
| Unstretched film | Refractive index at 656 nm ($n_C$) | — | 1.5398 | 1.5667 | 1.5461 | 1.5514 | 1.5564 | 1.5561 |
| | Refractive index at 589 nm ($n_D$) | — | 1.5444 | 1.5754 | 1.5507 | 1.5558 | 1.5613 | 1.5605 |
| | Refractive index at 486 nm ($n_F$) | — | 1.5550 | 1.5889 | 1.5618 | 1.5668 | 1.5738 | 1.5728 |
| | Abbe number ($\nu_D$) | — | 36 | 26 | 35 | 36 | 32 | 34 |
| | Photoelastic coefficient | $\times 10^{-12}$ $Pa^{-1}$ | 30 | 30 | 24 | 39 | 28 | 28 |
| | Water absorption percentage | % | 1.7 | 1.1 | 1.7 | 0.5 | 1.3 | 1.6 |
| | Bending test | — | A | A | A | A | A | A |
| Retardation film | Refractive index anisotropy | — | positive | positive | positive | positive | positive | positive |
| | Wavelength dispersion (R450/R550) | — | 1.04 | 1.04 | 1.02 | 1.06 | 1.04 | 1.01 |

| | | | Comp. Ex. 7 | Comp. Ex. 8 | Comp. Ex. 9 | Comp. Ex. 10 | Comp. Ex. 11 |
|---|---|---|---|---|---|---|---|
| Resin | Fluorene-based monomer | — | Comp. 16 | Comp. 3 | Comp. 2 | BHEPF | BCF |
| | | % by mol | 12.8 | 17.8 | 23.7 | 24.8 | 19.5 |
| | DPC | % by mol | 50.0 | 32.2 | — | 50.0 | 50.0 |
| | CHDA | % by mol | — | — | 26.4 | — | — |
| | ISB | % by mol | 37.2 | 38.6 | — | 25.0 | — |
| | CHDM | % by mol | — | 11.4 | 50.0 | — | — |
| | PEG | % by mol | — | — | — | 0.2 | — |
| | SPG | % by mol | — | — | — | — | 30.5 |
| | Content of structural unit derived from fluorene-based monomer | % by mass | 37.3 | 50.0 | 50.0 | 67.8 | 41.0 |
| | Reduced viscosity | dL/g | 0.430 | 0.484 | 0.428 | 0.345 | 0.499 |
| | Melt viscosity | Pa·s | 2900 | 3020 | 1980 | 2850 | 3410 |
| | Glass transition temperature (Tg) | °C. | 132 | 136 | 100 | 145 | 149 |
| Unstretched film | Refractive index at 656 nm ($n_C$) | — | 1.5432 | 1.5719 | 1.5686 | 1.5980 | 1.5436 |
| | Refractive index at 589 nm ($n_D$) | — | 1.5478 | 1.5769 | 1.5738 | 1.6042 | 1.5492 |
| | Refractive index at 486 nm ($n_F$) | — | 1.5589 | 1.5916 | 1.5870 | 1.6200 | 1.5608 |
| | Abbe number ($\nu_D$) | — | 35 | 29 | 31 | 27 | 32 |
| | Photoelastic coefficient | $\times 10^{-12}$ $Pa^{-1}$ | 21 | 14 | 26 | 30 | 18 |
| | Water absorption percentage | % | 2.8 | 1.0 | 0.4 | 1.1 | 0.5 |
| | Bending test | — | A | A | A | A | C |

TABLE 2-continued

| | | | | | | | |
|---|---|---|---|---|---|---|---|
| Retardation film | Refractive index anisotropy | — | positive 0.88 | negative 1.03 | negative 1.22 | positive 0.82 | positive 0.80 |
| | Wavelength dispersion (R450/R550) | — | | | | | |

In the following Examples 7 to 10 and Comparative Examples 12 to 15, the resin was synthesized by using larger-scale polymerization equipment, and a long film was manufactured by a melt extrusion method and evaluated for various properties.

Example 7

Polymerization was performed by using a batch polymerization apparatus composed of two vertical reactors and equipped with a stirring blade and a reflux condenser controlled to 100° C. Thereinto were charged 36.94 parts by mass (0.058 mol) of bis[9-(2-phenoxycarbonylethyl)fluoren-9-yl]methane (Compound 3), 64.02 parts by mass (0.438 mol) of ISB, 82.43 parts by mass (0.385 mol) of DPC, and as a catalyst, 3.86×10$^{-4}$ parts by mass (2.19×10$^{-6}$ mol) of calcium acetate monohydrate, and the inside of the reactor was purged with nitrogen under reduced pressure. Heating was performed with a heating medium, and at the point when the inner temperature reached 100° C., stirring was started. The inner temperature was allowed to reach 220° C. after 40 minutes from the start of temperature rise and while controlling the system to keep this temperature, pressure reduction was started to reach 13.3 kPa in 90 minutes after reaching 220° C. A phenol vapor by-produced along with the polymerization reaction was introduced into the reflux condenser at 100° C., and a slight amount of monomer component contained in the phenol vapor was returned to the reactor. The uncondensed phenol vapor was introduced into a condenser at 45° C. and recovered. After introducing nitrogen into the first reactor to once return the pressure to atmospheric pressure, the oligomerized reaction solution in the first reactor was transferred to the second reactor. Subsequently, temperature rise and pressure reduction in the second reactor were started, as a result, the inner temperature and the pressure respectively reached 240° C. and 0.2 kPa in 50 minutes, respectively. Thereafter, polymerization was allowed to proceed until a predetermined stirring power occurred. At the point when a predetermined power was achieved, the pressure was recovered by introducing nitrogen into the reactor, and the produced polyester carbonate was extruded into water to form a strand and cut to obtain a pellet.

From the obtained polyester carbonate, a long unstretched film having a length of 3 m, a width of 200 mm and a thickness of 77 μm was manufactured by using the above-described melt extrusion method. Subsequently, the long unstretched film was subjected to longitudinal uniaxial stretching at a stretching temperature of 161° C. and a stretch ratio of 2.52 times to manufacture a retardation film, and by using the obtained retardation film, a circularly polarizing plate was manufactured and mounted on an organic EL panel. The results of various evaluations are shown in Table 3. In addition, FIG. 1 shows a u'-v' chromaticity diagram in which reflected hues of the organic EL panels obtained are plotted. In FIG. 1, the ordinate is the v' value in the u'-v' chromaticity diagram, and the abscissa is the u' value. The reflected hues of Examples 7 to 10 are indicated by symbols E7 to E10, respectively, and the reflected hues of Comparative Examples 12 to 15 are indicated by the symbols C12 to C15, respectively.

The retardation film of this Example exhibits reverse wavelength dispersion property and is excellent in all properties such as orientation degree, photoelastic coefficient, reliability, heat resistance, and toughness. In the evaluation of mounting on an organic EL panel, the external light reflectance was kept low, and the hue presented clear black color.

Example 8

A retardation film was manufactured in the same manner as in Example 7 except that 38.06 parts by mass (0.059 mol) of bis[9-(2-phenoxycarbonylethyl)fluoren-9-yl]methane (Compound 3), 43.06 parts by mass (0.295 mol) of ISB, 20.28 parts by mass (0.141 mol) of CHDM, 81.46 parts by mass (0.380 mol) of DPC, and 3.83×10$^{-4}$ parts by mass (2.18×10$^{-6}$ mol) of calcium acetate monohydrate were used, the thickness of the unstretched film was changed to 68 μm, and the stretching temperature and the stretch ratio were changed to 129° C. and 2.4 times, respectively. The results of various evaluations are shown in Table 3.

It can be understood that in the retardation film of this Example, the value of birefringence is larger than in Example 7 and therefore, the orientation degree of the polymer is high. It also exhibited excellent properties in the evaluation of mounting on an organic EL panel.

Example 9

A retardation film was manufactured in the same manner as in Example 7 except that 31.02 parts by mass (0.048 mol) of bis[9-(2-phenoxycarbonylethyl)fluoren-9-yl]methane (Compound 3), 43.08 parts by mass (0.295 mol) of ISB, 25.26 parts by mass (0.129 mol) of TCDDM, 81.26 parts by mass (0.379 mol) of DPC, and 3.73×10$^{-4}$ parts by mass (2.12×10$^{-6}$ mol) of calcium acetate monohydrate were used, the thickness of the unstretched film was changed to 92 m, and the stretching temperature and the stretch ratio were changed to 137° C. and 2.8 times, respectively. The results of various evaluations are shown in Table 3.

The retardation film of this Example exhibited excellent properties in the evaluation of mounting on an organic EL panel.

Example 10

A retardation film was manufactured in the same manner as in Example 7 except that 29.60 parts by mass (0.046 mol) of bis[9-(2-phenoxycarbonylethyl)fluoren-9-yl]methane (Compound 3), 29.21 parts by mass (0.200 mol) of ISB, 42.28 parts by mass (0.139 mol) of SPG, 63.77 parts by mass (0.298 mol) of DPC, and 1.19×10$^{-2}$ parts by mass (6.78×10$^{-5}$ mol) of calcium acetate monohydrate were used, the thickness of the unstretched film was changed to 61 m, and the stretching temperature and the stretch ratio were changed to 134° C. and 3.15 times, respectively. The results of various evaluations are shown in Table 3.

In the retardation film of this Example, the value of birefringence is larger than in Example 7, and the orientation degree of the polymer is high. It also exhibited excellent properties in the evaluation of mounting on an organic EL panel.

Comparative Example 12

A retardation film was manufactured in the same manner as in Example 7 except that 63.72 parts by mass (0.145 mol) of BHEPF, 26.74 parts by mass (0.183 mol) of ISB, 0.97 parts by mass ($9.75 \times 10^{-4}$ mol) of PEG, 71.24 parts by mass (0.333 mol) of DPC, and $7.06 \times 10^{-4}$ parts by mass ($3.29 \times 10^{-6}$ mol) of magnesium acetate tetrahydrate were used, the thickness of the unstretched film was changed to 80 μm, and the stretching temperature and the stretch ratio were changed to 149° C. and 2.2 times, respectively. The results of various evaluations are shown in Table 3.

The retardation film of this Example was poor in the color difference from the neutral point at the time of mounting on a panel, as compared with Examples. In addition, it can be understood that the change rate of retardation was large and the reliability is low.

Comparative Example 13

A retardation film was manufactured in the same manner as in Example 7 except that 68.07 parts by mass (0.155 mol) of BHEPF, 22.84 parts by mass (0.156 mol) of ISB, 0.97 parts by mass ($9.75 \times 10^{-4}$ mol) of PEG, 67.60 parts by mass (0.316 mol) of DPC, and $5.36 \times 10^{-4}$ parts by mass ($2.50 \times 10^{-6}$ mol) of magnesium acetate tetrahydrate were used, the thickness of the unstretched film was changed to 101 μm, and the stretching temperature and the stretch ratio were changed to 149° C. and 2.4 times, respectively. The results of various evaluations are shown in Table 3.

The retardation film of this Example was poor in the reliability or the color difference from the neutral point at the time of mounting on a panel, as compared with Examples.

Comparative Example 14

A retardation film was manufactured in the same manner as in Example 7 except that 32.20 parts by mass (0.085 mol) of BCF, 60.43 parts by mass (0.199 mol) of SPG, 64.40 parts by mass (0.301 mol) of DPC, and $5.00 \times 10^{-3}$ parts by mass ($2.84 \times 10^{-5}$ mol) of calcium acetate monohydrate were used, the final polymerization temperature was changed to 260° C., the thickness of the unstretched film was changed to 100 μm, and the stretching temperature and the stretch ratio were changed to 145° C. and 2 times, respectively. The results of various evaluations are shown in Table 3.

The retardation film of this Example was poor in the color difference from the neutral point at the time of mounting on a panel.

Comparative Example 15

A retardation film was manufactured in the same manner as in Example 7 except that 80.49 parts by mass (0.184 mol) of BHEPF, 13.23 parts by mass (0.058 mol) of BPA, 53.29 parts by mass (0.249 mol) of DPC, and $2.13 \times 10^{-3}$ parts by mass ($1.21 \times 10^5$ mol) of calcium acetate monohydrate were used, the final polymerization temperature was changed to 260° C., the thickness of the unstretched film was changed to 102 μm, and the stretching temperature and the stretch ratio were changed to 153° C. and 2 times, respectively. The results of various evaluations are shown in Table 3.

In the retardation film of this Example, the birefringence is small as compared with Examples, and the orientation degree of the polymer is low. In addition, it can be understood that the toughness is poor as compared with Examples.

TABLE 3

| | | | Ex. 7 | Ex. 8 | Ex. 9 | Ex. 10 | Comp. Ex. 12 |
|---|---|---|---|---|---|---|---|
| Resin | Olefin-based monomer | — | — | Com. 3 | Comp. 3 | Comp. 3 | Comp. 3 | BHEPF |
| | | % by mol | 6.6 | 6.8 | 5.7 | 6.8 | 22.1 |
| | DPC | % by mol | 43.4 | 43.2 | 44.3 | 43.2 | 50.0 |
| | ISB | % by mol | 50.0 | 33.8 | 34.8 | 29.5 | 27.8 |
| | CHDM | % by mol | — | 16.2 | — | — | — |
| | TCDDM | % by mol | — | — | 15.2 | — | — |
| | SPG | % by mol | — | — | — | 20.5 | — |
| | PEG | % by mol | — | — | — | — | 0.15 |
| | BPA | % by mol | — | — | — | — | — |
| | Content of structural unit derived from fluorene-based monomer | % by mass | 26.2 | 27.0 | 22.0 | 21.0 | 63.4 |
| | Reduced viscosity | dL/g | 0.410 | 0.478 | 0.416 | 0.536 | 0.342 |
| | Melt viscosity | Pa · s | 3400 | 1160 | 1170 | 1870 | 2810 |
| | Glass transition temperature (Tg) | ° C. | 157 | 125 | 133 | 130 | 145 |
| Unstretched film | Refractive index at 656 nm($n_C$) | — | 1.5387 | 1.5393 | 1.5383 | 1.5159 | 1.5919 |
| | Refractive index at 589 nm($n_D$) | — | 1.5452 | 1.5432 | 1.5403 | 1.5202 | 1.5986 |
| | Refractive index at 486 nm ($n_F$) | — | 1.5528 | 1.5534 | 1.5498 | 1.5270 | 1.6132 |
| | Abbe Number($v_D$) | — | 39 | 39 | 47 | 47 | 28 |
| | Total light transmittance | % | 91.6 | 91.6 | 91.7 | 92.2 | 90.4 |
| | Photoelastic coefficient | $\times 10^{-12}$ Pa$^{-1}$ | 15 | 17 | 11 | 9 | 30 |
| | Water absorption percentage | % | 2.7 | 1.9 | 1.2 | 1.1 | 1.2 |
| | Bending test | — | A | A | A | A | A |
| Retardation film | Thickness of raw film | μm | 0 | 0 | 0 | 0 | 80 |
| | Film thickness after stretching | μm | 49 | 44 | 55 | 35 | 50 |
| | Refractive index anisotropy | — | positive | positive | positive | positive | positive |
| | Retardation (R450) | nm | 107 | 109 | 113 | 115 | 129 |
| | Retardation (R550) | nm | 137 | 136 | 139 | 140 | 147 |
| | Wavelength dispersion (R450/R550) | — | 0.79 | 0.80 | 0.81 | 0.82 | 0.88 |
| | Birefringence (Δn) | — | 0.0028 | 0.0031 | 0.0025 | 0.0040 | 0.0029 |
| | Change rate of retardation | % | 1.7 | 3.6 | 2.4 | 1.4 | 5.0 |
| Organic EL panel | Reflectance | % | 2.32 | 2.32 | 2.25 | 2.31 | 2.39 |
| | Hue u' | — | 0.207 | 0.208 | 0.205 | 0.204 | 0.185 |
| | Hue v' | — | 0.477 | 0.474 | 0.471 | 0.467 | 0.440 |

TABLE 3-continued

| | | | Comp. Ex. 13 | Comp. Ex. 14 | Comp. Ex. 15 |
|---|---|---|---|---|---|
| | Color difference from neutral point (Δu'v') | — | 0.006 | 0.003 | 0.005 |

| | | | Comp. Ex. 13 | Comp. Ex. 14 | Comp. Ex. 15 |
|---|---|---|---|---|---|
| Resin | Olefin-based monomer | — | BHEPF | BCF | BHEPF |
| | | % by mol | 24.8 | 15.0 | 38.0 |
| | DPC | % by mol | 50.0 | 50.0 | 50.0 |
| | ISB | % by mol | 25.0 | — | — |
| | CHDM | % by mol | — | — | — |
| | TCDDM | % by mol | — | — | — |
| | SPG | % by mol | — | 35.0 | — |
| | PEG | % by mol | 0.16 | — | — |
| | BPA | % by mol | — | — | 12.0 |
| | Content of structural unit derived from fluorene-based monomer | % by mass | 67.8 | 32.0 | 80.1 |
| | Reduced viscosity | dL/g | 0.345 | 0.499 | 0.344 |
| | Melt viscosity | Pa·s | 2850 | 2940 | 2920 |
| | Glass transition temperature (Tg) | °C. | 145 | 135 | 149 |
| Unstretched film | Refractive index at 656 nm ($n_C$) | — | 1.5980 | 1.5291 | 1.6245 |
| | Refractive index at 589 nm ($n_D$) | — | 1.6042 | 1.5334 | 1.6317 |
| | Refractive index at 486 nm ($n_F$) | — | 1.6200 | 1.5442 | 1.6506 |
| | Abbe Number ($v_D$) | — | 27 | 35 | 24 |
| | Total light transmittance | % | 90.3 | 91.7 | 89.9 |
| | Photoelastic coefficient | ×10$^{-12}$ Pa$^{-1}$ | 30 | 13 | 52 |
| | Water absorption percentage | % | 1.1 | 0.6 | 0.5 |
| | Bending test | — | A | C | A |
| Retardation film | Thickness of raw film | μm | 0 | 0 | 0 |
| | Film thickness after stretching | μm | 65 | 71 | 72 |
| | Refractive index anisotropy | — | positive | positive | positive |
| | Retardation (R450) | nm | 120 | 129 | 120 |
| | Retardation (R550) | nm | 147 | 140 | 137 |
| | Wavelength dispersion (R450/R550) | — | 0.81 | 0.92 | 0.87 |
| | Birefringence (Δn) | — | 0.0023 | 0.0020 | 0.0019 |
| | Change rate of retardation | % | 6.2 | 1.4 | 8.1 |
| Organic EL panel | Reflectance | % | 2.34 | 2.34 | 2.30 |
| | Hue u' | — | 0.189 | 0.204 | 0.211 |
| | Hue v' | — | 0.454 | 0.447 | 0.467 |
| | Color difference from neutral point (Δu'v') | — | 0.027 | 0.025 | 0.005 |

While the present invention has been described in detail and with reference to specific embodiments thereof, it will be apparent to one skilled in the art that various changes and modifications can be made therein without departing from the spirit and scope of the present invention. This application is based on Japanese Patent Application (Patent Application No. 2014-084695) filed on Apr. 16, 2014, the contents of which are incorporated herein by way of reference.

The invention claimed is:

1. A retardation film comprising a resin having positive refractive index anisotropy and comprising at least one bonding group of a carbonate bond and an ester bond and one or more structural units selected from the group consisting of a structural unit represented by the following general formula (1) and a structural unit represented by the following general formula (2), wherein:

the value of wavelength dispersion (R450/R550) as a ratio of an in-plane retardation R450 at a wavelength of 450 nm to an in-plane retardation R550 at a wavelength of 550 nm is more than 0.5 and less than 1.0:

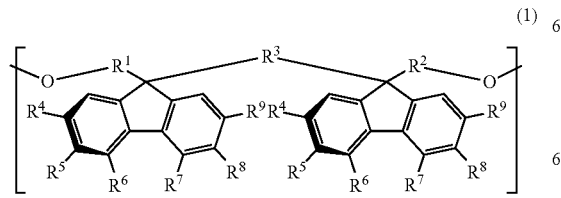

wherein in the general formula (1) and the general formula (2), each of $R^1$ to $R^3$ is independently a direct bond or an alkylene group having a carbon number of from 1 to 4, which may have a substituent, and each of $R^4$ to $R^9$ is independently hydrogen atom, an alkyl group having a carbon number of from 1 to 10, which may have a substituent, an aryl group having a carbon number of from 4 to 10, which may have a substituent, an acyl group having a carbon number of from 1 to 10, which may have a substituent, an alkoxy group having a carbon number of from 1 to 10, which may have a substituent, an aryloxy group having a carbon number of from 1 to 10, which may have a substituent, an acyloxy group having a carbon number of from 1 to 10, which may have a substituent, an amino group which may have a substituent, a vinyl group having a carbon number of from 1 to 10, which may have a substituent, an ethynyl group having a carbon number of from 1 to 10, which may have a substituent, a sulfur atom having a substituent, a silicon atom having a substituent, a halogen atom, a nitro group, or a cyano group, provided that at least two adjacent groups out of $R^4$ to $R^9$ may be linked to each other to form a ring and two substituents $R^{4}$'s, $R^{5}$'s, $R^{6}$'s, $R^{7}$'s, $R^{8}$'s, and $R^{9}$'s may be the same with or different from each other, wherein in the resin, a content of an aromatic group-containing structural unit other than the structural unit represented by the general formula (1) and the structural unit represented by the general formula (2) is 5% by mass or less.

2. The retardation film according to claim 1, which has a film thickness of 10 μm to 60 μm and a thickness accuracy of within ±5% and is composed of a single layer.

3. The retardation film according to claim 1, wherein the resin has a refractive index at a sodium d line (wavelength: 589 nm) of from 1.49 to 1.56.

4. The retardation film according to claim 1, wherein the resin contains 1% by mass or more and 40% by mass or less of one or more structural units selected from the group consisting of the structural unit represented by the general formula (1) and the structural unit represented by the general formula (2).

5. The retardation film according to claim 1, wherein the resin has a glass transition temperature of 110° C. to 160° C.

6. The retardation film according to claim 1, wherein the resin further comprises a structural unit represented by the following general formula (3):

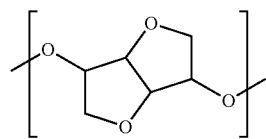
(3)

7. The retardation film according to claim 1, wherein the resin further comprises one or more structural units selected from the group consisting of structural units represented by the following general formulae (4) to (8):

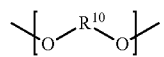
(4)

wherein in the general formula (4), $R^{10}$ represents an alkylene group having a carbon number of from 2 to 20, which may be substituted;

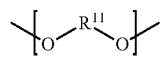
(5)

wherein in the general formula (5), $R^{11}$ represents a cycloalkylene group having a carbon number of from 4 to 20, which may be substituted;

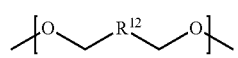
(6)

wherein in the general formula (6), $R^{12}$ represents a cycloalkylene group having a carbon number of from 4 to 20, which may be substituted;

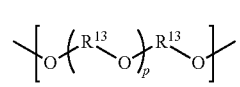
(7)

wherein in the general formula (7), $R^{13}$ represents an alkylene group having a carbon number of from 2 to 10, which may be substituted, p is an integer of from 1 to 40, and two or more substituents $R^{13}$'s may be the same with or different from each other; and

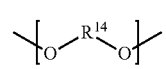
(8)

wherein in the general formula (8), $R^{14}$ represents an acetal ring-containing group having a carbon number of from 2 to 20, which may be substituted.

8. An unstretched film, which is a long film and becomes the retardation film according to claim 1 by a stretching treatment.

9. A long retardation film obtained by stretching the unstretched film according to claim 8 at least in one direction.

10. A circularly polarizing plate comprising the retardation film according to claim 1 and a polarizer stacked on the retardation film.

11. An image display device comprising the circularly polarizing plate according to claim 10.

12. An organic EL panel comprising the circularly polarizing plate according to claim 10.

13. A retardation film comprising a resin having positive refractive index anisotropy and comprising at least one bonding group of a carbonate bond and an ester bond and one or more structural units selected from the group consisting of a structural unit represented by the following general formula (1) and a structural unit represented by the following general formula (2), wherein:

the value of wavelength dispersion (R450/R550) as a ratio of an in-plane retardation R450 at a wavelength of 450 nm to an in-plane retardation R550 at a wavelength of 550 nm is more than 0.5 and less than 1.0:

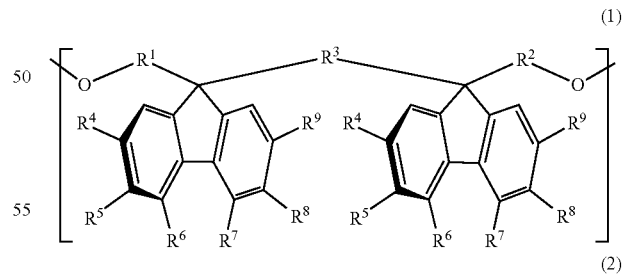
(1)

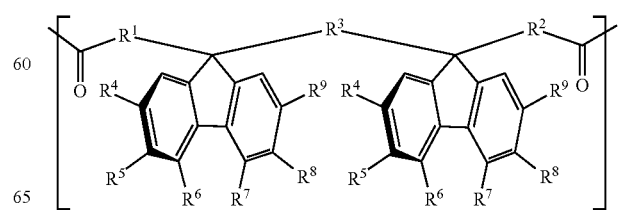
(2)

wherein in the general formula (1) and the general formula (2), each of $R^1$ to $R^3$ is independently a direct bond or an alkylene group having a carbon number of from 1 to 4, which may have a substituent, and each of $R^4$ to $R^9$ is independently hydrogen atom, an alkyl group having a carbon number of from 1 to 10, which may have a substituent, an aryl group having a carbon number of from 4 to 10, which may have a substituent, an acyl group having a carbon number of from 1 to 10, which may have a substituent, an alkoxy group having a carbon number of from 1 to 10, which may have a substituent, an aryloxy group having a carbon number of from 1 to 10, which may have a substituent, an acyloxy group having a carbon number of from 1 to 10, which may have a substituent, an amino group which may have a substituent, a vinyl group having a carbon number of from 1 to 10, which may have a substituent, an ethynyl group having a carbon number of from 1 to 10, which may have a substituent, a sulfur atom having a substituent, a silicon atom having a substituent, a halogen atom, a nitro group, or a cyano group, provided that at least two adjacent groups out of $R^4$ to $R^9$ may be linked to each other to form a ring and two substituents $R^4$'s, $R^5$'s, $R^6$'s, $R^7$'s, $R_8$'s, and $R^9$'s may be the same with or different from each other; and the retardation film has a film thickness of 10 μm to 60 μm and a thickness accuracy of within ±5% and is composed of a single layer.

* * * * *